(12) United States Patent
Chae et al.

(10) Patent No.: US 11,621,253 B2
(45) Date of Patent: Apr. 4, 2023

(54) LIGHT EMITTING DEVICE

(71) Applicant: SEOUL VIOSYS CO., LTD., Ansan-si (KR)

(72) Inventors: Jong Hyeon Chae, Ansan-si (KR); Chan Seob Shin, Ansan-si (KR); Seom Geun Lee, Ansan-si (KR); Ho Joon Lee, Ansan-si (KR); Seong Kyu Jang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/666,626

(22) Filed: Oct. 29, 2019

(65) Prior Publication Data

US 2020/0144232 A1 May 7, 2020

Related U.S. Application Data

(60) Provisional application No. 62/754,721, filed on Nov. 2, 2018.

(51) Int. Cl.
| | | |
|---|---|---|
| *H01L 25/075* | (2006.01) | |
| *H01L 33/08* | (2010.01) | |
| *H01L 33/62* | (2010.01) | |
| *H01L 33/00* | (2010.01) | |

(52) U.S. Cl.
CPC ...... *H01L 25/0756* (2013.01); *H01L 33/0093* (2020.05); *H01L 33/08* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| 9,985,172 B2 | 5/2018 | Lee | |
|---|---|---|---|
| 10,686,099 B2 | 6/2020 | Huppmann et al. | |
| 2001/0000005 A1* | 3/2001 | Forrest | H01L 51/5234 |
| | | | 204/192.12 |
| 2003/0047742 A1* | 3/2003 | Hen | H01L 25/0756 |
| | | | 257/89 |

(Continued)

FOREIGN PATENT DOCUMENTS

| EP | 3 163 615 | 5/2017 |
|---|---|---|
| JP | H07183576 | 7/1995 |

(Continued)

OTHER PUBLICATIONS

International Search Report dated Feb. 14, 2020, in International Application No. PCT/KR2019/014688 with English Translation.

(Continued)

*Primary Examiner* — Khaja Ahmad
(74) *Attorney, Agent, or Firm* — H.C. Park & Associates, PLC

(57) ABSTRACT

A light emitting device including a first light emitting part having a first area, a second light emitting part having a second area, and a third light emitting part having a third area, in which the first light emitting part is disposed on the same plane as the second light emitting part, the third light emitting part is disposed over the first and second light emitting parts, and the third area is larger than each of the first and second areas.

14 Claims, 56 Drawing Sheets

(56) References Cited

U.S. PATENT DOCUMENTS

| | | | |
|---|---|---|---|
| 2007/0018189 A1* | 1/2007 | Chin | H01L 25/0756 257/99 |
| 2007/0114922 A1 | 5/2007 | Sung et al. | |
| 2007/0120465 A1* | 5/2007 | Ito | H01L 51/5271 313/504 |
| 2009/0134409 A1* | 5/2009 | Wang | H01L 25/0756 257/E33.044 |
| 2010/0032691 A1* | 2/2010 | Kim | H01L 25/0756 257/E33.067 |
| 2012/0049236 A1* | 3/2012 | Kamiya | H01L 33/382 257/99 |
| 2015/0340348 A1* | 11/2015 | Katsuno | H01L 33/387 257/89 |
| 2016/0163940 A1* | 6/2016 | Huang | H01L 25/0756 257/89 |
| 2017/0104035 A1* | 4/2017 | Lee | H01L 51/0023 |
| 2017/0288093 A1 | 10/2017 | Cha et al. | |
| 2018/0012929 A1* | 1/2018 | Lu | H01L 27/153 |
| 2018/0240952 A1* | 8/2018 | Moon | H01L 33/62 |
| 2019/0097088 A1* | 3/2019 | Huppmann | H01L 33/62 |

FOREIGN PATENT DOCUMENTS

| | | |
|---|---|---|
| JP | 2016-018782 | 2/2016 |
| KR | 10-2007-0052914 | 5/2007 |
| KR | 10-0727472 | 6/2007 |
| KR | 10-2009-0010623 | 1/2009 |
| WO | 2017/153123 | 9/2017 |

OTHER PUBLICATIONS

Extended European Search Report dated Jun. 22, 2022, issued to European Patent Application No. 19878906.7.

\* cited by examiner

LIGHT EMITTING DEVICE

CROSS-REFERENCE TO RELATED APPLICATION

This application claims the benefit of U.S. Provisional Patent Application No. 62/754,721, filed on Nov. 2, 2018, which is hereby incorporated by reference for all purposes as if fully set forth herein.

BACKGROUND

Field

Exemplary embodiments of the invention relate generally to a light emitting device, and more specifically, to a light emitting device in which a plurality of light emitting parts are stacked.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and quicker response speed than the existing light sources.

In general, a display device displays various colors by utilizing mixed colors of blue, green, and red. Each pixel of a display device typically includes blue, green, and red sub-pixels, the color of a particular pixel is determined through the colors of these sub-pixels, and an image is displayed by a combination of pixels.

Light emitting diodes have been mainly used as backlight sources in display devices. However, recently, a micro LED display has been developed as a next generation display, which directly implements images by using light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention are capable of improving light efficiency and light extraction.

Additional features of the inventive concepts will be set forth in the description which follows, and in part will be apparent from the description, or may be learned by practice of the inventive concepts.

A light emitting device according to an exemplary embodiment includes a first light emitting part having a first area, a second light emitting part having a second area, and a third light emitting part having a third area, in which the first light emitting part is disposed on the same plane as the second light emitting part, the third light emitting part is disposed over the first and second light emitting parts, and the third area is larger than each of the first and second areas.

The first light emitting part may include a first-conductivity type semiconductor layer, and a first semiconductor structure including an active layer and a second-conductivity type semiconductor layer, the second light emitting part may include a first-conductivity type semiconductor layer, and a second semiconductor structure spaced apart from the first semiconductor structure and including an active layer and a second-conductivity type semiconductor layer, and the third light emitting part may be spaced apart from the first and second light emitting parts, and may include a first-conductivity type semiconductor layer, an active layer, and a second-conductivity type semiconductor layer.

The light emitting device may further include a first pad electrically coupled with the second-conductivity type semiconductor layer of the first light emitting part, a second pad electrically coupled with the second-conductivity type semiconductor layer of the second light emitting part, a third pad electrically coupled with the second-conductivity type semiconductor layer of the third light emitting part, and a common pad electrically coupled to the first-conductivity type semiconductor layers of the first and third light emitting parts.

The light emitting device may further include a first through-pattern electrically coupling the second-conductivity type semiconductor layer of the first light emitting part and the first pad, a second through-pattern electrically coupling the second-conductivity type semiconductor layer of the second light emitting part and the second pad, a third through-pattern electrically coupling the second-conductivity type semiconductor layer of the third light emitting part and the third pad, a fourth through-pattern electrically coupling a portion of the first-conductivity type semiconductor layer of the first light emitting part exposed between the first and second semiconductor structures and the common pad, and a fifth through-pattern electrically coupling the first-conductivity type semiconductor layer of the third light emitting part and the common pad.

The light emitting device may further include a first through-pattern electrically coupling the second-conductivity type semiconductor layer of the first light emitting part and the first pad, a second through-pattern electrically coupling the second-conductivity type semiconductor layer of the second light emitting part and the second pad, a third through-pattern electrically coupling the second-conductivity type semiconductor layer of the third light emitting part and the third pad, and a fourth through-pattern electrically coupling the first-conductivity type semiconductor layers of the first and third light emitting parts and the common pad, in which the fourth through-pattern may pass through the first-conductivity type semiconductor layer of the third light emitting part and be electrically connected to a portion of the first-conductivity type semiconductor layer of the first light emitting part exposed between the first and second semiconductor structures.

The light emitting device may further include an adhesion part disposed between the first and second light emitting parts and the third light emitting part, between the first and second semiconductor structures, and bonding the first and second light emitting parts and the third light emitting part.

The light emitting device may further include a dielectric layer surrounding outer sidewalls of the first, second, third, and fourth through-patterns, in which the fourth through-pattern may pass through the third light emitting part and the adhesion part, such that one surface of the fourth through-pattern contacts the portion the first-conductivity type semiconductor layer of the first light emitting part exposed between the first and second semiconductor structures, and the other surface of the fourth through-pattern contacts the common pad, and the common pad electrically may contact the first-conductivity type semiconductor layer of the third light emitting part.

The third light emitting part may include a hole exposing the first-conductivity type semiconductor layer of the third light emitting part, and the hole may have a width less than a width of the first-conductivity type semiconductor layer of the first light emitting part exposed between the first and second semiconductor structures.

The hole filled with the adhesion part may be disposed between the first-conductivity type semiconductor layers of the first and third light emitting parts, and the fourth through-pattern may pass through the first-conductivity type semiconductor layer of the third light emitting part and the adhesion part, such that one surface of the fourth through-pattern contacts the common pad, the other surface of the fourth through-pattern opposing the one surface contacts the first-conductivity type semiconductor layer of the first light emitting part, and a sidewall of the fourth through-pattern contacts the first-conductivity type semiconductor layer of the third light emitting part.

The light emitting device may further include a dielectric layer filling the hole, in which the hole may be disposed between the common pad and the first-conductivity type semiconductor layer of the third light emitting part, and the fourth through-pattern may pass through the dielectric layer and the first-conductivity type semiconductor layer of the third light emitting part, the fourth through-pattern including an upper sidewall contacting the dielectric layer, a middle sidewall contacting the first-conductivity type semiconductor layer of the third light emitting part, and a lower sidewall contacting the adhesion part, such that one surface of the fourth through-pattern contacts the common pad, and the other surface of the fourth through-pattern opposing the one surface contacts the portion of the first-conductivity type semiconductor layer of the first light emitting part exposed between the first and second semiconductor structures.

The third light emitting part may include a hole exposing the first-conductivity type semiconductor layer of the third light emitting part, and the hole may have width less than a width of the first-conductivity type semiconductor layer of the first light emitting part exposed between the first and second semiconductor structures.

The hole may face the first-conductivity type semiconductor layer of the first light emitting part exposed between the first and second semiconductor structures, and the adhesion part may extend into the hole and contact the first-conductivity type semiconductor layer of the third light emitting part, extend between the first and second semiconductor structures, and contact the first-conductivity type semiconductor layer of the first light emitting part.

The fourth through-pattern may contact at least portions of the first-conductivity type semiconductor layer of the third light emitting part and the adhesion part.

The fourth through-pattern may pass through the first-conductivity type semiconductor layer of the third light emitting part, and a sidewall of the fourth through pattern contacts the first-conductivity type semiconductor layer of the third light emitting part.

The light emitting device may further include a dielectric layer filling the hole, in which the hole may be disposed between the common pad and the first-conductivity type semiconductor layer of the third light emitting part, and the fourth through-pattern may pass through the dielectric layer and at least portions of the first-conductivity type semiconductor layer of the third light emitting part and the adhesion part, and a portion of the fourth through-pattern may contact the first-conductivity type semiconductor layer of the third light emitting part.

The light emitting device may further include a substrate, on which the first and second light emitting parts spaced apart from each other are disposed, and a bonding layer bonding the substrate and the first and second light emitting parts, and including a conductive material.

Each of the first, second, and third light emitting part may include a first-conductivity type semiconductor layer, an active layer, and a second-conductivity type semiconductor layer.

The bonding layer may electrically couple the first-conductivity type semiconductor layers of the first and second light emitting parts.

The light emitting device may further include a first pad electrically coupled with the second-conductivity type semiconductor layer of the first light emitting part, a second pad electrically coupled with the second-conductivity type semiconductor layer of the second light emitting part, a third pad electrically coupled with the second-conductivity type semiconductor layer of the third light emitting part, and a common pad electrically coupled with the bonding layer.

The bonding layer may include a first bonding layer disposed between the first-conductivity type semiconductor layer of the first light emitting part and the substrate, and a second bonding layer disposed between the first-conductivity type semiconductor layer of the second light emitting part and the substrate, in which each of the first and second bonding layers may be electrically coupled with the substrate.

The light emitting device may further include a first pad electrically coupled with the second-conductivity type semiconductor layer of the first light emitting part, a second pad electrically coupled with the second-conductivity type semiconductor layer of the second light emitting part, a third pad electrically coupled with the second-conductivity type semiconductor layer of the third light emitting part, and a common pad electrically coupled with the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
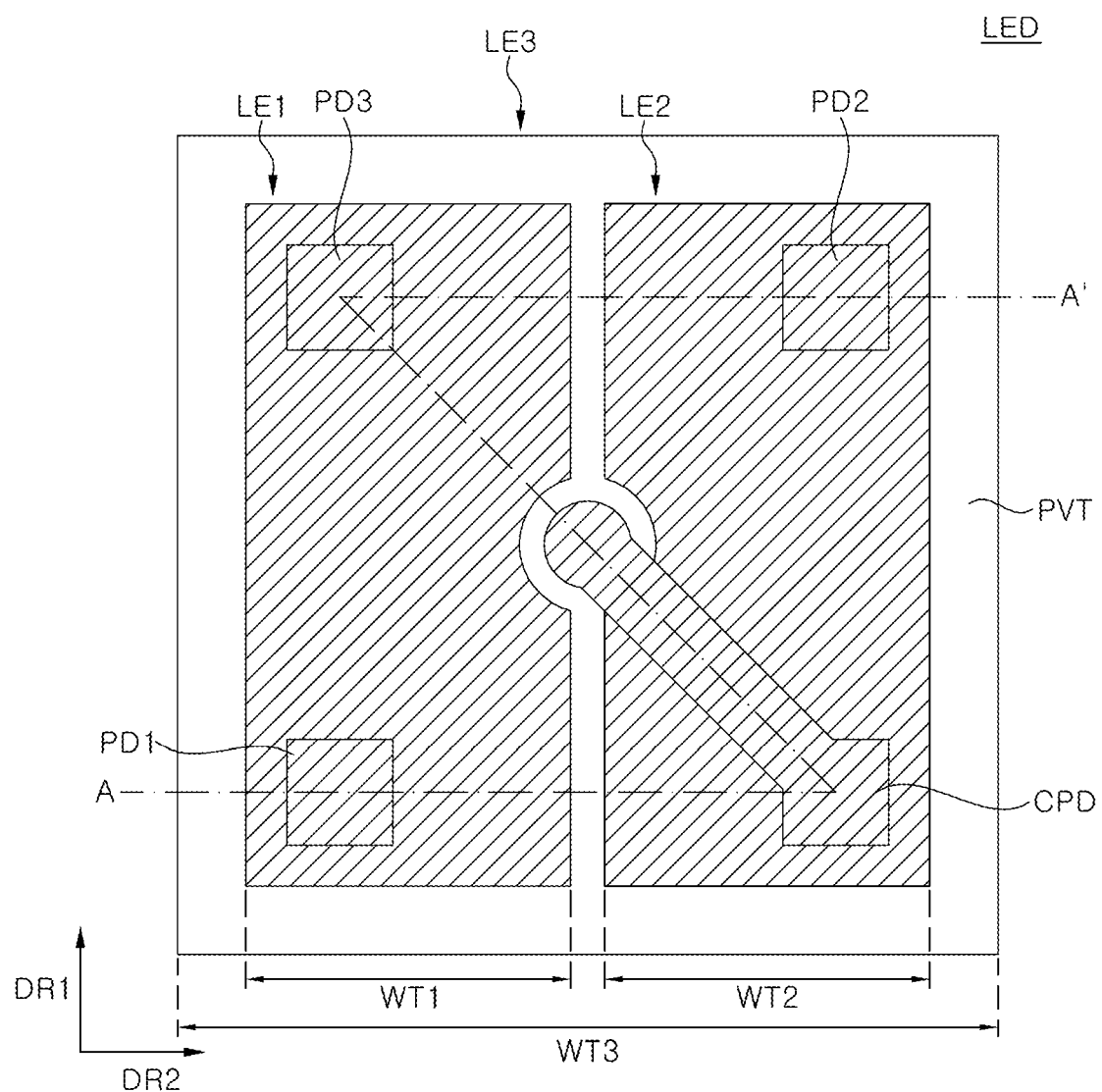
FIG. 1A is a schematic top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
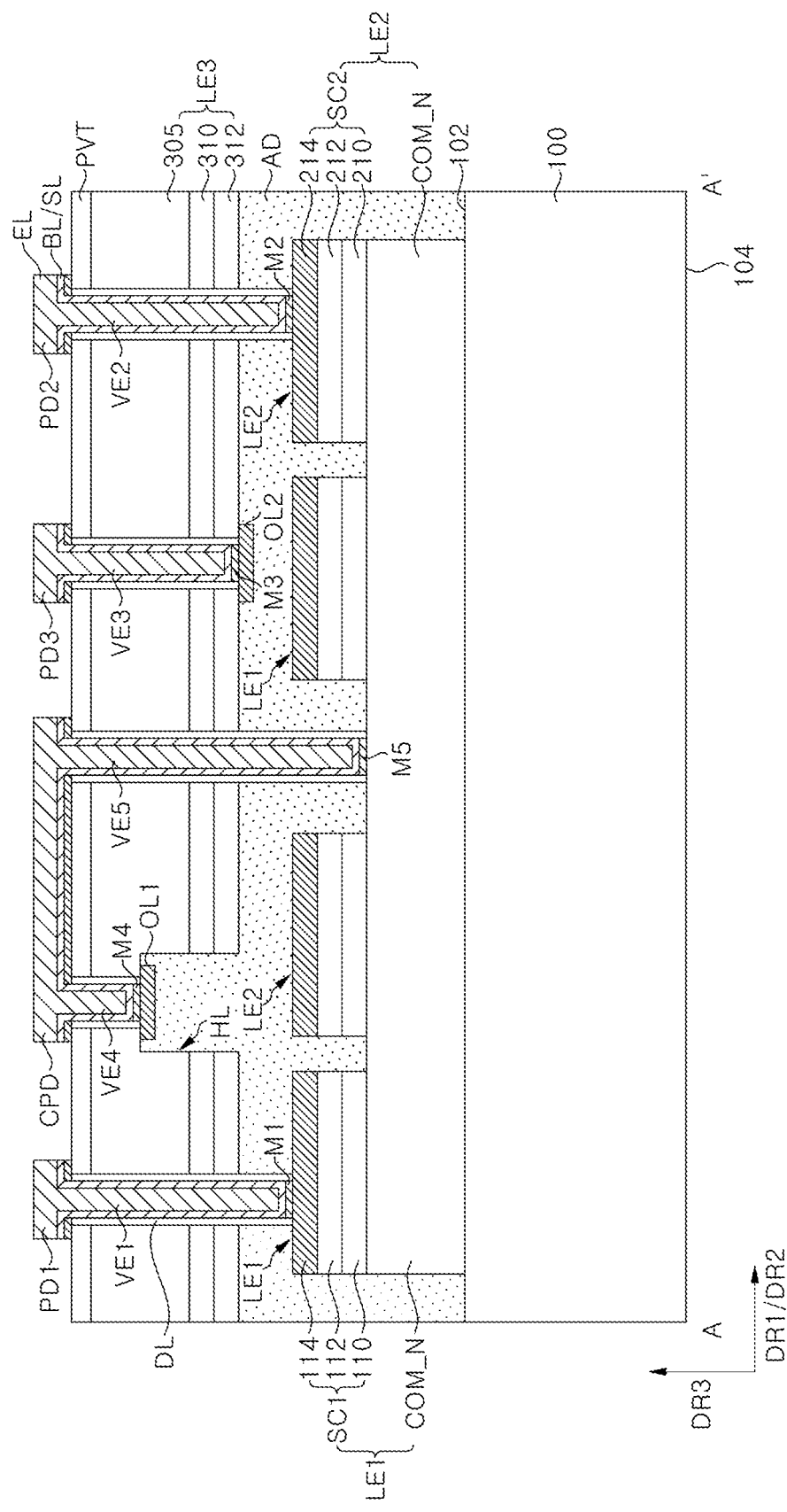
FIGS. 1B, 1C, and 1D are cross-sectional views taken along line A-A' of FIG. 1A according to exemplary embodiments.
Figure 1C:
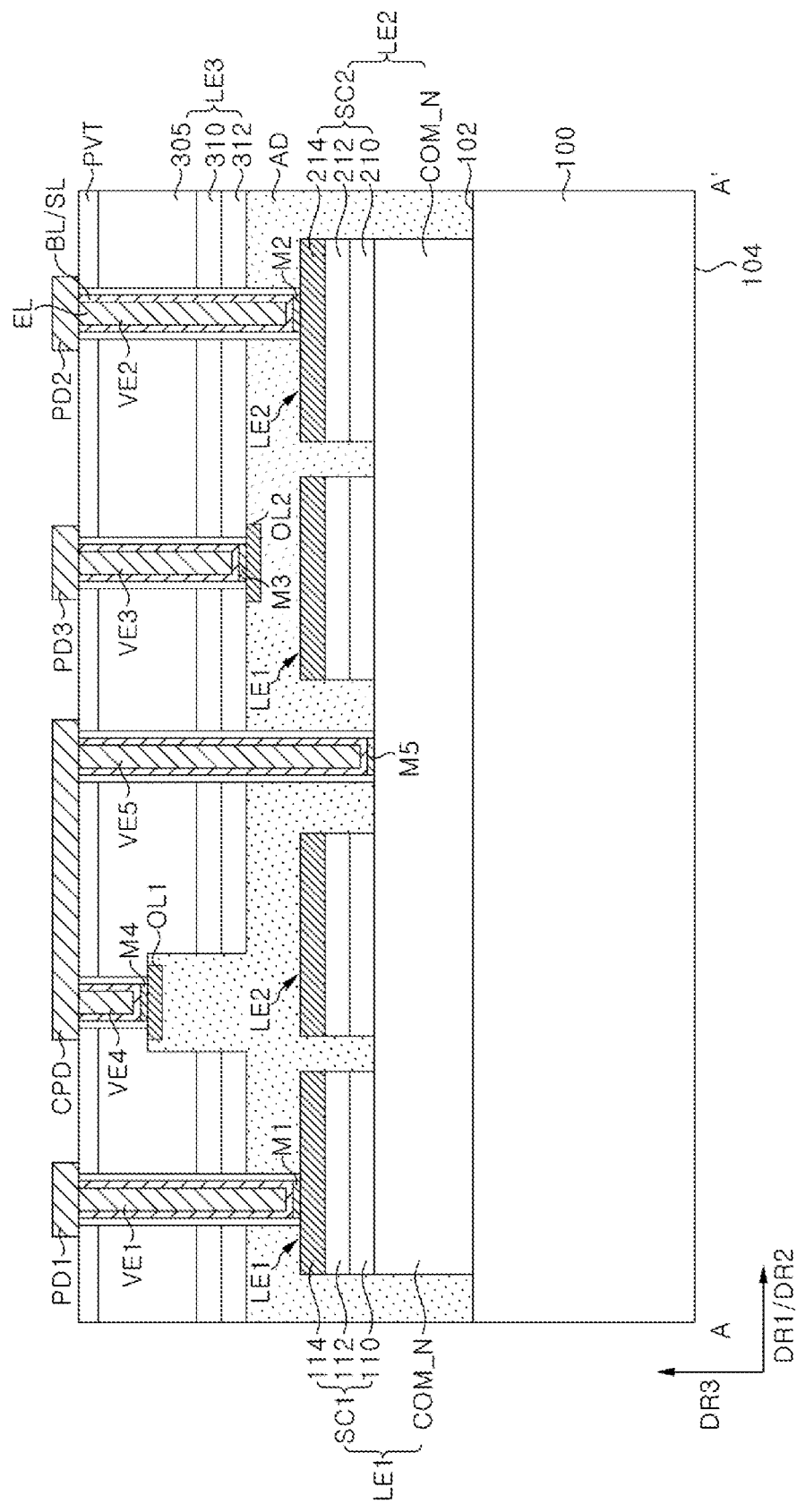
Figure 1D:
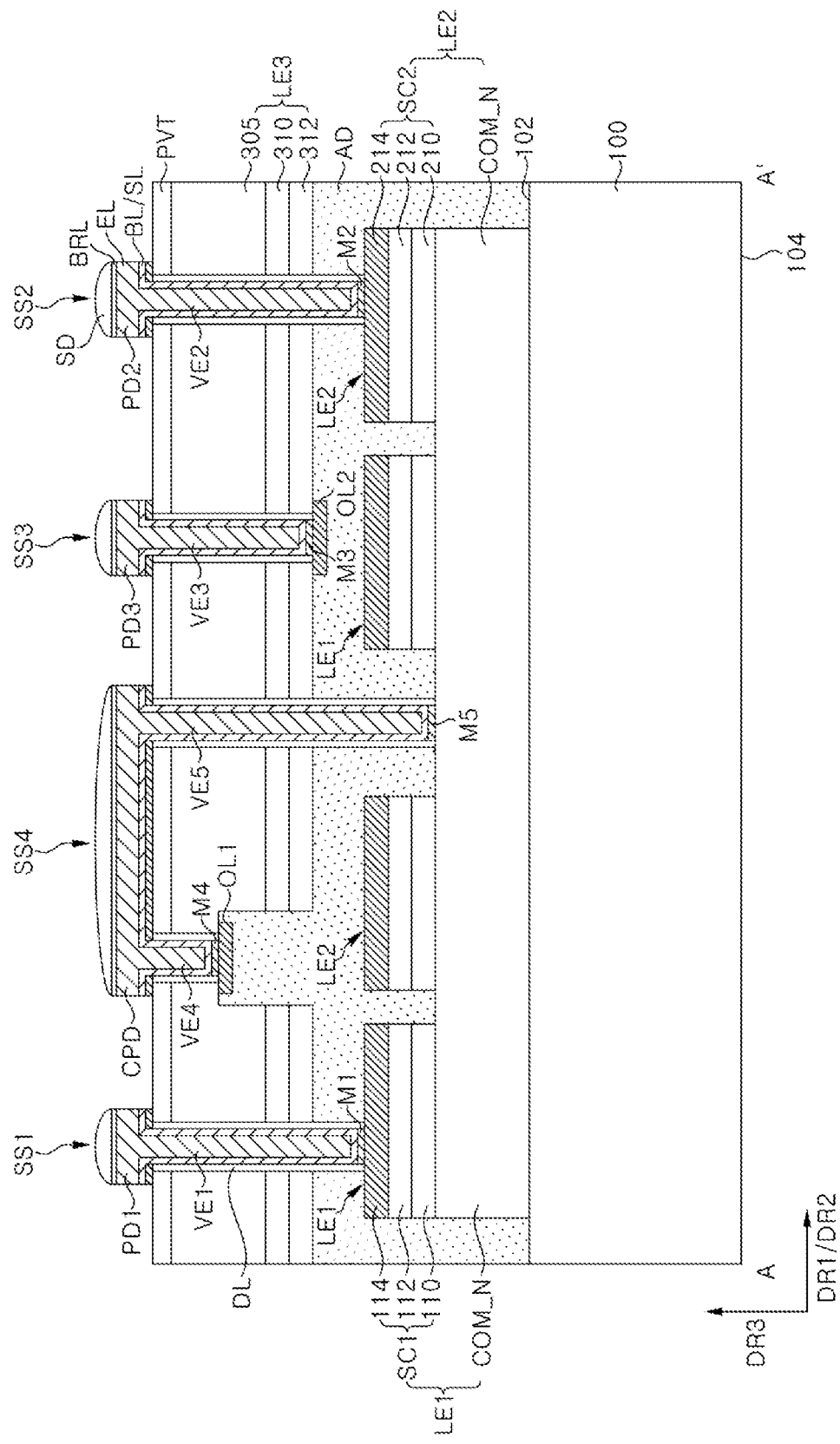

FIG. 1A is a schematic top view of a light emitting device according to an exemplary embodiment, and FIGS. 1B, 1C, and 1D are cross-sectional views taken along line A-A' of FIG. 1A according to exemplary embodiments.

Referring to FIGS. 1A to 1D, a light emitting device may include a substrate 100, and a first light emitting part LE1, a second light emitting part LE2, and a third light emitting part LE3, which are disposed on the substrate 100.

According to an exemplary embodiment, the first light emitting part LE1 and the second light emitting part LE2 may be disposed on a first surface 102 of the substrate 100 to be positioned on the same plane, and the third light emitting part LE3 may be disposed over the first light emitting part LE1 and the second light emitting part LE2. The size of the third light emitting part LE3 may be greater than the size of each of the first light emitting part LE1 and the second light emitting part LE2. The size of each of the light emitting parts LE1, LE2, and LE3 may refer to an area through which light is emitted. For example, the first light emitting part LE1 may have a first width WT1, the second light emitting part LE2 may have a second width WT2, and the third light emitting part LE3 may have a third width WT3. The third width WT3 may be greater than the first width WT1 and the second width WT2, and the first width WT1 and the second width WT2 may be the same with or different from each other.

When a second surface 104 of the substrate 100 opposing the first surface 102 is a light extraction surface, the wavelength of light emitted from the third light emitting part LE3 may be the longest. For example, the first light emitting part LE1 may emit blue light, the second light emitting part LE2 may emit green light, and the third light emitting part LE3 may emit red light. Alternatively, the first light emitting part LE1 may emit green light, the second light emitting part LE2 may emit blue light, and the third light emitting part LE3 may emit red light.

When the first light emitting part LE1 emits blue light, the second light emitting part LE2 emits green light, and the third light emitting part LE3 emits red light, for example, the third light emitting part LE3 emitting red light typically has a lower light emitting efficiency through the same area than the first light emitting part LE1 or the second light emitting part LE2. As such, a light emitting device according to an exemplary embodiment includes the third light emitting part LE3 having an area larger than each of the first light emitting part LE1 and the second light emitting part LE2, such that substantially the same light emitting amount (e.g., light emitting efficiency) may be obtained when the same current is applied. In this manner, the color balance of the light emitting device may be improved.

Figure 2A:
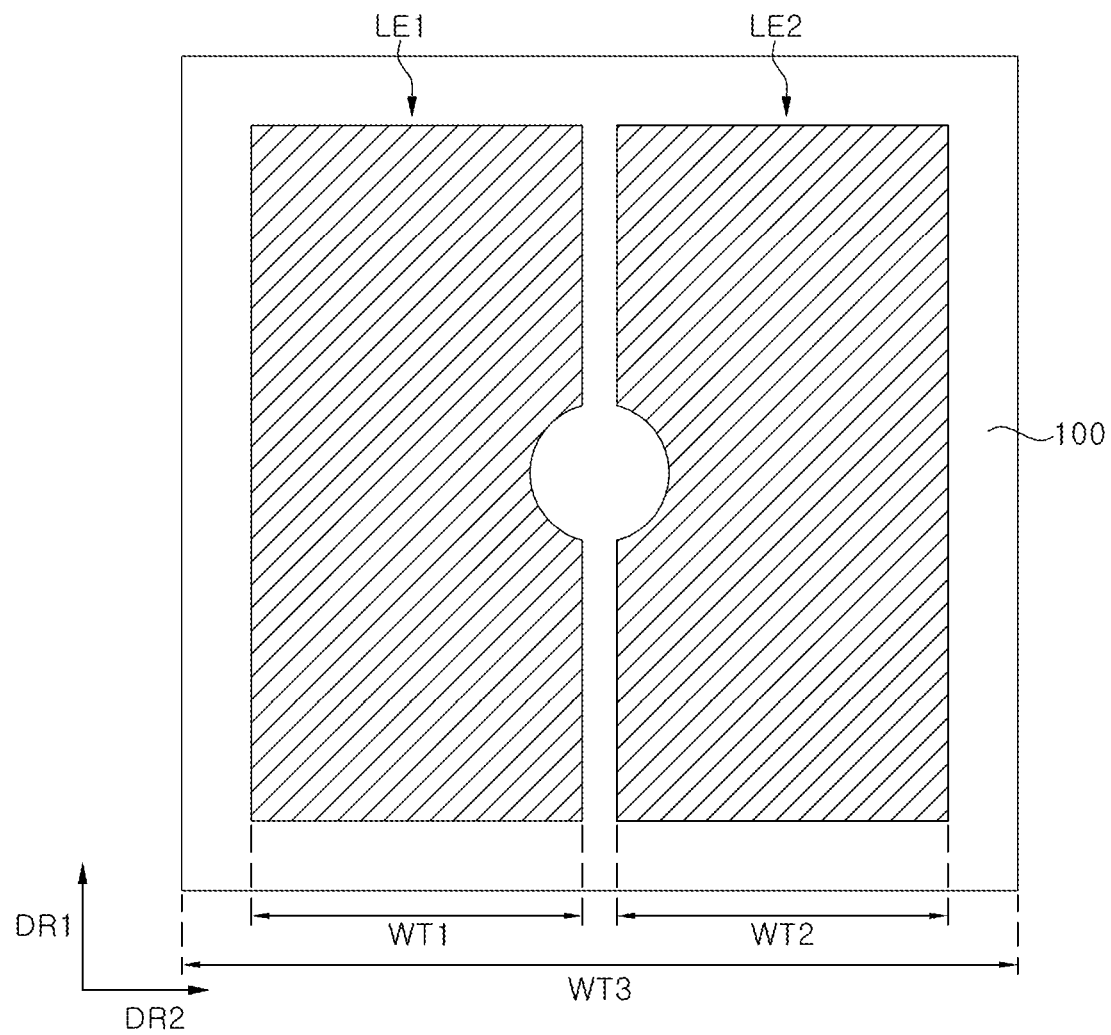
FIGS. 2A, 2B, and 2C are schematic top views of the first light emitting part and the second light emitting part of the light emitting device shown in FIG. 1A according to exemplary embodiments.
Figure 2B:
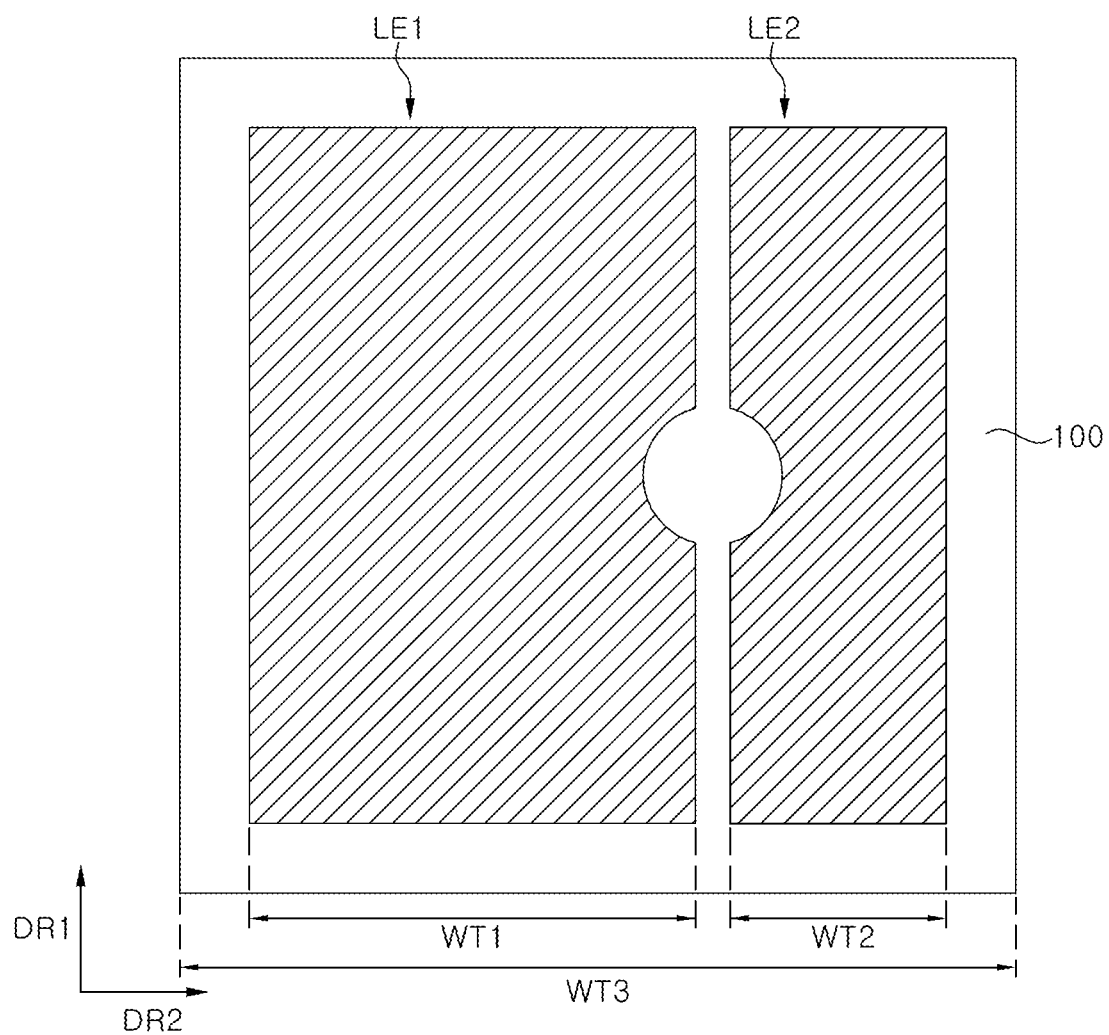
Figure 2C:
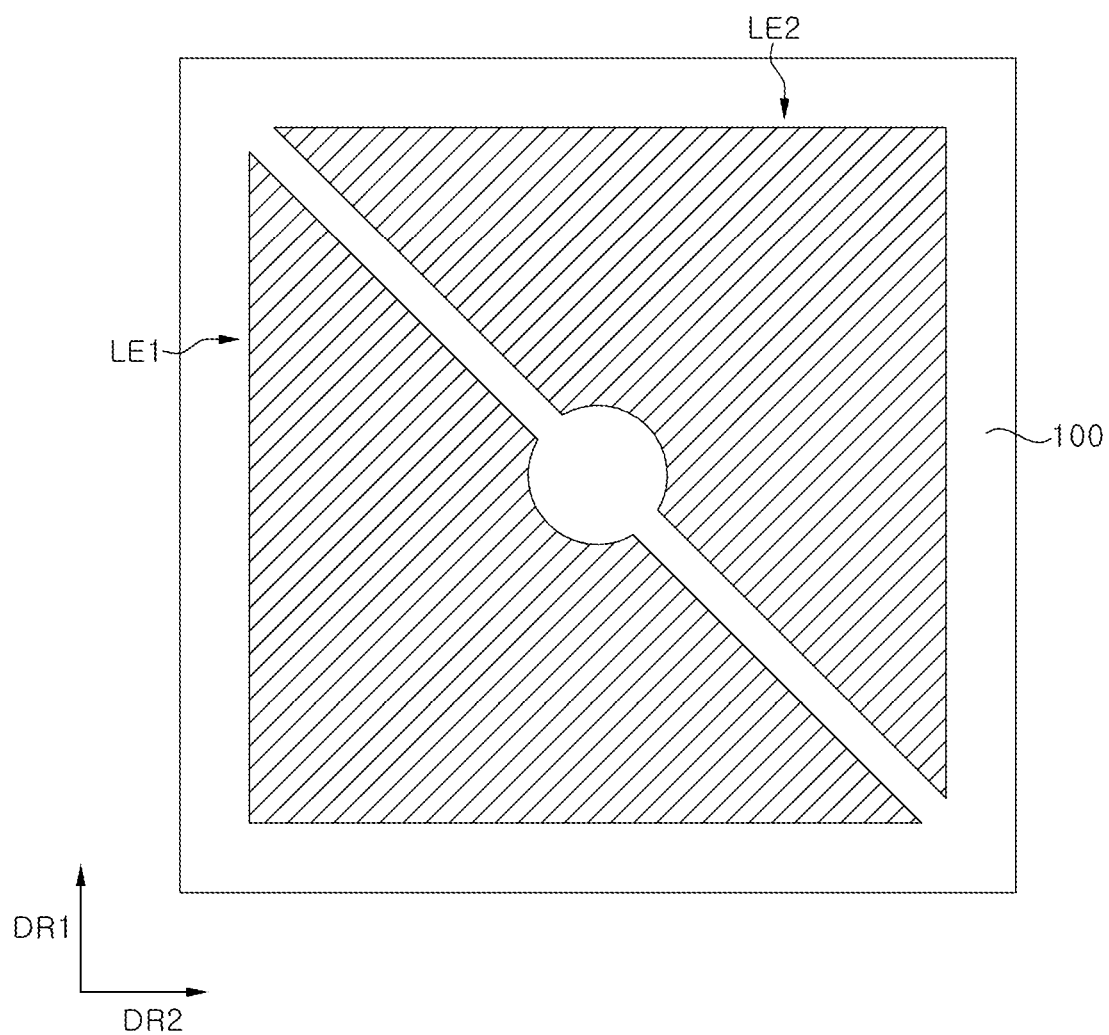

FIGS. 2A, 2B, and 2C are top views of the first light emitting part and the second light emitting part of the light emitting device shown in FIG. 1A according to exemplary embodiments.

Referring to FIG. 2A, when viewed from the top of a light emitting device according to an exemplary embodiment, the first light emitting part LE1 may be disposed on one side of the substrate 100 and may have substantially a rectangular structure, which has a long side extending in a first direction DR1. The second light emitting part LE2 may be disposed on the other side of the substrate 100 separated from the first light emitting part LE1 in a second direction DR2 perpendicular to the first direction DR1, and may have substantially a rectangular structure, which has a long side extending in the first direction DR1. For example, the first light emitting part LE1 may have a first width WT1, and the second light emitting part LE2 may have a second width WT2. The first width WT1 and the second width WT2 may be the same with or different from each other. The third light emitting part LE3 may be disposed to be separated from the first light emitting part LE1 and the second light emitting part LE2 in a third direction DR3 perpendicular to the first direction DR1 and the second direction DR2, and may have substantially the same structure as the substrate 100. The third light emitting part LE3 may have a third width WT3 greater than each of the first width WT1 and the second width WT2.

Referring to FIG. 2B, when the first light emitting part LE1 emits blue light and the second light emitting part LE2 emits green light, when viewed from the top of a light emitting device according to another exemplary embodiment, the size of the first light emitting part LE1 may be larger than the size of the second light emitting part LE2. In this manner, since the visibility of green light is generally at least about six times stronger than that of blue light, the first light emitting part LE1 emitting blue light is formed to have a size greater than the second light emitting part LE2 emitting green light, so as to improve the color balance of the light emitting device. For instance, when the first light emitting part LE1 has a first width WT1, the second light emitting part LE2 has a second width WT2, and the third light emitting part LE3 has a third width WT3, the first width WT1 may be greater than the second width WT2, and the third width WT3 may be greater than the first width WT1.

As described above, the visibility of blue light may be improved by increasing the size of the first light emitting part LE1 emitting blue light greater than that of the second light emitting part LE2 emitting green light, however, the inventive concepts are not limited thereto. In general, since the first light emitting part LE1 emitting blue light has an external quantum efficiency higher than that of the second light emitting part LE2 emitting green light, luminous intensity of blue light may need to be decreased. Further, luminous intensity of green light higher may need to be increased greater than that of blue light in order to obtain a proper color mixing ratio. As such, light emitting areas of the first light emitting part LE1 and the second light emitting part LE2 may be adjusted, so that the first and second light emitting parts LE1 and LE2 may emit light having proper luminous intensity. Accordingly, in some exemplary embodiments, the area of the first light emitting part LE1 may be smaller than that of the second light emitting part LE2.

Referring to FIG. 2C, when viewed from the top of a light emitting device according to still another exemplary embodiment, the first light emitting part LE1 may be disposed on one part of the substrate 100 and may have substantially a triangular structure, and the second light emitting part LE2 may be disposed on another part of the substrate 100, separated from the first light emitting part LE1, and have substantially a triangular structure. The longest side of the first light emitting part LE1 and the longest side of the second light emitting part LE2 may face each other. The first light emitting part LE1 and the second light emitting part LE2 may have the same size or different sizes, and the third light emitting part LE3 may have a size larger than the first light emitting part LE1 and the second light emitting part LE2.

Referring back to FIGS. 1A and 1B, the first light emitting part LE1 may include a common n-type semiconductor layer COM_N, and a first semiconductor structure SC1, which includes a first active layer 110, a first p-type semiconductor layer 112, and a first transparent electrode layer 114 vertically stacked one over another. The second light emitting part LE2 may include the common n-type semiconductor layer COM_N, and a second semiconductor structure SC2, which includes a second active layer 210, a second p-type semiconductor layer 212, and a second transparent electrode layer 214 vertically stacked one over another. The first semiconductor structure SC1 and the second semiconductor structure SC2 may be disposed on the common n-type semiconductor layer COM_N and be spaced apart from each other. In particular, the common n-type semiconductor layer COM_N may be exposed between the first semiconductor structure SC1 and the second semiconductor structure SC2.

The third light emitting part LE3 may include a third p-type semiconductor layer 312, a third active layer 310, and a third n-type semiconductor layer 305, which are vertically stacked one over another. According to an exemplary embodiment, the third light emitting part LE3 may have a hole HL, in which the third p-type semiconductor layer 312 and the third active layer 310 are etched, such that at least a portion of the third n-type semiconductor layer 305 is exposed. The third light emitting part LE3 may further include a first ohmic pattern OL1, which is brought into electrical contact with the third n-type semiconductor layer 305 exposed by the hole HL, and a second ohmic pattern OL2 that is brought into electrical contact with the third p-type semiconductor layer 312.

According to an exemplary embodiment, the common n-type semiconductor layer COM_N may have a width less than that of the third light emitting part LE3. In some exemplary embodiments, however, the common n-type semiconductor layer COM_N and the third light emitting part LE3 may have substantially the same width.

Each of the common n-type semiconductor layer COM_N and the third n-type semiconductor layer 305 may include a Si-doped gallium nitride-based semiconductor layer. Each of the first p-type semiconductor layer 112, the second p-type semiconductor layer 212, and the third p-type semiconductor layer 312 may include a Mg-doped gallium nitride-based semiconductor layer. Each of the first active layer 110, the second active layer 210, and the third active layer 310 may include a multi-quantum well (MQW), and the composition ratio thereof may be determined to emit light of a desired peak wavelength. Each of the first transparent electrode layer 114 and the second transparent electrode layer 214 may include a transparent conductive oxide (TCO), such as ZnO, indium tin oxide (ITO), zinc-doped indium tin oxide (ZITO), zinc indium oxide (ZIO), gallium indium oxide (GIO), zinc tin oxide (ZTO), fluorine-doped tin oxide (FTO), gallium-doped zinc oxide (GZO), aluminum-doped zinc oxide (AZO), or others.

Each of the first ohmic pattern OL1 and the second ohmic pattern OL2 may include a material having a higher electrical conduction property than each of the first transparent electrode layer 114 and the second transparent electrode layer 214. Each of the first ohmic pattern OL1 and the second ohmic pattern OL2 may include at least one of Au, Ge, and Be, or transparent conductive oxide (TCO). For example, the first ohmic pattern OL1 may include an Au/Be alloy, and the second ohmic pattern OL2 may include an Au/Ge alloy.

The light emitting device may further include an adhesion part AD, which bonds the first light emitting part LE1, the second light emitting part LE2, and the third light emitting part LE3 with one another among the first light emitting part LE1, the second light emitting part, LE2 and the third light emitting part LE3. For example, the adhesion part AD may be disposed to substantially fill between the first semiconductor structure SC1 and the second semiconductor structure SC2 disposed on the common n-type semiconductor layer COM_N, and substantially fill between the first and second semiconductor structures SC1 and SC2 and the third light emitting part LE3.

According to an exemplary embodiment, the adhesion part AD may include a transparent insulating material. The adhesion part AD may include glass, a polymer, a resist, or a polyimide. For example, the adhesion part AD may include spin-on-glass (SOG), benzo cyclo butadiene (BCB), hydrogen silsesquioxanes (HSQ), or an SU-8 photoresist.

According to an exemplary embodiment, when the common n-type semiconductor layer COM_N is smaller than the third light emitting part LE3, the adhesion part AD may be disposed to surround the outer sidewall of the common n-type semiconductor layer COM_N.

In some exemplary embodiments, a color filter may be provided between the first and second light emitting parts LE1 and LE2 and the third light emitting part LE3. The color filter may selectively pass light emitted from the third light emitting part LE3, and may block light emitted from the first light emitting part LE1 and the second light emitting part LE2.

The light emitting device may further include a first pad PD1 electrically coupled with the first transparent electrode layer 114 of the first light emitting part LE1, a second pad PD2 electrically coupled with the second transparent electrode layer 214 of the second light emitting part LE2, a third pad PD3 electrically coupled with the second ohmic pattern OL2 of the third light emitting part LE3, and a common pad CPD electrically coupled with the first ohmic pattern OL1 and the common n-type semiconductor layer COM_N.

A passivation layer PVT may be additionally provided on the third n-type semiconductor layer 305 of the third light emitting part LE3. The passivation layer PVT may include SiNx, TiNx, TiOx, TaOx, ZrOx, AlOx, HfOx, or other. Each of the first pad PD1, the second pad PD2, the third pad PD3, and the common pad CPD may be disposed on the passivation layer PVT.

The light emitting device may further include a first through electrode VE1 passing through the passivation layer PVT, the third light emitting part LE3, and the adhesion part AD to electrically couple the first pad PD1 and the first transparent electrode layer 114, a second through electrode VE2 passing through the passivation layer PVT, the third light emitting part LE3, and the adhesion part AD to electrically couple the second pad PD2 and the second transparent electrode layer 214, and a third through electrode VE3 passing through the passivation layer PVT and the third light emitting part LE3 to electrically couple the third pad PD3 and the second ohmic pattern OL2.

The light emitting device may further include a fourth through electrode VE4 passing through the passivation layer PVT and the third n-type semiconductor layer 305 to electrically couple the common pad CPD and the third n-type semiconductor layer 305, and a fifth through electrode VE5 passing through the passivation layer PVT, the third light emitting part LE3, and the adhesion part AD to electrically couple the common pad CPD and the common n-type semiconductor layer COM_N. According to an exemplary embodiment, the fifth through electrode VE5 may be electrically coupled with the common n-type semiconductor layer COM_N, which is exposed between the first semiconductor structure SC1 and the second semiconductor structure SC2. For example, the fifth through electrode VE5 may be disposed at the center of the light emitting device.

Each of the first through electrode VE1, the second through electrode VE2, the third through electrode VE3, the fourth through electrode VE4, and the fifth through electrode VE5 may include an electrode layer EL, a seed layer SL surrounding the outer sidewall of the electrode layer EL, and a barrier layer BL surrounding the seed layer SL. The electrode layer EL and the seed layer SD may include metal, such as Cu, and the barrier layer BL may include at least one of Ti, W, Ni, and Ta. For example, the barrier layer BL may include Ti/W, Ti/Ni, Ta, TaN, or others.

According to the exemplary embodiments shown in FIGS. 1B and 1D, the first through electrode VE1 may be integrated with the first pad PD1, and a portion of the first through electrode VE1 extending onto the passivation layer PVT may function as the first pad PD1. The second through electrode VE2 may be integrated with the second pad PD2, and a portion of the second through electrode VE2 extending onto the passivation layer PVT may function as the second pad PD2. The third through electrode VE3 may be integrated with the third pad PD3, and a portion of the third through electrode VE3 extending onto the passivation layer PVT may function as the third pad PD3. The fourth through electrode VE4 and the fifth through electrode VE5 may be integrated with the common pad CPD, and portions of the fourth and fifth through electrodes VE4 and VE5 extending onto the passivation layer PVT may function as the common pad CPD.

Referring to FIG. 1C, according to another exemplary embodiment, the first pad PD1 may be disposed on the first through electrode VE1, the second pad PD2 may be disposed on the second through electrode VE2, the third pad PD3 may be disposed on the third through electrode VE3, and the common pad CPD may be disposed on the fourth through electrode VE4 and the fifth through electrode VE5. Each of the first pad PD1, the second pad PD2, the third pad PD3, and the common pad CPD may include at least one of Au, Ag, Ni, Al, Rh, Pd, Ir, Ru, Mg, Zn, Pt, Hf, Cr, Ti, and Cu, or an alloy thereof.

When viewed from the top, when the substrate 100 has substantially a quadrangular structure as shown in FIG. 1A, the first pad PD1, the second pad PD2, the third pad PD3, and the common pad CPD may be disposed at corner portions of the substrate 100. According to an exemplary embodiment, when the fifth through electrode VE5 is disposed at the center of the light emitting device, the common pad CPD may extend from a periphery to the center of the substrate 100. As the common pad CPD extends from the periphery to the center of the substrate 100, the current being concentrated on the periphery of a light emitting device may be mitigated, and the current may be distributed over a wide area.

Referring back to FIGS. 1A and 1B, the light emitting device may further include a first metal pattern M1 disposed between the first transparent electrode layer 114 and the first through electrode VE1, a second metal pattern M2 disposed between the second transparent electrode layer 214 and the second through electrode VE2, a third metal pattern M3 disposed between the second ohmic pattern OL2 and the third through electrode VE3, a fourth metal pattern M4 disposed between the first ohmic pattern OL1 and the fourth through electrode VE4, and a fifth metal pattern M5 disposed between the common n-type semiconductor layer COM_N and the fifth through electrode VE5. Each of the first metal pattern M1, the second metal pattern M2, the third metal pattern M3, the fourth metal pattern M4, and the fifth metal pattern M5 may include at least one of Ti, Cr, Au, and Al. For example, each of the first metal pattern M1, the second metal pattern M2, the third metal pattern M3, the fourth metal pattern M4, and the fifth metal pattern M5 may include Cr/Au, Ti/Al or Cr/Al.

The first metal pattern M1 may improve the ohmic property between the first transparent electrode layer 114 and the first through electrode VE1. The second metal pattern M2 may improve the ohmic property between the second transparent electrode layer 214 and the second through electrode VE2. The third metal pattern M3 may improve the ohmic property between the second ohmic pattern OL2 and the third through electrode VE3. The fourth metal pattern M4 may improve the ohmic property between the first ohmic pattern OL1 and the fourth through electrode VE4. The fifth metal pattern M5 may improve the ohmic property between the common n-type semiconductor layer COM_N and the fifth through electrode VE5.

The light emitting device may further include a dielectric layer DL, which surrounds the outer sidewall of each of the first through electrode VE1, the second through electrode VE2, the third through electrode VE3, the fourth through electrode VE4, and the fifth through electrode VE5. The dielectric layer DL may include at least one of SiNx, TiNx, TiOx, TaOx, ZrOx, HfOx, and SiOx.

Referring to FIG. 1D, the light emitting device may further include a first solder structure SS1 disposed on the first pad PD1, a second solder structure SS2 disposed on the second pad PD2, a third solder structure SS3 disposed on the third pad PD3, and a fourth solder structure SS4 disposed on the common pad CPD. For example, each of the first solder structure SS1, the second solder structure SS2, the third solder structure SS3, and the fourth solder structure SS4 may have a structure, in which a solder ball SD including In or Sn and a barrier layer BRL including one of Ni, Co, Ti and Fe are stacked.

While the common pad CPD is above described as being electrically coupling the common n-type semiconductor layer COM_N and the third n-type semiconductor layer 305, however, the inventive concepts are not limited thereto. For example, in some exemplary embodiments, the common pad CPD may electrically couple the first transparent electrode layer 114, the second transparent electrode layer 214, and the second ohmic pattern OL2.

Figure 3A:
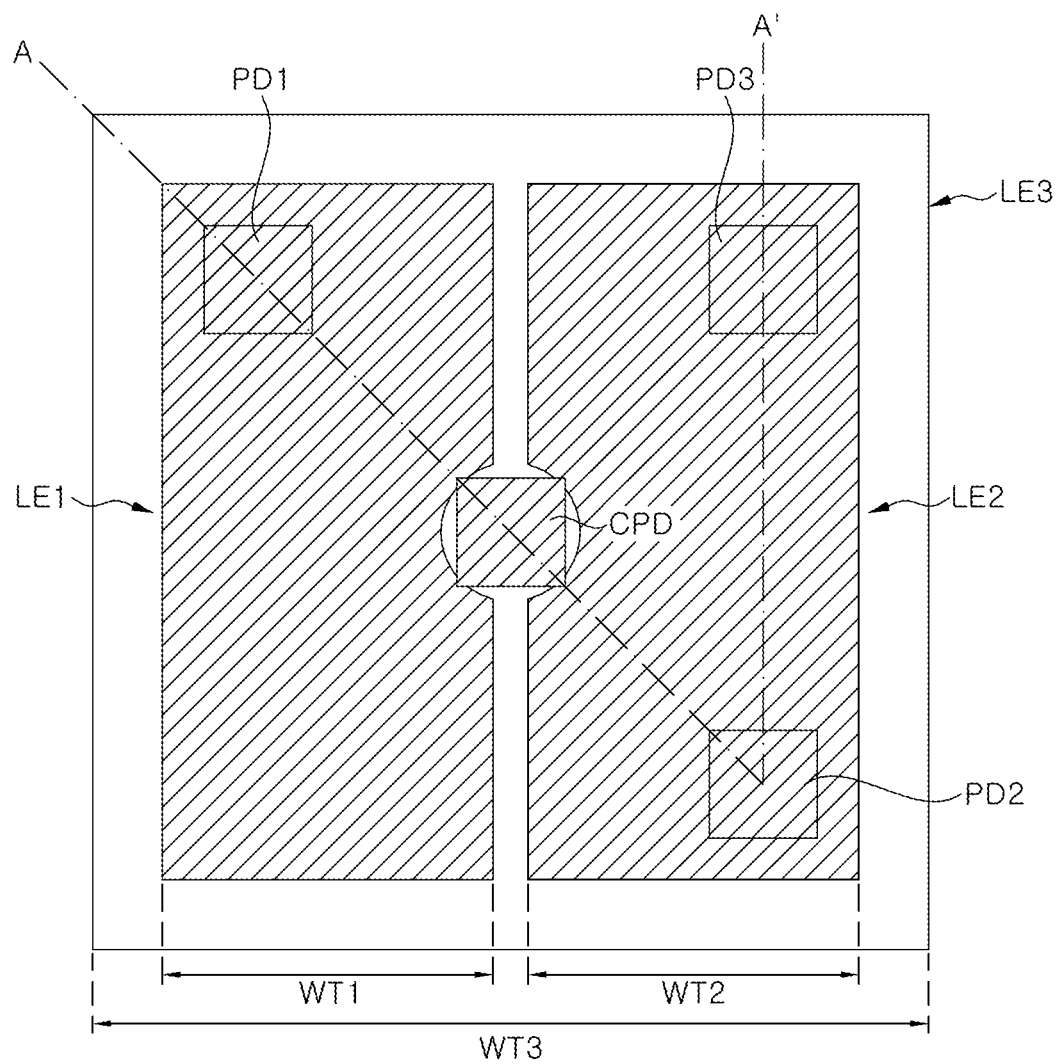
FIG. 3A is a schematic top view of a light emitting device according to another exemplary embodiment.
Figure 3B:
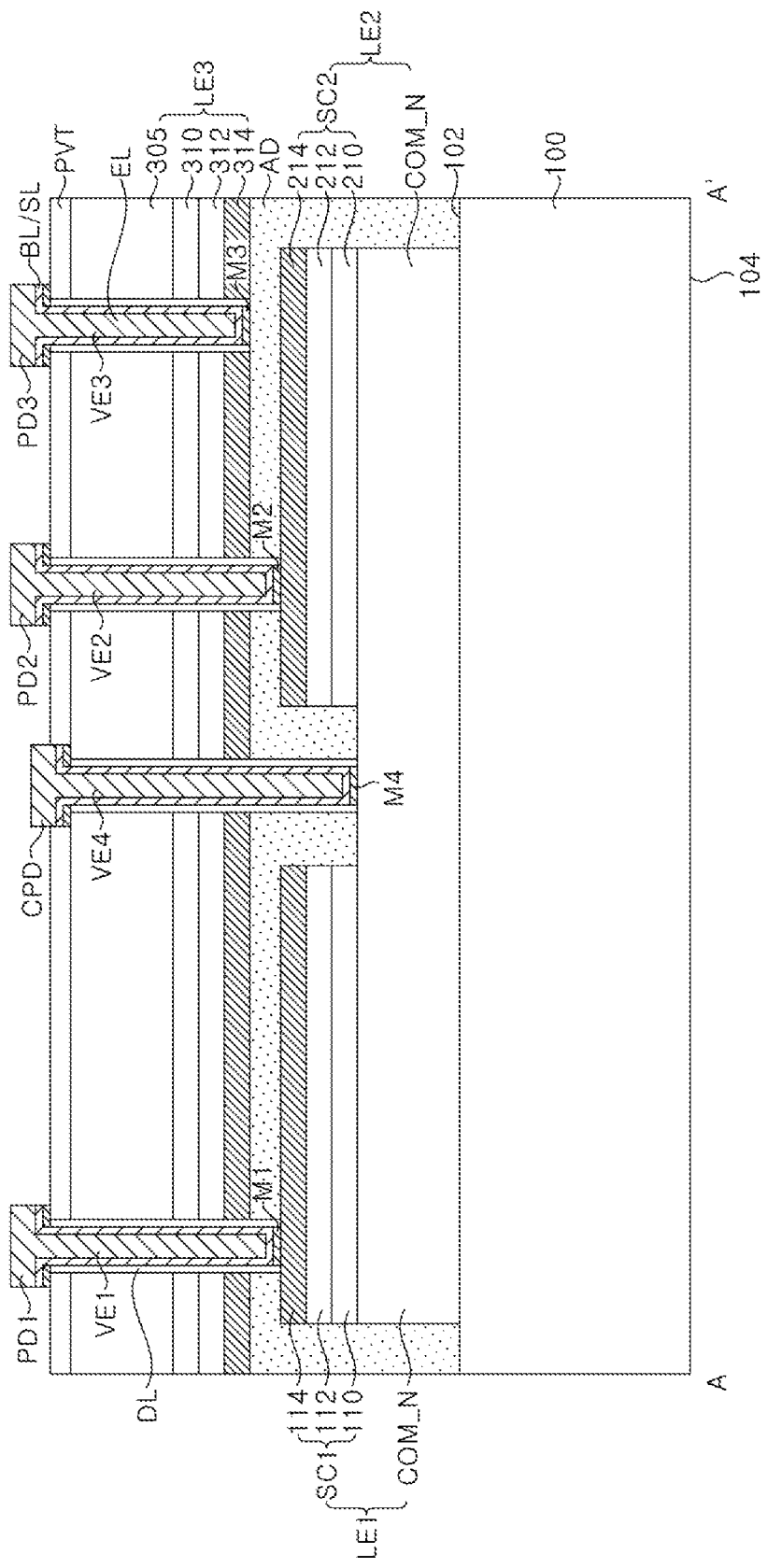
FIG. 3B is a cross-sectional view taken along line A-A' of FIG. 3A.

FIG. 3A is a schematic top view of a light emitting device according to another exemplary embodiment, and FIG. 3B is a cross-sectional view taken along line A-A' of FIG. 3A.

Referring to FIGS. 3A and 3B, a light emitting device may include a substrate 100, a first light emitting part LE1 and a second light emitting part LE2 disposed on the same plane on a first surface 102 of the substrate 100, and a third light emitting part LE3 disposed over the first light emitting part LE1 and the second light emitting part LE2.

According to an exemplary embodiment, when a second surface 104 of the substrate 100 opposing the first surface 102 is a light extraction surface, the third light emitting part LE3 may emit red light, the first light emitting part LE1 may emit blue light or green light, and the second light emitting part LE2 may emit green light or blue light.

The first light emitting part LE1 may include a common n-type semiconductor layer COM_N, and a first semiconductor structure SC1, which includes a first active layer 110, a first p-type semiconductor layer 112, and a first transparent electrode layer 114 vertically stacked one over another. The second light emitting part LE2 may include the common n-type semiconductor layer COM_N, and a second semiconductor structure SC2, which includes a second active layer 210, a second p-type semiconductor layer 212, and a second transparent electrode layer 214 vertically stacked one over another. The first semiconductor structure SC1 and the second semiconductor structure SC2 may be disposed on the common n-type semiconductor layer COM_N and be spaced apart from each other. In particular, the common n-type semiconductor layer COM_N may be exposed between the first semiconductor structure SC1 and the second semiconductor structure SC2. The third light emitting part LE3 may include a third transparent electrode layer 314, a third p-type semiconductor layer 312, a third active layer 310, and a third n-type semiconductor layer 305, which are vertically stacked.

According to an exemplary embodiment, each of the first transparent electrode layer 114, the second transparent electrode layer 214, and the third transparent electrode layer 314 may include a transparent conductive oxide (TCO), such as ZnO, ITO, ZITO, ZIG, GIG, ZTO, FTO, GZO, AZO, or others.

The light emitting device may further include an adhesion part AD, which bonds the first light emitting part LE1, the second light emitting part LE2, and the third light emitting part LE3 with one another among the first light emitting part LE1, the second light emitting part LE2, and the third light emitting part LE3. For example, the adhesion part AD may be disposed substantially to fill between the first semiconductor structure SC1 and the second semiconductor structure SC2 disposed on the common n-type semiconductor layer COM_N, and substantially fill between the first and second semiconductor structures SC1 and SC2 and the third light emitting part LE3. For example, the adhesion part AD may include a material, such as SOG, BCB, HSQ, or an SU-8 photoresist, which is transparent and has a bonding property.

The light emitting device may further include a first pad PD1 electrically coupled with the first transparent electrode layer 114 of the first light emitting part LE1, a second pad PD2 electrically coupled with the second transparent electrode layer 214 of the second light emitting part LE2, a third pad PD3 electrically coupled with the third transparent electrode layer 314 of the third light emitting part LE3, and a common pad CPD electrically coupled with the third n-type semiconductor layer 305 and the common n-type semiconductor layer COM_N.

A passivation layer PVT may be additionally provided on the third n-type semiconductor layer 305 of the third light emitting part LE3. Each of the first pad PD1, the second pad PD2, and the third pad PD3 may be disposed on the passivation layer PVT, and the common pad CPD may pass through the passivation layer PVT and be brought into electrical contact with the third n-type semiconductor layer 305 and the common n-type semiconductor layer COM_N.

The light emitting device may further include a first through electrode VE1 passing through the passivation layer PVT, the third light emitting part LE3, and the adhesion part AD to electrically couple the first pad PD1 and the first transparent electrode layer 114, a second through electrode VE2 passing through the passivation layer PVT, the third light emitting part LE3, and the adhesion part AD to electrically couple the second pad PD2 and the second transparent electrode layer 214, and a third through electrode VE3 passing through the passivation layer PVT and the third light emitting unit LE3 to electrically couple the third pad PD3 and the third transparent electrode layer 314. According to an exemplary embodiment, the first through electrode VE1 and the second through electrode VE2 may have substantially the same height.

The light emitting device may further include a fourth through electrode VE4 passing through the third light emitting part LE3 and the adhesion part AD to electrically couple the common pad CPD with the third n-type semiconductor layer 305 and the common n-type semiconductor layer COM_N. According to an exemplary embodiment, the fourth through s1 electrode VE4 may be disposed between the first semiconductor structure SC1 and the second semiconductor structure SC2. For example, the fourth through electrode VE4 may be disposed at the center of the substrate 100.

Each of the first through electrode VE1, the second through electrode VE2, the third through electrode VE3, and the fourth through electrode VE4 may include an electrode layer EL, a seed layer SL surrounding the outer sidewall of the electrode layer EL, and a barrier layer BL surrounding the seed layer SL. The electrode layer EL and the seed layer SL may include metal, such as Cu, and the barrier layer BL may include at least one of Ti, W, Ni, and Ta. For example, the barrier layer BL may include Ti/W, Ti/Ni, Ta/TaN or others.

When viewed from the top, when the substrate 100 has substantially a quadrangular shape, the first pad PD1, the second pad PD2, and the third pad PD3 may be disposed at corner portions of the substrate 100, and the common pad CPD may be disposed at the center of the substrate 100.

The light emitting device may further include a first metal pattern M1 disposed between the first transparent electrode layer 114 and the first through electrode VE1, a second metal pattern M2 disposed between the second transparent electrode layer 214 and the second through electrode VE2, a third metal pattern M3 disposed between the third transparent electrode layer 314 and the third through electrode VE3, and a fourth metal pattern M4 disposed between the common n-type semiconductor layer COM_N and the fourth through electrode VE4. Each of the first metal pattern M1, the second metal pattern M2, the third metal pattern M3, and the fourth metal pattern M4 may include at least one of Ti, Cr, Au, and Al. For example, each of the first metal pattern M1, the second metal pattern M2, the third metal pattern M3, and the fourth metal pattern M4 may include Cr/Au, Ti/Al or Cr/Al.

The light emitting device may further include a dielectric layer DL, which surrounds the outer sidewall of each of the first through electrode VE1, the second through electrode VE2, the third through electrode VE3, and the fourth through electrode VE4.

Since the light emitting device of FIGS. 3A and 3B is substantially similar as that of FIGS. 1A and 1B, repeated descriptions of substantially similar elements and characteristics thereof will be omitted to avoid redundancy.

Figure 4:
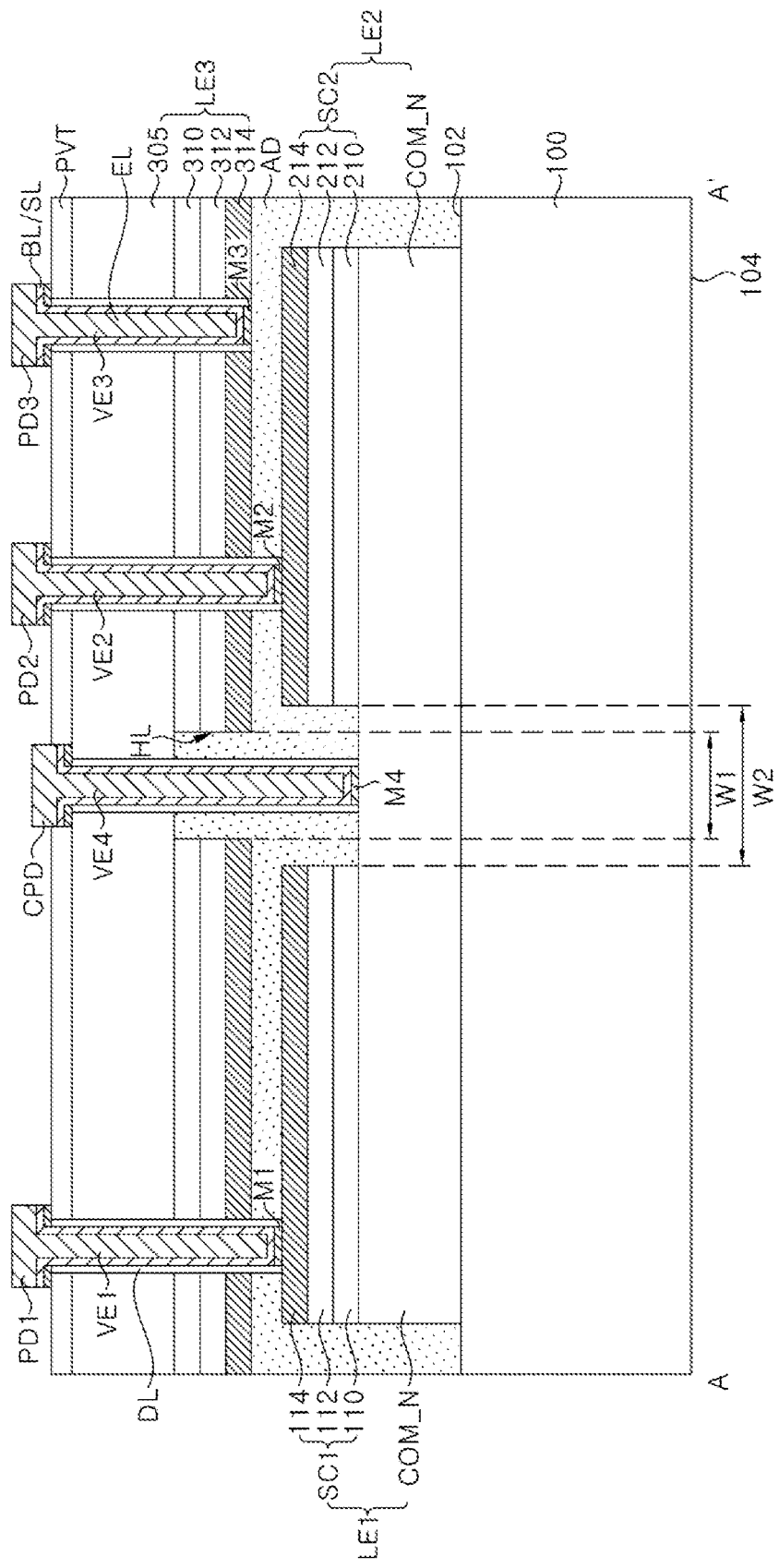
FIG. 4 is a cross-sectional view of a light emitting device according to another exemplary embodiment.

FIG. 4 is a cross-sectional of a light emitting device according to another exemplary embodiment. The top view of the light emitting device of FIG. 4 may be the same as that shown in FIG. 3A.

Referring to FIGS. 3A and 4, a light emitting device may include a substrate 100, a first light emitting part LE1 and a second light emitting part LE2 disposed on the same plane on a first surface 102 of the substrate 100, and a third light emitting part LE3 disposed over the first light emitting part LE1 and the second light emitting part LE2. A second surface 104 of the substrate 100 opposing the first surface 102 may be a light extraction surface.

The first light emitting part LE1 may include a common n-type semiconductor layer COM_N, and a first semiconductor structure SC1, which includes a first active layer 110, a first p-type semiconductor layer 112, and a first transparent electrode layer 114 vertically stacked one over another. The second light emitting part LE2 may include the common n-type semiconductor layer COM_N, and a second semiconductor structure SC2, which includes a second active layer 210, a second p-type semiconductor layer 212, and a second transparent electrode layer 214 vertically stacked one over another. The first semiconductor structure SC1 and the second semiconductor structure SC2 may be disposed on the common n-type semiconductor layer COM_N and be spaced apart from each other. In other words, the common n-type semiconductor layer COM_N may be exposed between the first semiconductor structure SC1 and the second semiconductor structure SC2.

The third light emitting part LE3 may include a third transparent electrode layer 314, a third p-type semiconductor layer 312, a third active layer 310, and a third n-type semiconductor layer 305, which are vertically stacked. According to an exemplary embodiment, the third light emitting part LE3 may include a hole HL exposing a portion of the third n-type semiconductor layer 305, which may be formed by etching portions of the third transparent electrode layer 314, the third p-type semiconductor layer 312, and the third active layer 310. The hole HL of the third light emitting part LE3 may be disposed at a position corresponding to at least a portion of the common n-type semiconductor layer COM_N exposed between the first semiconductor structure SC1 and the second semiconductor structure SC2. A width W1 of the hole HL may be less than a width W2 of the common n-type semiconductor layer COM_N exposed between the first semiconductor structure SC1 and the second semiconductor structure SC2.

The light emitting device may further include an adhesion part AD, which bonds the first light emitting part LE1, the second light emitting part LE2, and the third light emitting part LE3 with one another among the first light emitting part LE1, the second light emitting part LE2, and the third light emitting part LE3. For example, the adhesion part AD may be disposed to substantially fill between the first semiconductor structure SC1 and the second semiconductor structure SC2 disposed on the common n-type semiconductor layer COM_N, and substantially fill between the first and second semiconductor structures SC1 and SC2 and the third light emitting part LE3. According to an exemplary embodiment, the adhesion part AD may substantially fill the inside of the hole HL of the third light emitting part LE3.

The light emitting device may further include a first through electrode VE1 and a first pad PD1, which are electrically coupled with the first transparent electrode layer 114, a second through electrode VE2 and a second pad PD2, which are electrically coupled with the second transparent electrode layer 214, a third through electrode VE3 and a third pad PD3, which are electrically coupled with the third transparent electrode layer 314, and a fourth through electrode VE4 and a common pad CPD, which are electrically coupled with the third n-type semiconductor layer 305 and the common n-type semiconductor layer COM_N. The light emitting device may further include a passivation layer PVT on the third n-type semiconductor layer 305, and a dielectric layer DL, which surrounds the outer sidewall of each of the first through electrode VE1, the second through electrode VE2, and the third through electrode VE3. In some exemplary embodiments, the dielectric layer DL may not be disposed on the outer sidewall of the fourth through electrode VE4.

According to an exemplary embodiment, the common pad CPD may pass through the passivation layer PVT and be brought into electrical contact with the third n-type semiconductor layer 305. The fourth through electrode VE4 electrically coupled with the common pad CPD may pass through the third n-type semiconductor layer 305 and be disposed in the hole HL of the third light emitting part LE3. In this case, even when the dielectric layer DL is not disposed on the outer sidewall of the fourth through electrode VE4, since the adhesion part AD including a transparent insulating material is disposed in the hole HL of the third light emitting part LE3, the fourth through electrode VE4 may be insulated from the third active layer 310, the third p-type semiconductor layer 312, and the third transparent electrode layer 314 of the third light emitting part LE3. Also, as the adhesion part AD substantially fills between the first semiconductor structure SC1 and the second semiconductor structure SC2, the fourth through electrode VE4, which is brought into electrical contact with the common n-type semiconductor layer COM_N, may be insulated from the first semiconductor structure SC1 and the second semiconductor structure SC2.

Since the light emitting device of FIG. 4 is substantially similar as those of FIGS. 1A, 1B, 3A, and 3B, repeated descriptions of substantially similar components and characteristics thereof will be omitted to avoid redundancy.

Figure 5A:
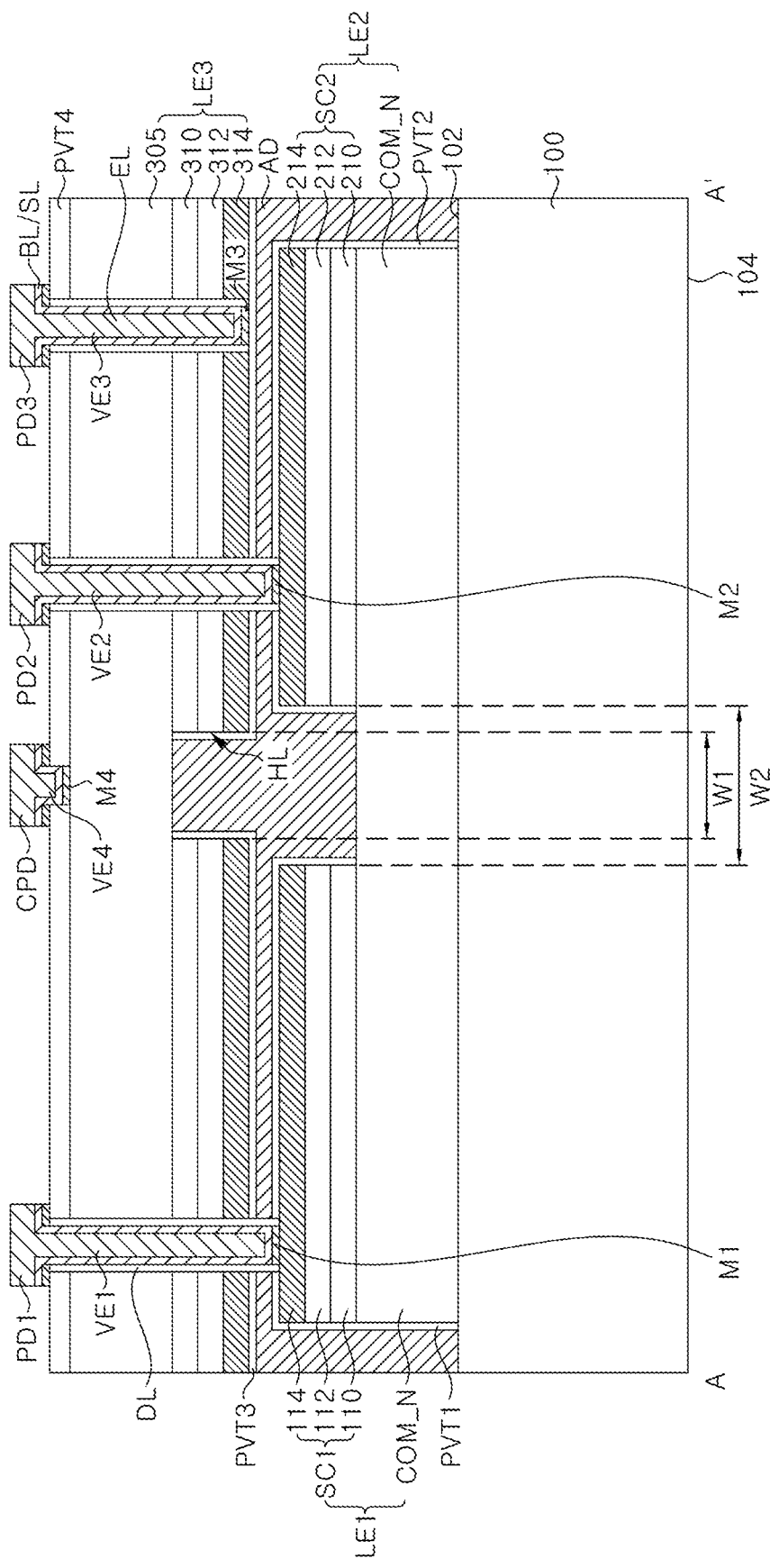
FIGS. 5A and 5B are cross-sectional views of light emitting devices according to exemplary embodiments.
Figure 5B:
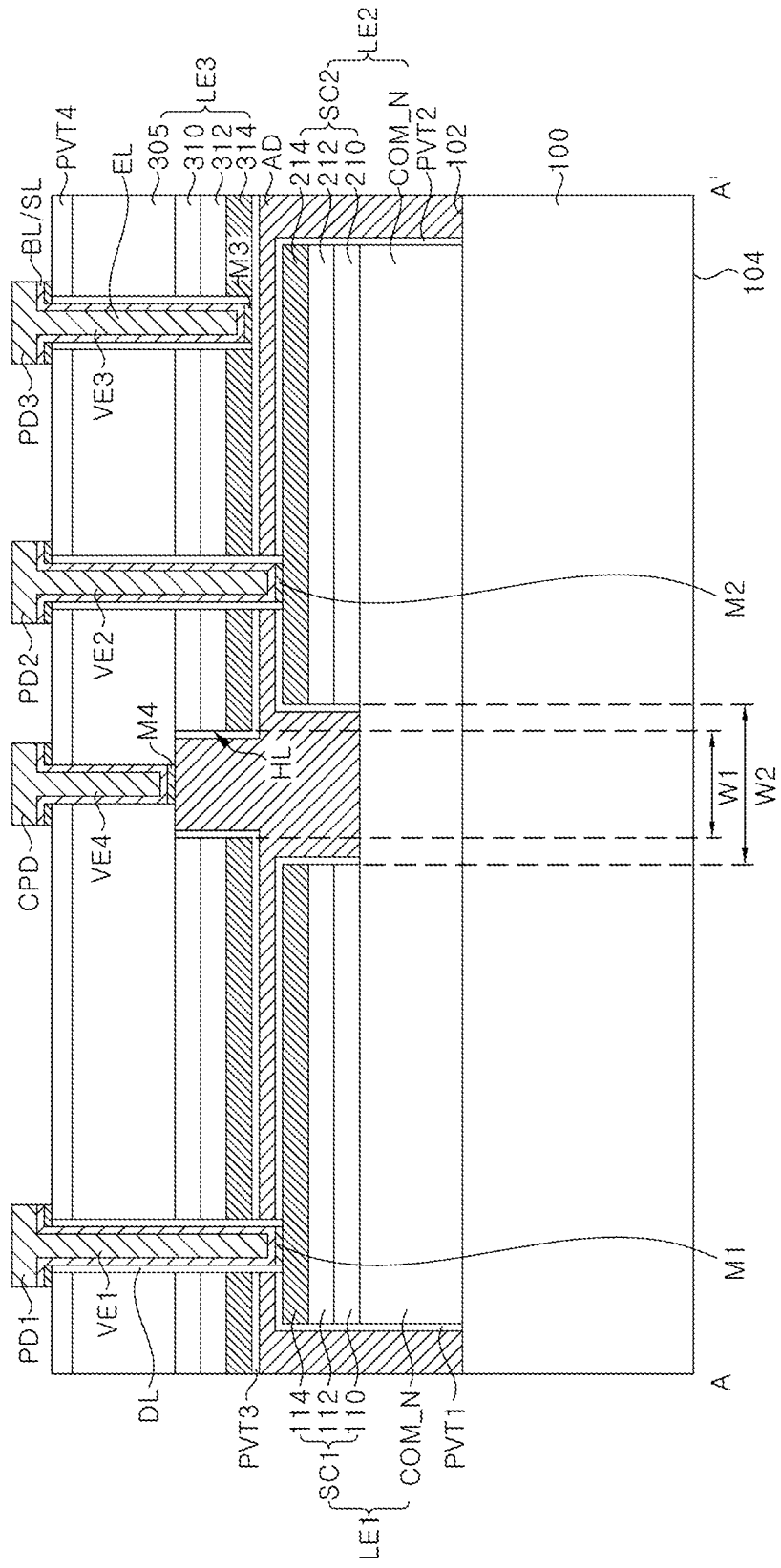

FIGS. 5A and 5B are cross-sectional views of light emitting devices according to exemplary embodiments. The top views of the light emitting devices of FIGS. 5A and 5B may be the same as FIG. 3A.

Referring to FIGS. 3A, 5A, and 5B, a light emitting device may include a substrate 100, a first light emitting part LE1 and a second light emitting part LE2 disposed on the same plane on a first surface 102 of the substrate 100, and a third light emitting part LE3 disposed over the first light emitting part LE1 and the second light emitting part LE2. A second surface 104 of the substrate 100 opposing the first surface 102 may be a light extraction surface.

The first light emitting part LE1 may include a common n-type semiconductor layer COM_N, and a first semiconductor structure SC1, which includes a first active layer 110, a first p-type semiconductor layer 112, and a first transparent electrode layer 114 vertically stacked one over another. The second light emitting part LE2 may include the common n-type semiconductor layer COM_N, and a second semiconductor structure SC2, which includes a second active layer 210, a second p-type semiconductor layer 212, and a second transparent electrode layer 214 vertically stacked one over another. The first semiconductor structure SC1 and the second semiconductor structure SC2 may be disposed on the common n-type semiconductor layer COM_N and be spaced apart from each other. In other words, the common n-type semiconductor layer COM_N may be exposed between the first semiconductor structure SC1 and the second semiconductor structure SC2.

The third light emitting part LE3 may include a third transparent electrode layer 314, a third p-type semiconductor layer 312, a third active layer 310, and a third n-type semiconductor layer 305, which are vertically stacked. According to an exemplary embodiment, the third light emitting part LE3 may include a hole HL exposing a portion of the third n-type semiconductor layer 305, which may be formed by etching portions of the third transparent electrode layer 314, the third p-type semiconductor layer 312, and the third active layer 310. The hole HL of the third light emitting part LE3 may be a disposed at a position corresponding to at least a portion of the common n-type semiconductor layer COM_N exposed between the first semiconductor structure SC1 and the second semiconductor structure SC2. A width W1 of the hole HL may be less than a width W2 of the common n-type semiconductor layer COM_N exposed between the first semiconductor structure SC1 and the second semiconductor structure SC2.

The light emitting device may further include a first passivation layer PVT1 covering the first semiconductor structure SC1 on the first transparent electrode layer 114, a second passivation layer PVT2 covering the second semiconductor structure SC2 on the second transparent electrode layer 214, a third passivation layer PVT3 covering one surface of the third light emitting part LE3 on the third transparent electrode layer 314, and a fourth passivation layer PVT4 covering the other surface of the third light emitting part LE3 facing away from the one surface on the third n-type semiconductor layer 305. For example, each of the first passivation layer PVT1, the second passivation layer PVT2, the third passivation layer PVT3, and the fourth passivation layer PVT4 may include an insulating material including at least one of SiNx, TiNx, TiOx, TaOx, ZrOx, AlOx, or HfOx.

According to an exemplary embodiment, since the first passivation layer PVT1 and the second passivation layer PVT2 are not disposed on the common n-type semiconductor layer COM_N disposed between the first semiconductor structure SC1 and the second semiconductor structure SC2, a portion of the common n-type semiconductor layer COM_N between the first semiconductor structure SC1 and the second semiconductor structure SC2 may be exposed. Also, since the third passivation layer PVT3 is not disposed at the bottom of the hole HL, a portion of the third n-type semiconductor layer 305 may be exposed at the bottom of the hole HL.

The light emitting device may further include an adhesion part AD, which bonds the first light emitting part LE1, the second light emitting part LE2, and the third light emitting part LE3 with one another among the first light emitting part LE1, the second light emitting part LE2, and the third light emitting part LE3. For example, the adhesion part AD may be disposed to substantially fill between the first semiconductor structure SC1 and the second semiconductor structure SC2 disposed on the common n-type semiconductor layer COM_N, and substantially fill between the first and second semiconductor structures SC1 and SC2 and the third light emitting part LE3. According to an exemplary embodiment, the adhesion part AD may substantially fill the inside of the hole HL of the third light emitting part LE3.

According to an exemplary embodiment, the adhesion part AD may include a material, which is transparent and has an electrical conductivity and a bonding property. For example, the adhesion part AD may include a material, such as transparent conductive oxide (TCO), isotropic conductive adhesives (ICA), anisotropic conductive adhesives (ACA), or others.

The light emitting device may further include a first through electrode VE1 and a first pad PD1, which are electrically coupled with the first transparent electrode layer 114, a second through electrode VE2 and a second pad PD2, which are electrically coupled with the second transparent electrode layer 214, a third through electrode VE3 and a third pad PD3, which are electrically coupled with the third transparent electrode layer 314, and a fourth through electrode VE4 and a common pad CPD, which are electrically coupled with the third n-type semiconductor layer 305. The light emitting device may further include a dielectric layer DL, which surrounds the outer sidewall of each of the first through electrode VE1, the second through electrode VE2, and the third through electrode VE3. According to an exemplary embodiment, the dielectric layer DL may not be disposed on the outer sidewall of the fourth through electrode VE4.

Referring to FIG. 5A, the fourth through electrode VE4 according to the illustrated exemplary embodiment may pass through the passivation layer PVT, and may be brought into electrical contact with one surface of the third n-type semiconductor layer 305. As described above, since the adhesion part AD has an electrical conductivity, the fourth through electrode VE4 may be electrically coupled with the one surface of the third n-type semiconductor layer 305, and the third n-type semiconductor layer 305 exposed by the hole HL of the third light emitting part LE3 may be brought into electrical contact with the adhesion part AD. The adhesion part AD may be brought into electrical contact with the common n-type semiconductor layer COM_N exposed between the first semiconductor structure SC1 and the second semiconductor structure SC2. In this manner, the common pad CPD may be electrically coupled with the third n-type semiconductor layer 305, the adhesion part AD, and the common n-type semiconductor layer COM_N through the fourth through electrode VE4.

Referring to FIG. 5B, the fourth through electrode VE4 according to the illustrated exemplary embodiment may pass through the passivation layer PVT and the third n-type semiconductor layer 305 of the third light emitting part LE3, and may be brought into electrical contact with the third n-type semiconductor layer 305. In this case, as the outer sidewall of the fourth through electrode VE4 is brought into electrical contact with the third n-type semiconductor layer 305, an area through which the fourth through electrode VE4 and the third n-type semiconductor layer 305 are brought into contact with each other may be increased. The fourth through electrode VE4 may be brought into electrical contact with the adhesion part AD filling the hole HL of the third light emitting part LE3. The adhesion part AD may be brought into electrical contact with the common n-type semiconductor layer COM_N, which is exposed between the first semiconductor structure SC1 and the second semiconductor structure SC2. In this manner, the common pad CPD may be electrically coupled with the third n-type semiconductor layer 305, the adhesion part AD, and the common n-type semiconductor layer COM_N through the fourth through electrode VE4.

While the fourth through electrode VE4 is illustrated as passing through the passivation layer PVT and the third n-type semiconductor layer 305 of the third light emitting part LE3 in FIG. 5B, the inventive concepts are not limited thereto. For example, in some exemplary embodiments, the fourth through electrode VE4 may pass through the passivation layer PVT and the third n-type semiconductor layer 305 of the third light emitting part LE3, and further pass through at least a portion of the adhesion part AD. Alternatively, the fourth through electrode VE4 may pass through the passivation layer PVT and the third n-type semiconductor layer 305 of the third light emitting part LE3, and may pass through the adhesion part AD and be brought into contact with the common n-type semiconductor layer COM_N exposed between the first semiconductor structure SC1 and the second semiconductor structure SC2.

Since the light emitting devices of FIGS. 5A and 5B are substantially similar as those of FIGS. 1A, 1B, 3A, 3B, and 4, repeated descriptions of substantially similar elements and characteristics thereof will be omitted to avoid redundancy.

Figure 6:
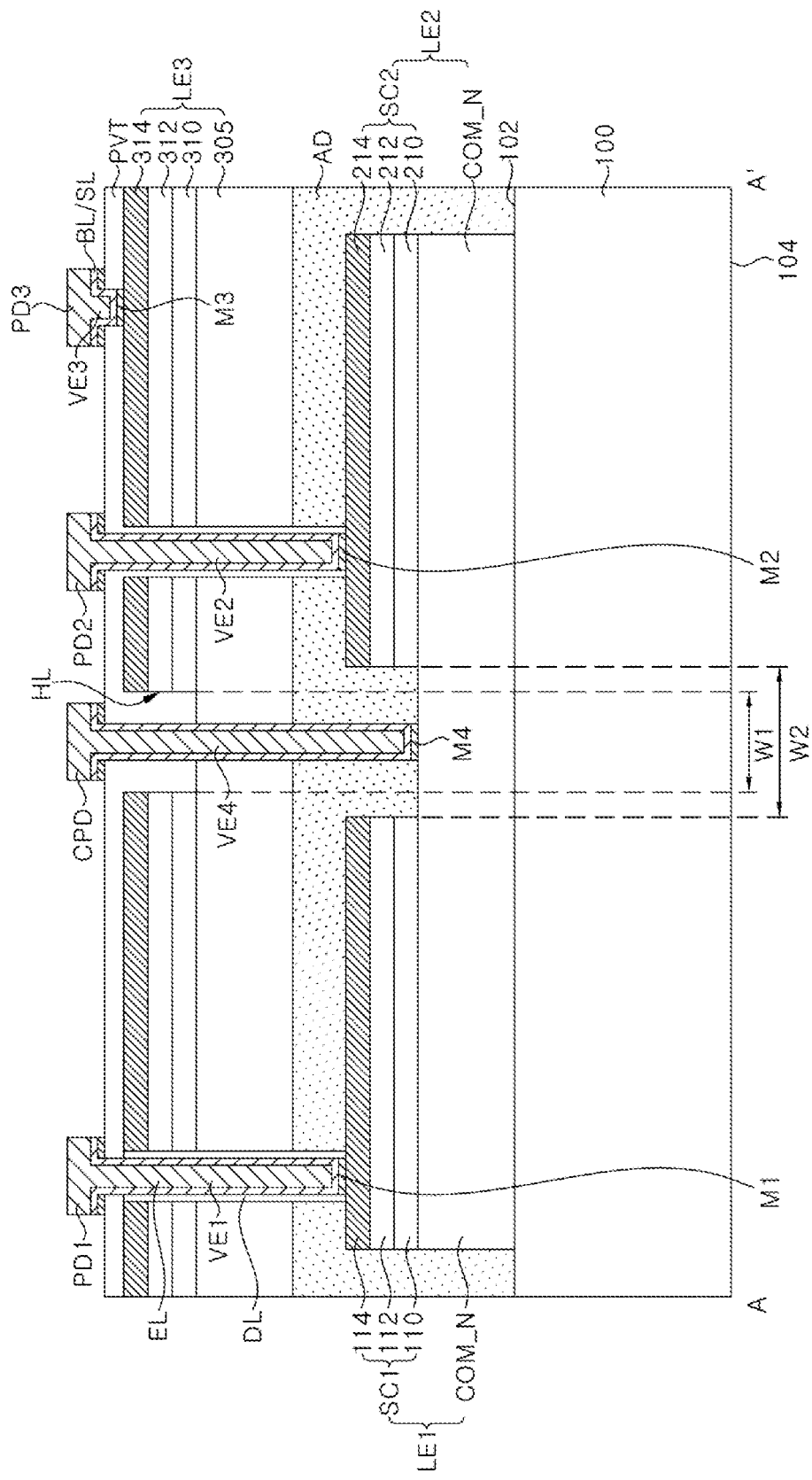
FIG. 6 is a cross-sectional of a light emitting device according to another exemplary embodiment.

FIG. 6 is a cross-sectional view of a light emitting device according to another exemplary embodiment. The top view of the light emitting device of FIG. 6 may be the same as FIG. 3A.

Referring to FIGS. 3A and 6, a light emitting device may include a substrate 100, a first light emitting part LE1 and a second light emitting part LE2 disposed on the same plane on a first surface 102 of the substrate 100, and a third light emitting part LE3 disposed over the first light emitting part LE1 and the second light emitting part LE2. A second surface 104 of the substrate 100 opposing the first surface 102 may be a light extraction surface.

The first light emitting part LE1 may include a common n-type semiconductor layer COM_N, and a first semiconductor structure SC1, which includes a first active layer 110, a first p-type semiconductor layer 112, and a first transparent electrode layer 114 vertically stacked one over another. The second light emitting part LE2 may include the common n-type semiconductor layer COM_N, and a second semiconductor structure SC2, which includes a second active layer 210, a second p-type semiconductor layer 212, and a second transparent electrode layer 214 vertically stacked one over another. The first semiconductor structure SC1 and the second semiconductor structure SC2 may be disposed on the common n-type semiconductor layer COM_N and be spaced apart from each other. In particular, the common n-type semiconductor layer COM_N may be exposed between the first semiconductor structure SC1 and the second semiconductor structure SC2.

The third light emitting part LE3 may include a third n-type semiconductor layer 305, a third active layer 310, a third p-type semiconductor layer 312, and a third transparent electrode layer 314, which are vertically stacked. According to an embodiment, the third light emitting part LE3 may include a hole HL exposing a portion of the third n-type semiconductor layer 305, which may be formed by etching portions of the third transparent electrode layer 314, the third p-type semiconductor layer 312, and the third active layer 310. The hole HL of the third light emitting part LE3 may be disposed at a position corresponding to at least a portion of the common n-type semiconductor layer COM_N exposed between the first semiconductor structure SC1 and the second semiconductor structure SC2. A width W1 of the hole HL may be less than a width W2 of the common n-type semiconductor layer COM_N exposed between the first semiconductor structure SC1 and the second semiconductor structure SC2.

The light emitting device may further include an adhesion part AD, which bonds the first light emitting part LE1, the second light emitting part LE2, and the third light emitting part LE3 with one another among the first light emitting part LE1, the second light emitting part LE2, and the third light emitting part LE3. For example, the adhesion part AD may be disposed to substantially fill between the first semiconductor structure SC1 and the second semiconductor structure SC2 disposed on the common n-type semiconductor layer COM_N, and substantially fill between the first and second semiconductor structures SC1 and SC2 and the third light emitting part LE3. For example, the adhesion part AD may include a material, such as SOG, BCB, HSQ, or an SU-8 photoresist, which is transparent and has a bonding property.

The light emitting device may further include a first through electrode VE1 and a first pad PD1, which are electrically coupled with the first transparent electrode layer 114, a second through electrode VE2 and a second pad PD2, which are electrically coupled with the second transparent electrode layer 214, a third through electrode VE3 and a third pad PD3, which are electrically coupled with the third transparent electrode layer 314, and a fourth through electrode VE4 and a common pad CPD, which are electrically coupled with the third n-type semiconductor layer 305 and the common n-type semiconductor layer COM_N.

The light emitting device may further include a passivation layer PVT disposed on the third transparent electrode layer 314, and a dielectric layer DL surrounding the outer sidewall of each of the first through electrode VE1 and the second through electrode VE2. According to an exemplary embodiment, the passivation layer PVT may substantially fill the hole HL of the third light emitting part LE3, and may extend to the top surface of the third transparent electrode layer 314. However, the dielectric layer DL may not be disposed on the outer sidewall of each of the third through electrode VE3 and the fourth through electrode VE4.

According to an exemplary embodiment, the third through electrode VE3 may pass through the passivation layer PVT and be brought into electrical contact with the third transparent electrode layer 314. Since the third through electrode VE3 is insulated by the passivation layer PVT, the outer sidewall of the third through electrode VE3 may not need to be additionally surrounded by the dielectric layer DL.

According to an exemplary embodiment, the fourth through electrode VE4 may pass through the passivation layer PVT substantially filling the hole HL of the third light emitting part LE3, the third n-type semiconductor layer 305, and the adhesion part AD. As the fourth through electrode VE4 passes through the hole HL substantially filled with the passivation layer PVT, the outer sidewall of the fourth through electrode VE4 may not need to be surrounded by the dielectric layer DL. Further, since the dielectric layer DL does not surround the outer sidewall of the fourth through electrode VE4, when the fourth through electrode VE4 passes through the third n-type semiconductor layer 305, the outer sidewall of the fourth through electrode VE4 may be brought into electrical contact with the third n-type semiconductor layer 305. In this manner, an area through which the fourth through electrode VE4 and the third n-type semiconductor layer 305 are brought into contact with each other may be increased. The fourth through electrode VE4 may pass through the adhesion part AD including an insulating material, and may be brought into electrical contact with the common n-type semiconductor layer COM_N. In this manner, the fourth through electrode VE4 may be brought into electrical contact with the third n-type semiconductor layer 305 and the common n-type semiconductor layer COM_N.

Since the light emitting device of FIG. 6 is substantially similar as those of FIGS. 1A, 1B, 3A, 3B, 4, 5A, and 5B, repeated descriptions of substantially similar elements and characteristics thereof will be omitted to avoid redundancy.

Figure 7:
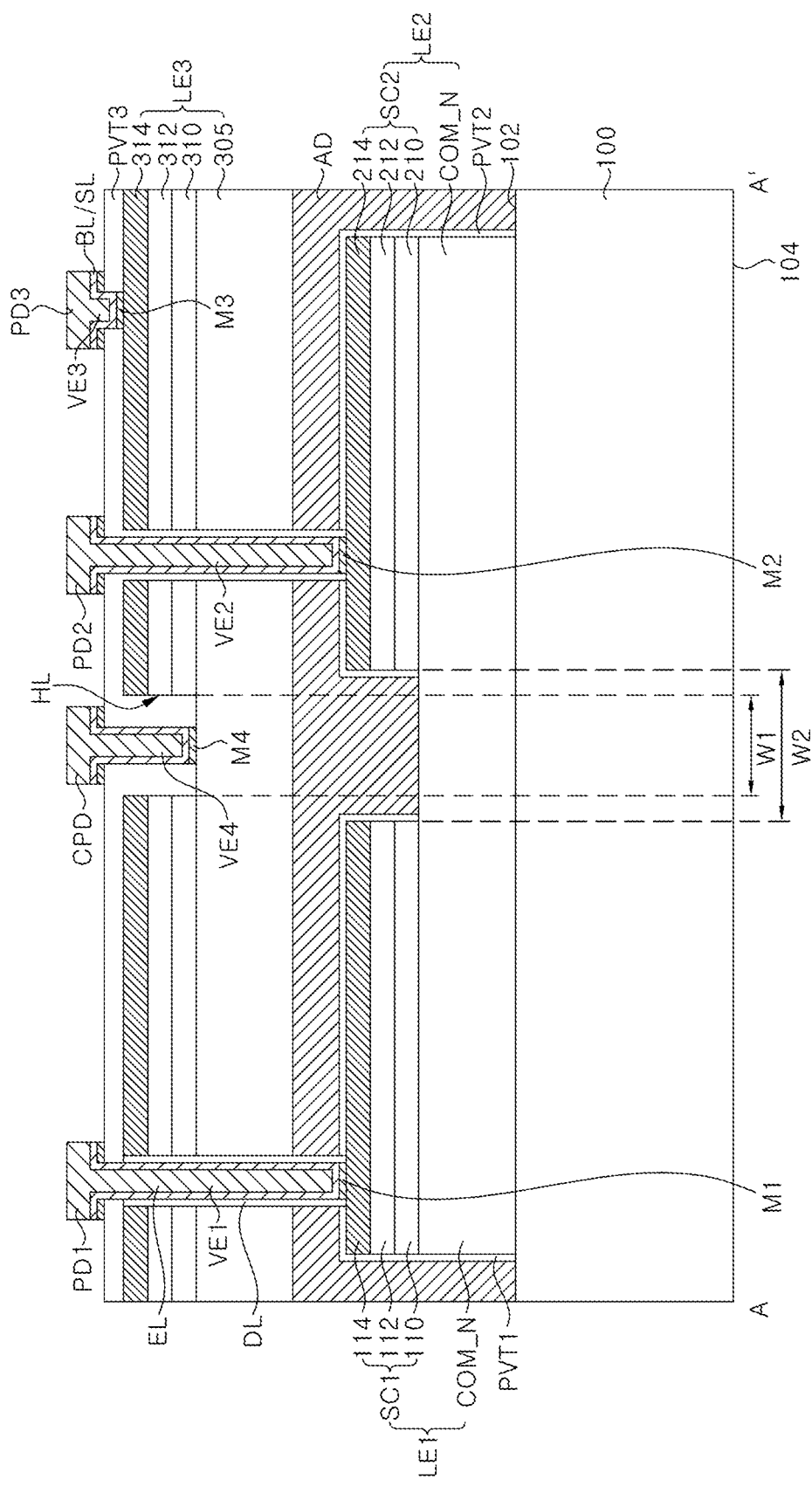
FIG. 7 is a cross-sectional view of a light emitting device according to another exemplary embodiment.

FIG. 7 is a cross-sectional of a light emitting device according to another exemplary embodiment. The top view of the light emitting device of FIG. 7 may be the same as FIG. 3A.

Referring to FIGS. 3A and 7, a light emitting device may include a substrate 100, a first light emitting part LE1 and a second light emitting part LE2 disposed on the same plane on a first surface 102 of the substrate 100, and a third light emitting part LE3 disposed over the first light emitting part LE1 and the second light emitting part LE2. A second surface 104 of the substrate 100 opposing the first surface 102 may be a light extraction surface.

The first light emitting part LE1 may include a common n-type semiconductor layer COM_N, and a first semiconductor structure SC1, which includes a first active layer 110, a first p-type semiconductor layer 112, and a first transparent electrode layer 114 vertically stacked one over another. The second light emitting part LE2 may include the common n-type semiconductor layer COM_N, and a second semiconductor structure SC2, which includes a second active layer 210, a second p-type semiconductor layer 212, and a second transparent electrode layer 214 vertically stacked one over another. The first semiconductor structure SC1 and the second semiconductor structure SC2 may be disposed on the common n-type semiconductor layer COM_N and be spaced apart from each other. In particular, the common n-type semiconductor layer COM_N may be exposed between the first semiconductor structure SC1 and the second semiconductor structure SC2.

The third light emitting part LE3 may include a third n-type semiconductor layer 305, a third active layer 310, a third p-type semiconductor layer 312, and a third transparent electrode layer 314, which are vertically stacked. According to an exemplary embodiment, the third light emitting part LE3 may include a hole HL exposing a portion of the third n-type semiconductor layer 305, which may be formed by etching portions of the third transparent electrode layer 314, the third p-type semiconductor layer 312, and the third active layer 310. The hole HL of the third light emitting part LE3 may be disposed at a position corresponding to at least a portion of the common n-type semiconductor layer COM_N exposed between the first semiconductor structure SC1 and the second semiconductor structure SC2. A width W1 of the hole HL may be less than a width W2 of the common n-type semiconductor layer COM_N exposed between the first semiconductor structure SC1 and the second semiconductor structure SC2.

The light emitting device may further include a first passivation layer PVT1, which covers the top surface and the side surface of the first semiconductor structure SC1, a second passivation layer PVT2, which covers the top surface and the side surface of the second semiconductor structure SC2, and a third passivation layer PVT3, which covers the inner sidewall of the hole HL of the third light emitting part LE3 and the top surface of the third transparent electrode layer 314. The first passivation layer PVT1, the second passivation layer PVT2, and the third passivation layer PVT3 may be an insulating material including at least one of SiNx, TiNx, TiOx, TaOx, ZrOx, HfOx, AlOx, and SiOx. By the first passivation layer PVT1, the second passivation layer PVT2, and the third passivation layer PVT3, at least portions of the common n-type semiconductor layer COM_N and the third n-type semiconductor layer 305 may be exposed.

The light emitting device may further include an adhesion part AD, which bonds the first light emitting part LE1, the second light emitting part LE2, and the third light emitting part LE3 with one another among the first light emitting part LE1, the second light emitting part LE2, and the third light emitting part LE3. For example, the adhesion part AD may be disposed to substantially fill between the first semiconductor structure SC1 and the second semiconductor structure SC2 disposed on the common n-type semiconductor layer COM_N, and substantially fill between the first and second semiconductor structures SC1 and SC2 and the third light emitting part LE3. According to an exemplary embodiment, the adhesion part AD may substantially fill the inside of the hole HL of the third light emitting part LE3.

According to an exemplary embodiment, the adhesion part AD may include a material, which is transparent and has an electrical conductivity and a bonding property. For example, the adhesion part AD may include a material, such as TCO, ICA, ACA, or others.

The light emitting device may further include a dielectric layer DL, which surrounds the outer sidewall of each of the first through electrode VE1 and the second through electrode VE2. According to an exemplary embodiment, the dielectric layer DL may not be disposed on the outer sidewall of each of the third through electrode VE3 and the fourth through electrode VE4.

According to an exemplary embodiment, the third through electrode VE3 may pass through the third passivation layer PVT3 and be brought into electrical contact with the third transparent electrode layer 314. Since the third through electrode VE3 is insulated by the third passivation layer PVT3, the outer sidewall of the third through electrode VE3 may not need to be additionally surrounded by the dielectric layer DL.

According to an exemplary embodiment, the fourth through electrode VE4 may pass through the third passivation layer PVT3 substantially filling the hole HL of the third light emitting part LE3, the third n-type semiconductor layer 305, and the adhesion part AD. Since the fourth through electrode VE4 passes through the hole HL substantially filled with the third passivation layer PVT3, the outer sidewall of the fourth through electrode VE4 may not need to be surrounded by the dielectric layer DL. Further, since the dielectric layer DL does not surround the outer sidewall of the fourth through electrode VE4, the outer sidewall of the fourth through electrode VE4 may be brought into electrical contact with the third n-type semiconductor layer 305. The fourth through electrode VE4 may be brought into electrical contact with the adhesion part AD, which includes a material having an electrical conductivity. The adhesion part AD may be brought into electrical contact with the common n-type semiconductor layer COM_N exposed between the first semiconductor structure SC1 and the second semiconductor structure SC2. In this manner, the common pad CPD may be electrically coupled with the third n-type semiconductor layer 305, the adhesion part AD, and the common n-type semiconductor layer COM_N through the fourth through electrode VE4.

Since the light emitting device of FIG. 7 is substantially similar as those of FIGS. 1A, 1B, 3A, 3B, 4, 5A, 5B, and 6, repeated descriptions of substantially similar elements and characteristics thereof will be omitted to avoid redundancy.

Figure 8A:
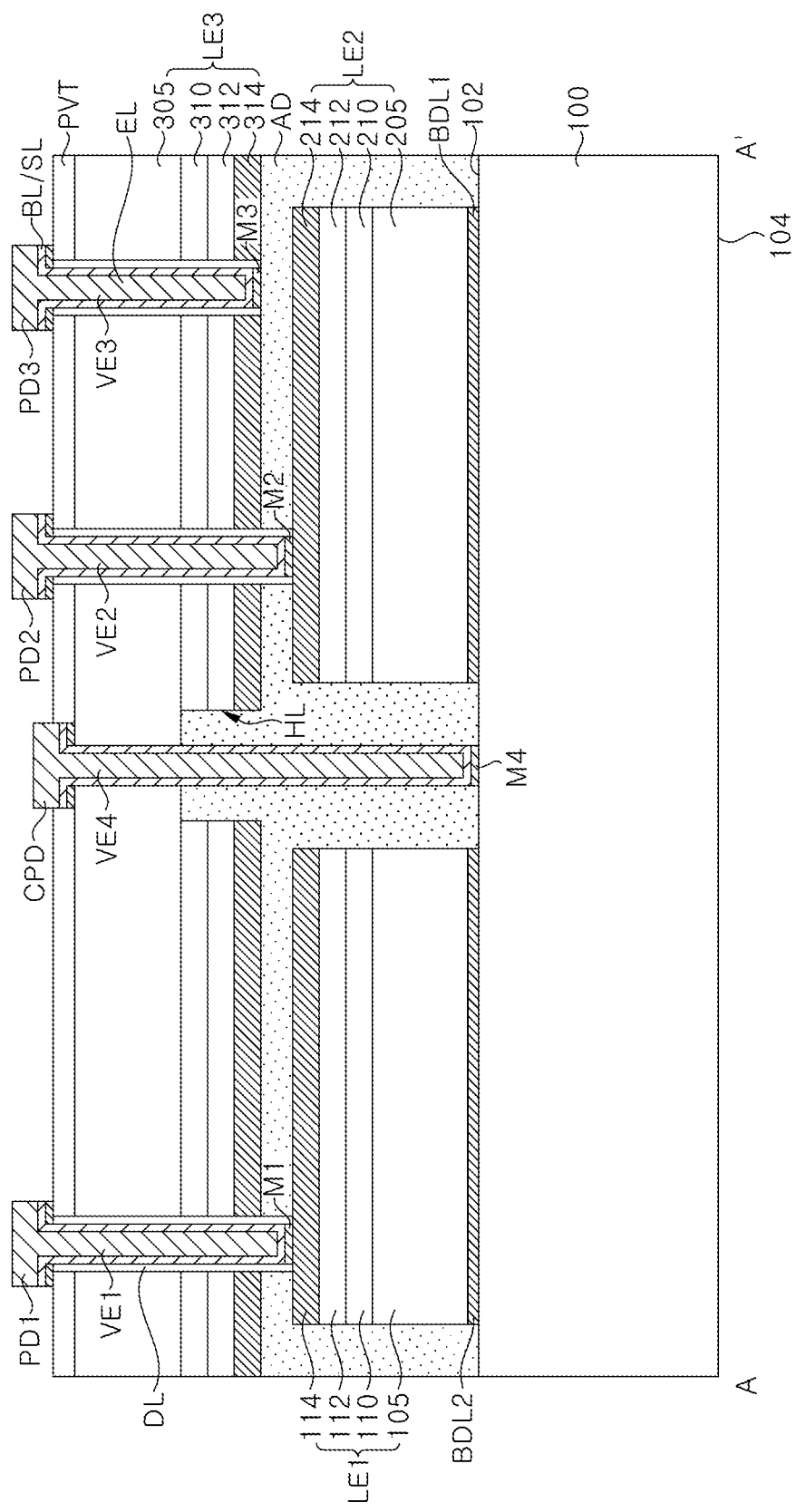
FIGS. 8A and 8B are cross-sectional views of light emitting devices according to another exemplary embodiments.
Figure 8B:
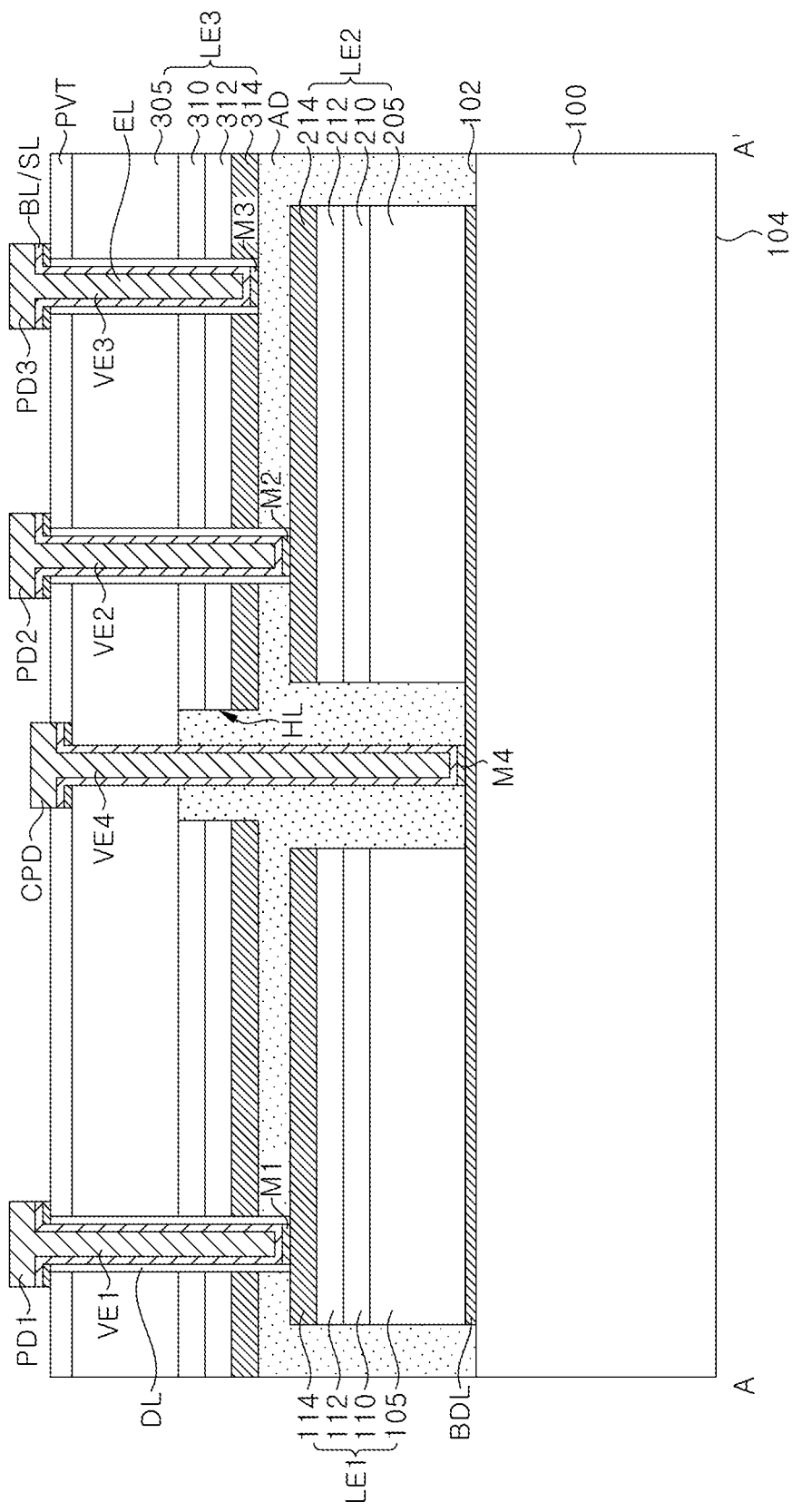

FIGS. 8A and 8B are cross-sectional views of light emitting devices according to exemplary embodiments. The top views of the light emitting devices of FIGS. 8A and 8B may be the same as FIG. 3A.

Referring to FIGS. 3A, 8A and 8B, a light emitting device may include a substrate 100, a first light emitting part LE1 and a second light emitting part LE2 disposed on the same plane on a first surface 102 of the substrate 100, and a third light emitting part LE3 disposed over the first light emitting part LE1 and the second light emitting part LE2. A second surface 104 of the substrate 100 opposing the first surface 102 may be a light extraction surface.

The first light emitting part LE1 may include a first n-type semiconductor layer 105, a first active layer 110, a first p-type semiconductor layer 112, and a first transparent electrode layer 114, which are vertically stacked. The second light emitting part LE2 may include a second n-type semiconductor layer 205, a second active layer 210, a second p-type semiconductor layer 212, and a second transparent electrode layer 214, which are vertically stacked. The third light emitting part LE3 may include a third transparent electrode layer 314, a third p-type semiconductor layer 312, a third active layer 310, and a third n-type semiconductor layer 305, which are vertically stacked.

Referring to FIG. 8A, according to an exemplary embodiment, the substrate 100 may conductive and include Si, SiC, or others, without being limited thereto. The first light emitting part LE1 and the second light emitting part may be separated from each other, and a portion of the substrate 100 may be exposed by the first light emitting part LE1 and the second light emitting part LE2. The first light emitting part LE1 may be bonded to a first surface 102 of the substrate 100 by a first bonding layer BDL1. The second light emitting part LE2 may be bonded to the first surface 102 of the substrate 100 by a second bonding layer BDL2, while being separated from the first light emitting part LE1. For example, each of the first bonding layer BDL1 and the second bonding layer BDL2 may include a conductive material such as a solder or metallic bonding material, for example, Au, AuSn, CuSn or others, TCO, ICA, or ACA. The first n-type semiconductor layer 105 of the first light emitting part LE1 may be electrically coupled with the substrate 100 by the first bonding layer BDL1, and the second n-type semiconductor layer 205 of the second light emitting part LE2 may be electrically coupled with the substrate 100 by the second bonding layer BDL2. Accordingly, the substrate 100, the first n-type semiconductor layer 105, and the second n-type semiconductor layer 205 may be electrically coupled with one another.

Referring to FIG. 8B, according to another exemplary embodiment, the substrate 100 may be a nonconductive substrate. The first light emitting part LE1 and the second light emitting part LE2 may be spaced apart from each other, and a bonding layer BDL may be disposed between the first and second light emitting parts LE1 and LE2 and the first surface 102 of the substrate 100. By the bonding layer BDL, the first light emitting part LE1 and the second light emitting part LE2 may be bonded to the first surface 102 of the substrate 100, while being spaced apart from each other. For example, the bonding layer BDL may include a metal pattern and a conductive material, such as a solder or metallic bonding material, for example, Au, AuSn, CuSn or others, TCO, ICA, or ACA. The bonding layer BDL may be electrically coupled with the first n-type semiconductor layer 105 of the first light emitting part LE1, and may be electrically coupled with the second n-type semiconductor layer 205 of the second light emitting part LE2. The bonding layer BDL may extend between the first light emitting part LE1 and the second light emitting part LE2. Accordingly, the bonding layer BDL, the first n-type semiconductor layer 105, and the second n-type semiconductor layer 205 may be electrically coupled with one another.

Referring to FIGS. 8A and 8B, the third light emitting part LE3 may include a hole HL exposing a portion of the third n-type semiconductor layer 305, which may be formed by etching portions of the third transparent electrode layer 314, the third p-type semiconductor layer 312, and the third active layer 310. In FIG. 8A, the hole HL of the third light emitting part LE3 may be disposed at a position corresponding to at least a portion of the substrate 100 exposed between the first light emitting part LE1 and the second light emitting part LE2. A width of the hole HL may be less than a width of the substrate 100 exposed between the first light emitting part LE1 and the second light emitting part LE2. In FIG. 8B, the hole HL of the third light emitting part LE3 may be disposed at a position corresponding to at least a portion of the bonding layer BDL exposed between the first light emitting part LE1 and the second light emitting part LE2. A width of the hole HL may be less than a width of the bonding layer BDL exposed between the first light emitting part LE1 and the second light emitting part LE2.

The light emitting device may further include an adhesion part AD, which bonds the first light emitting part LE1, the second light emitting part LE2, and the third light emitting part LE3 with one another among the first light emitting part LE1, the second light emitting part LE2, and the third light emitting part LE3. For example, the adhesion part AD may be disposed to substantially fill between the first light emitting part LE1 and the second light emitting part LE2 disposed on the substrate 100, and substantially fill between the first and second light emitting parts LE1 and LE2 and the third light emitting part LE3. For example, the adhesion part AD may include a material, such as SOG, BCB, HSQ, or an SU-8 photoresist, which is transparent and has a bonding property. According to an exemplary embodiment, the adhesion part AD may substantially fill the hole HL of the third light emitting part LE3.

The light emitting device may further include a first through electrode VE1 and a first pad PD1, which are electrically coupled with the first transparent electrode layer 114, a second through electrode VE2 and a second pad PD2, which are electrically coupled with the second transparent electrode layer 214, and a third through electrode VE3 and a third pad PD3, which are electrically coupled with the third transparent electrode layer 314. Referring to FIG. 8A, the light emitting device according to an exemplary embodiment may further include a fourth through electrode VE4 and a common pad CPD, which electrically couple the third n-type semiconductor layer 305 and the substrate 100, thereby being electrically coupled with the first n-type semiconductor layer 105, the second n-type semiconductor layer 205, and the third n-type semiconductor layer 305. Referring to FIG. 8B, the light emitting device according to another exemplary embodiment may further include a fourth through electrode VE4 and a common pad CPD, which electrically couple the third n-type semiconductor layer 305 and the bonding layer BDL, thereby being electrically coupled with the first n-type semiconductor layer 105, the second n-type semiconductor layer 205, and the third n-type semiconductor layer 305.

The light emitting device may further include a passivation layer PVT disposed on the third n-type semiconductor layer 305, and a dielectric layer DL surrounding the outer sidewall of each of the first through electrode VE1, the second through electrode VE2, and the third through electrode VE3.

According to an exemplary embodiment, the common pad CPD may pass through the passivation layer PVT and be brought into electrical contact with the third n-type semiconductor layer 305. More particularly, the fourth through electrode VE4 electrically coupled with the common pad CPD may pass through the third n-type semiconductor layer 305 and be disposed in the hole HL of the third light emitting part LE3. In this case, although the dielectric layer DL is not disposed on the outer sidewall of the fourth through electrode VE4, since the adhesion part AD including an insulating material is disposed in the hole HL of the third light emitting part LE3, the fourth through electrode VE4 may be insulated from the third active layer 310, the third p-type semiconductor layer 312, and the third transparent electrode layer 314 of the third light emitting part LE3. Also, as the adhesion part AD is filled between the first light emitting part LE1 and the second light emitting part LE2, the fourth through electrode VE4 brought into electrical contact with the substrate 100 or the bonding layer BDL may be insulated from the side surface of the first light emitting part LE1 and the side surface of the second light emitting part LE2.

Since the light emitting devices of FIGS. 8A and 8B are substantially similar as those of FIGS. 1A, 1B, 3A, 3B, 4, 5A, 5B, 6, and 7, repeated descriptions of substantially similar elements and characteristics thereof will be omitted to avoid redundancy.

Hereinafter, a method for manufacturing a light emitting device according to an exemplary embodiment will be described. In particular, the light emitting device will be described with reference to FIGS. 1A and 1D.

FIGS. 9A to 26A are top views illustrating a method for manufacturing a light emitting device according to an exemplary embodiment, and FIGS. 9B to 26B are cross-sectional views taken along lines A-A' of corresponding FIGS. 9A to 26A.

Figure 9A:
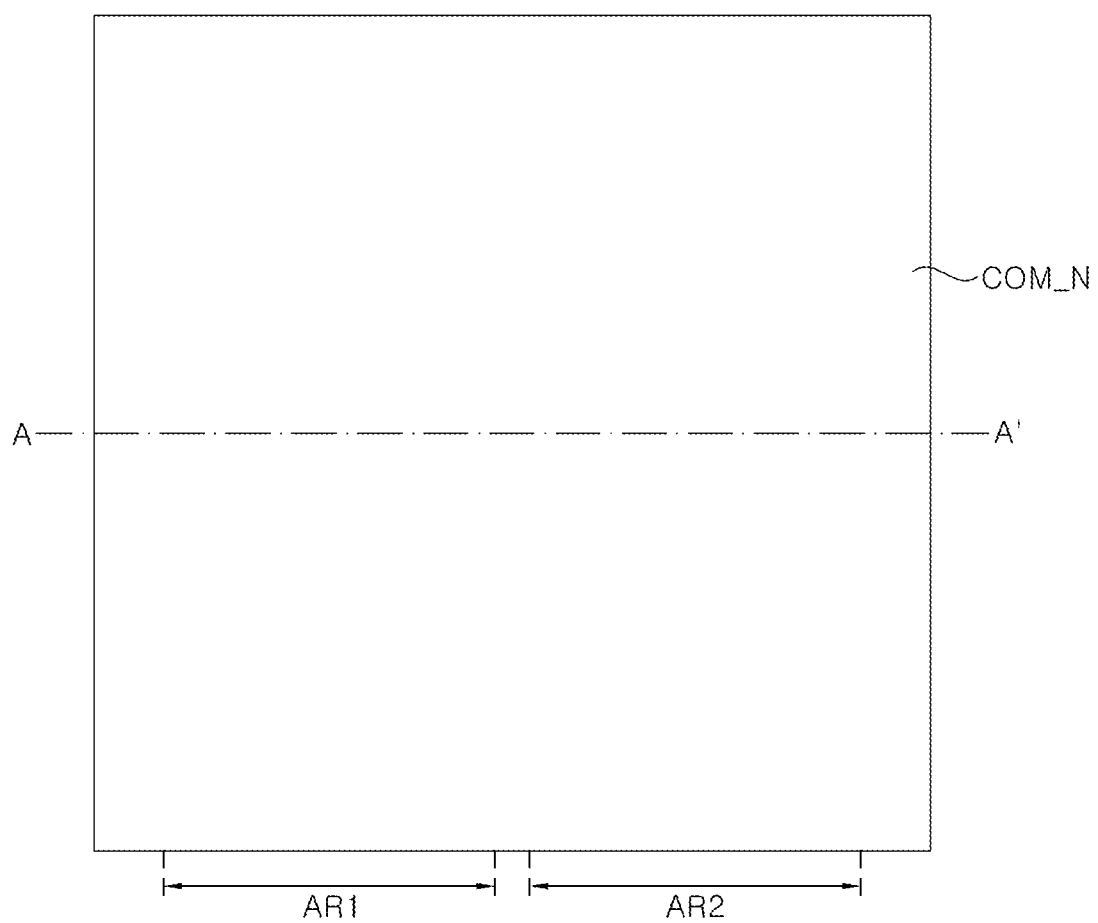
FIGS. 9A, 10A, 11A, 12A, 13A, 14A, 15A, 16A, 17A, 18A, 19A, 20A, 21A, 22A, 23A, 24A, 25A, and 26A are schematic top views illustrating a method for manufacturing a light emitting device according to an exemplary embodiment.
Figure 9B:
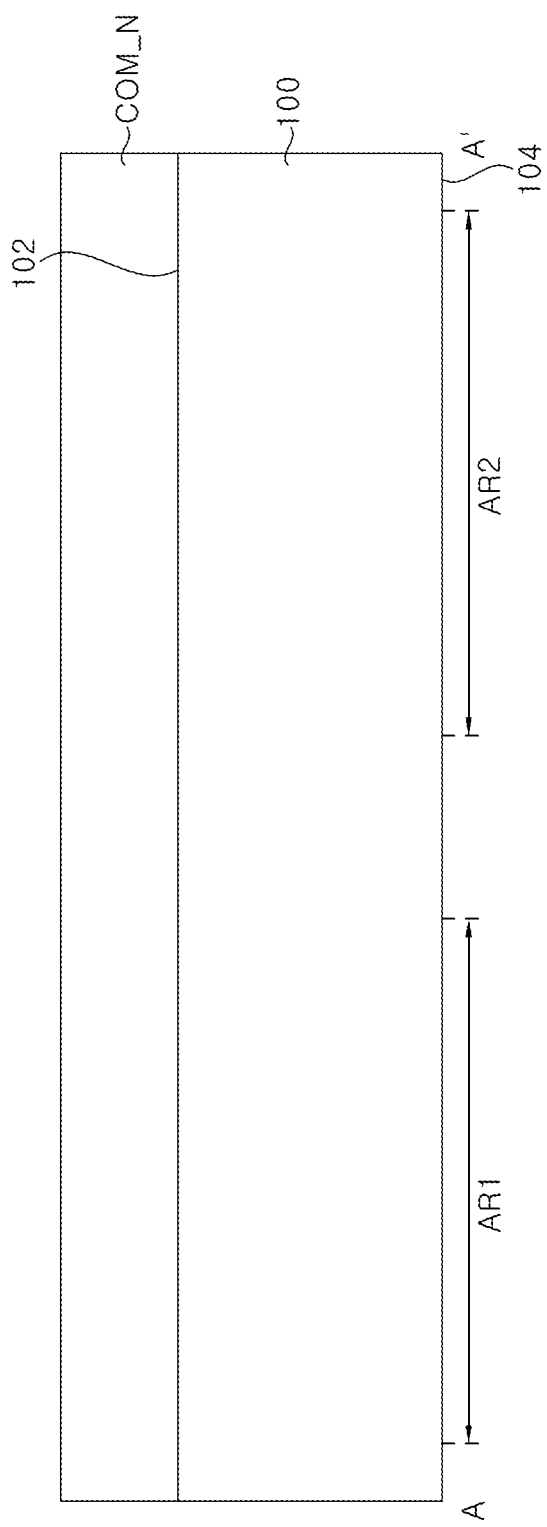
FIGS. 9B, 10B, 11B, 12B, 13B, 14B, 15B, 16B, 17B, 18B, 19B, 20B, 21B, 22B, 23B, 24B, 25B, and 26B are cross-sectional views taken along line A-A' of a corresponding top view shown in FIGS. 9A to 26A, respectively.

Referring to FIGS. 9A and 9B, a common n-type semiconductor layer COM_N may be grown on a first substrate 100.

The first substrate 100 may include a first area AR1, in which a first light emitting part LE1 is to be disposed and a second area AR2, in which a second light emitting part LE2 is to be disposed.

The common n-type semiconductor layer COM_N may be formed by using a growing method, such as metal organic chemical vapor deposition (MOCVD), molecular beam epitaxy (MBE), hydride vapor phase epitaxy (HVPE), and metal-organic chloride (MOC).

Figure 10A:
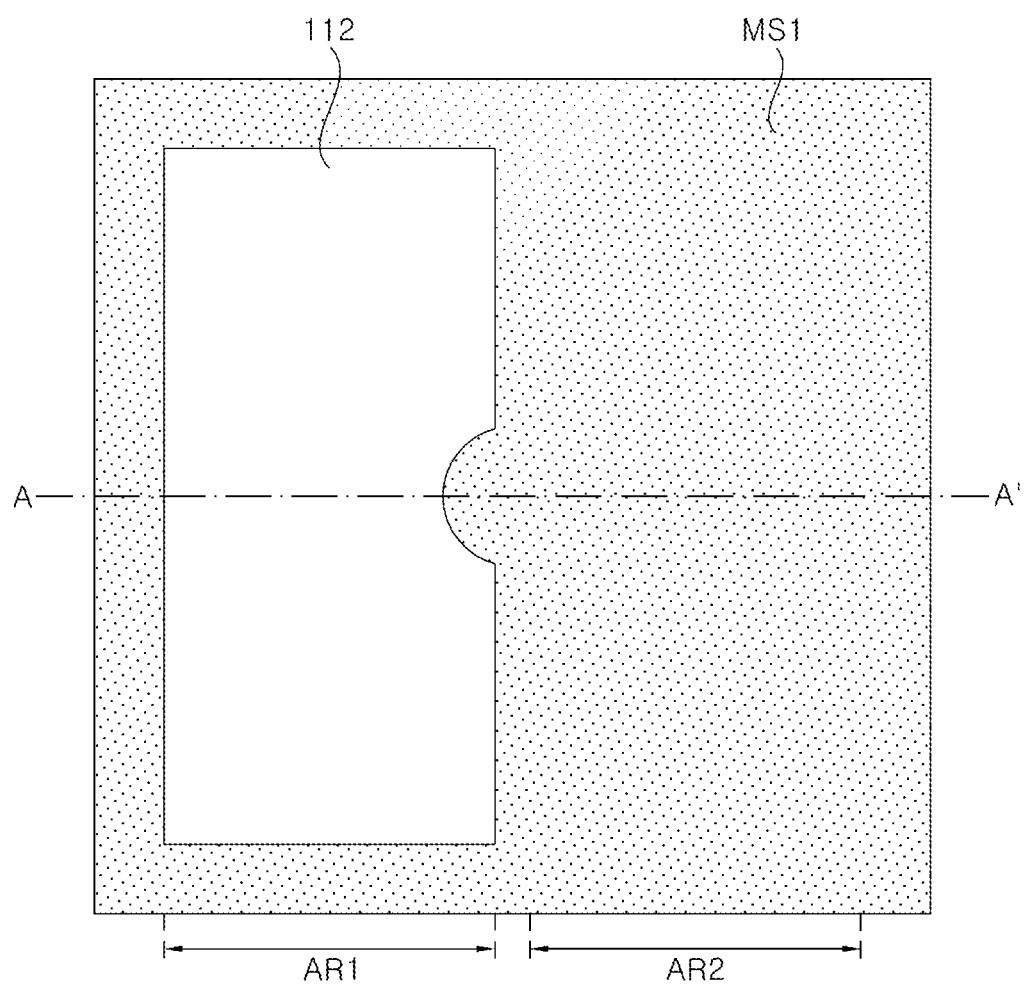
Figure 10B:
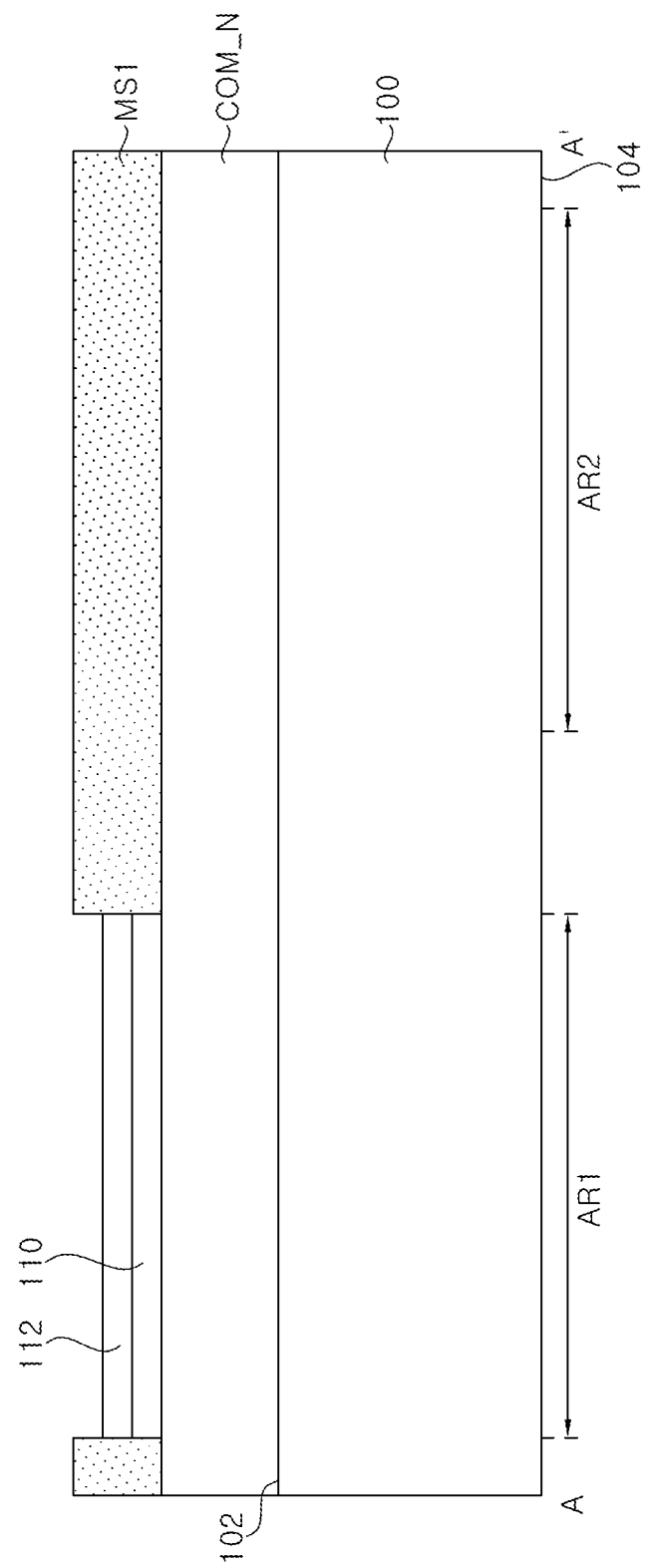

Referring to FIGS. 10A and 10B, a first mask pattern MS1 may be formed on the common n-type semiconductor layer COM_N to expose the first area AR1 of the first substrate 100, and a first active layer 110 and a first p-type semiconductor layer 112 may be sequentially grown on the first area AR1. For example, the first mask pattern MS1 may include SiOx or SiNx.

The first active layer 110 and the first p-type semiconductor layer 112 may be formed by using a growing method, such as MOCVD, MBE, HVPE, and MOC.

After forming the first active layer 110 and the first p-type semiconductor layer 112, the first mask pattern MS1 may be removed.

Figure 11A:
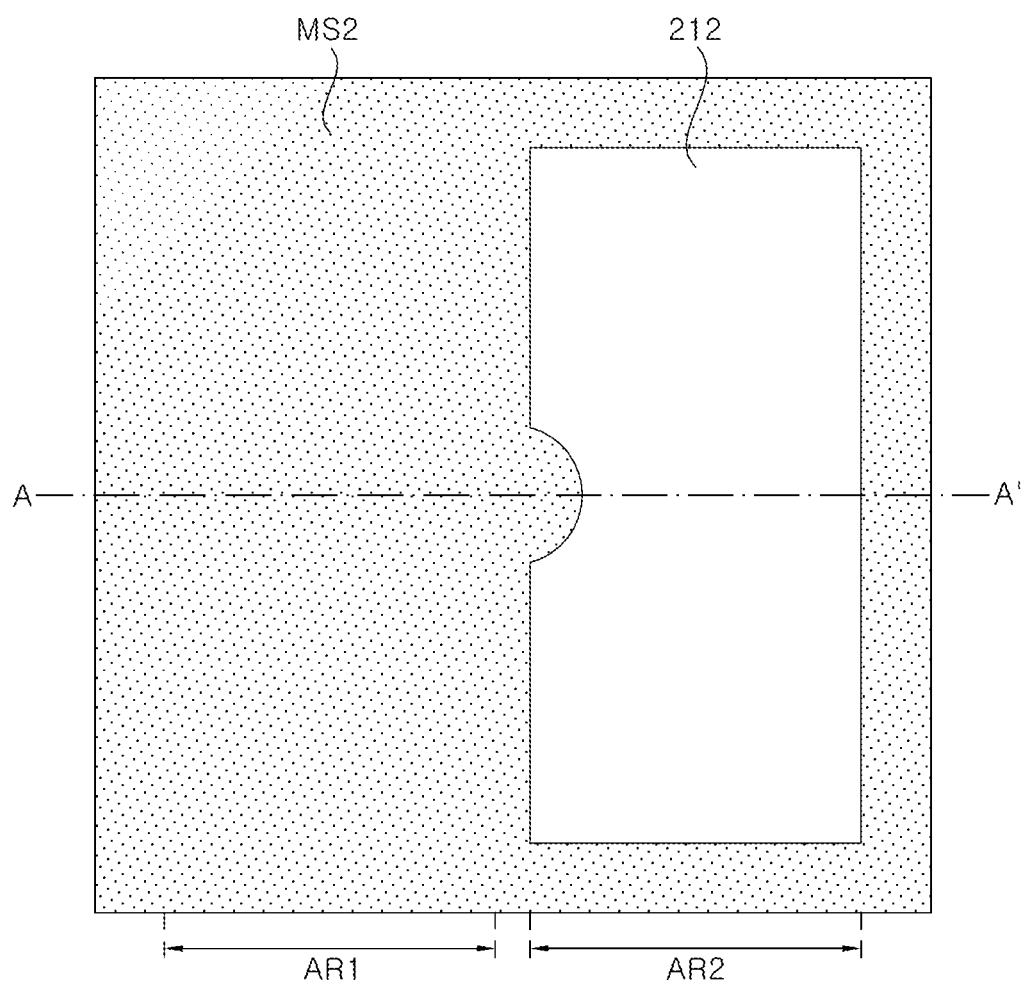
Figure 11B:
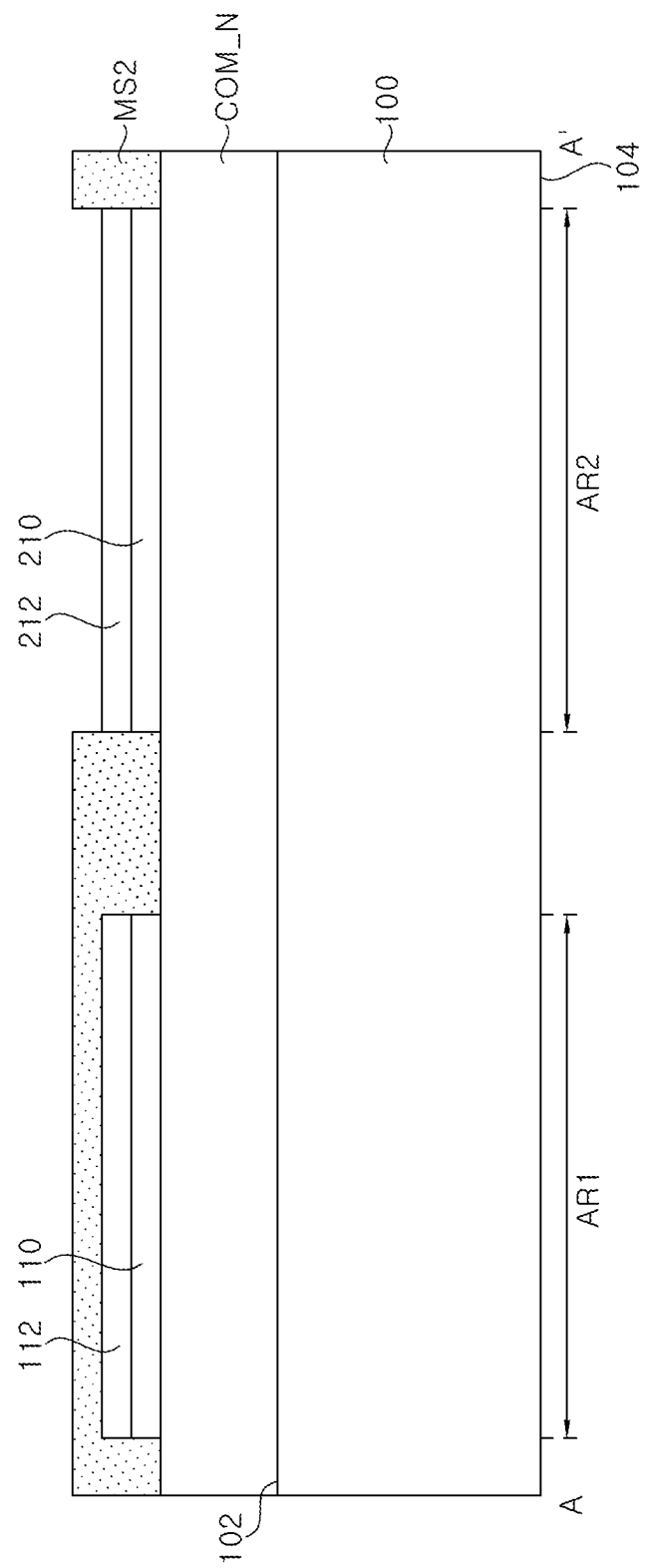

Referring to FIGS. 11A and 11B, a second mask pattern MS2 may be formed on the common n-type semiconductor layer COM_N to expose the second area AR2 of the first substrate 100, and a second active layer 210 and a second p-type semiconductor layer 212 may be sequentially grown on the second area AR2. For example, the second mask pattern MS2 may include SiOx or SiNx.

The second active layer 210 and the second p-type semiconductor layer 212 may be formed by using a growing method, such as MOCVD, MBE, HVPE, and MOC.

After forming the second active layer 210 and the second p-type semiconductor layer 212, the second mask pattern MS2 may be removed.

Figure 12A:
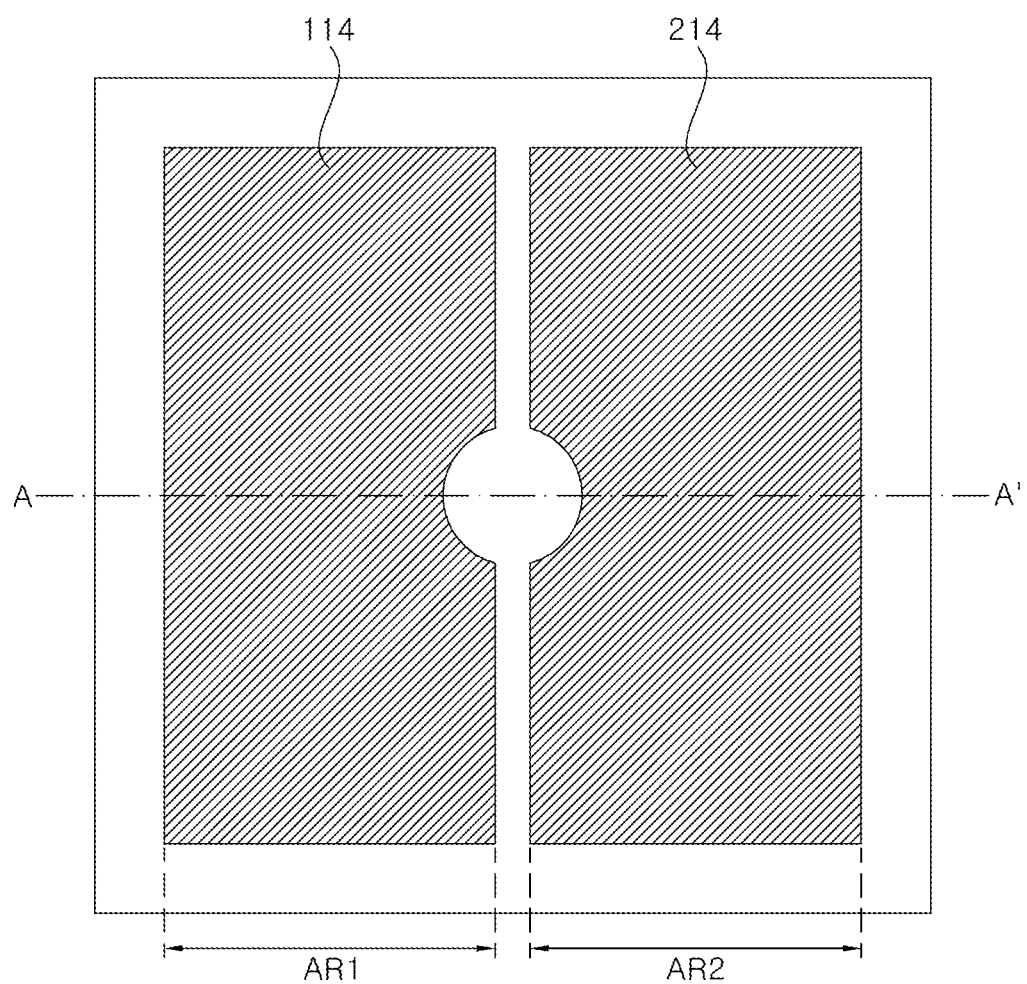
Figure 12B:
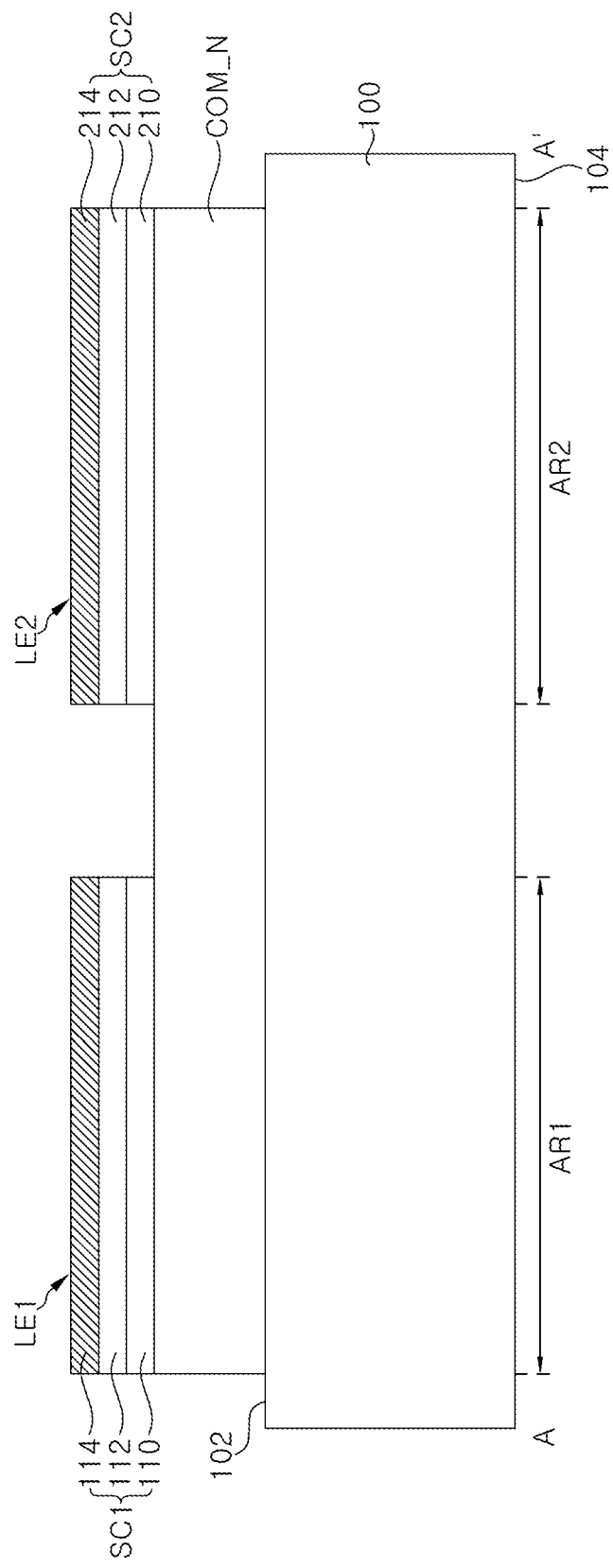

Referring to FIGS. 12A and 12B, a first transparent electrode layer 114 and a second transparent electrode layer 214 may be formed on the first p-type semiconductor layer 112 and the second p-type semiconductor layer 212, respectively.

For example, a transparent electrode material layer may be formed on the first substrate 100, which is formed with the first p-type semiconductor layer 112 and the second p-type semiconductor layer 212, by using a deposition process generally known in the art, for example, a chemical vapor deposition (CVD) or a physical vapor deposition (PVD) process. A third mask pattern may be formed on the transparent electrode material layer, and, by etching the transparent electrode material layer by using the third mask pattern as an etch mask, the first transparent electrode layer 114 and the second transparent electrode layer 214 may be respectively formed. After forming the first transparent electrode layer 114 and the second transparent electrode layer 214, the third mask pattern may be removed.

In this manner, a first semiconductor structure SC1 including the first active layer 110, the first p-type semiconductor layer 112, and the first transparent electrode layer 114, and a second semiconductor structure SC2 including the second active layer 210, the second p-type semiconductor layer 212, and the second transparent electrode layer 214 may be respectively formed on the common n-type semiconductor layer COM_N.

As such, the first light emitting part LE1 including the common n-type semiconductor layer COM_N and the first semiconductor structure SC1 and the second light emitting part LE2 including the common n-type semiconductor layer COM_N and the second semiconductor structure SC2 may be respectively formed on the first substrate 100.

Figure 13A:
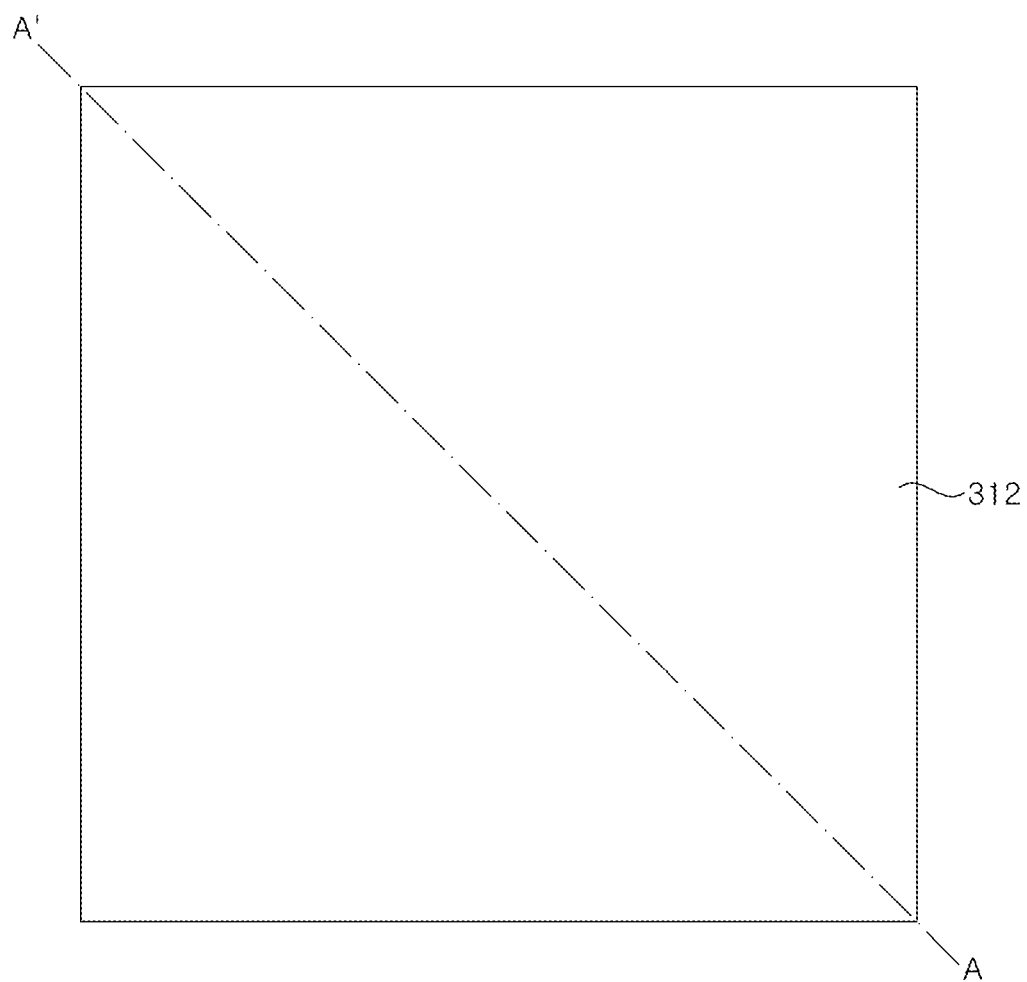
Figure 13B:
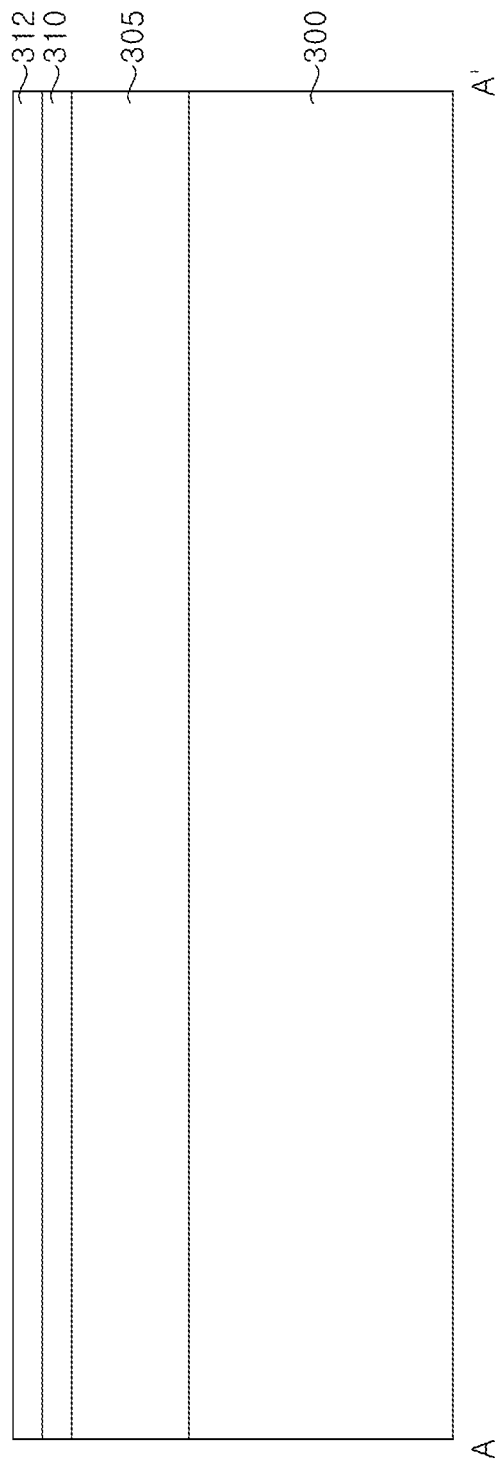

Referring to FIGS. 13A and 13B, a third n-type semiconductor layer 305, a third active layer 310, and a third p-type semiconductor layer 312 may be formed on a second substrate 300 by using a growing method, such as MOCVD, MBE, HVPE, and MOC.

Figure 14A:
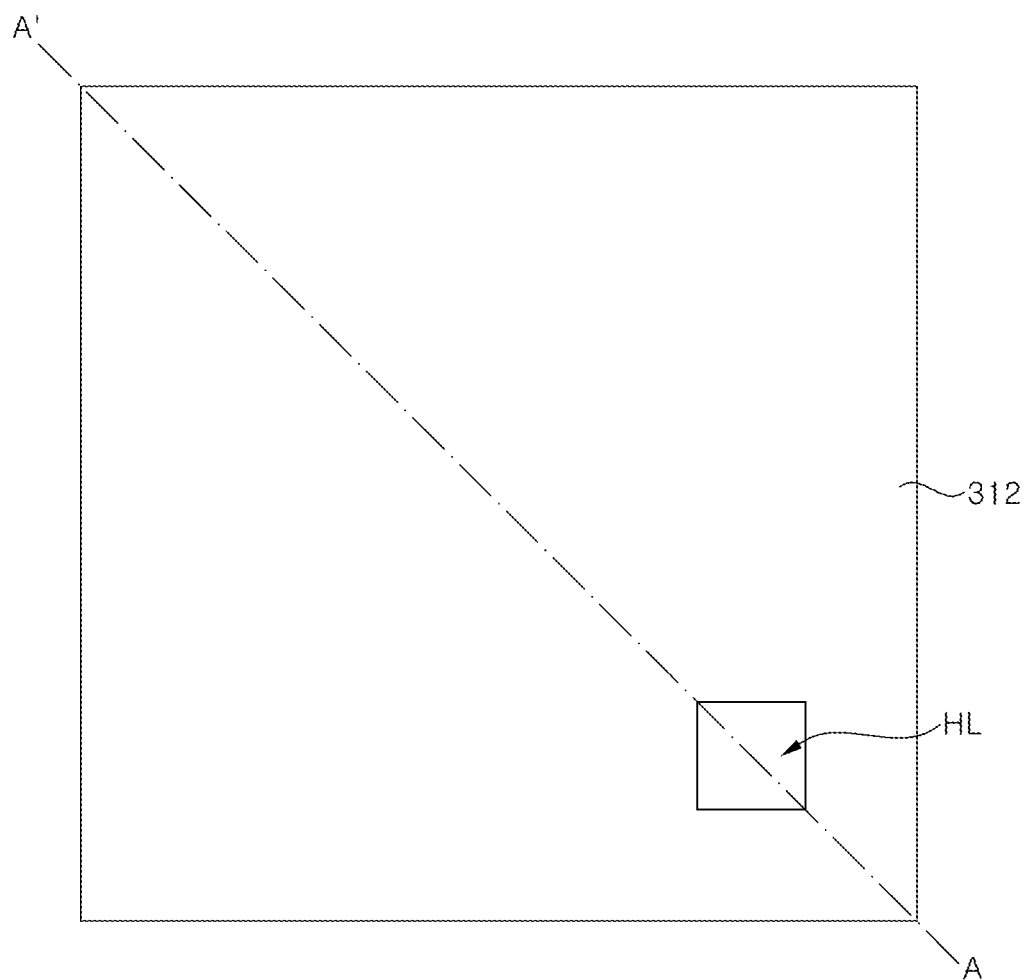
Figure 14B:
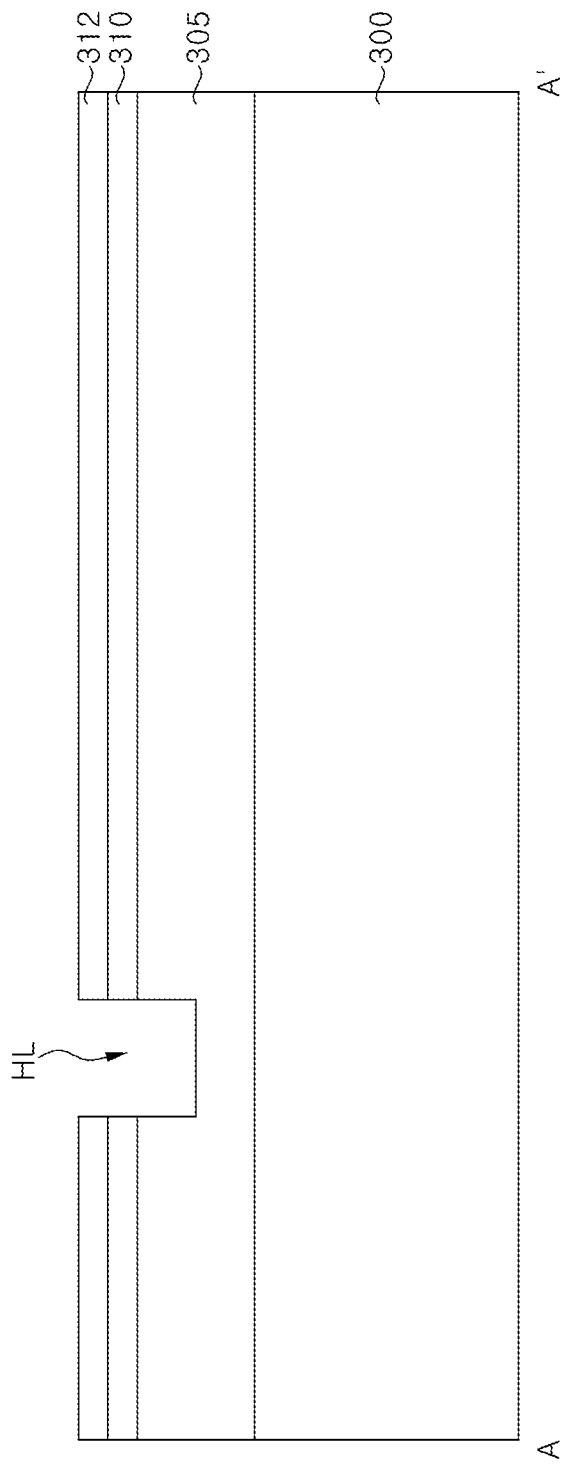

Referring to FIGS. 14A and 14B, by etching the third p-type semiconductor layer 312 and the third active layer 310, a hole HL exposing the third n-type semiconductor layer 305 may be formed. For example, during an etching process, a portion of the third n-type semiconductor layer 305 may be etched.

Figure 15A:
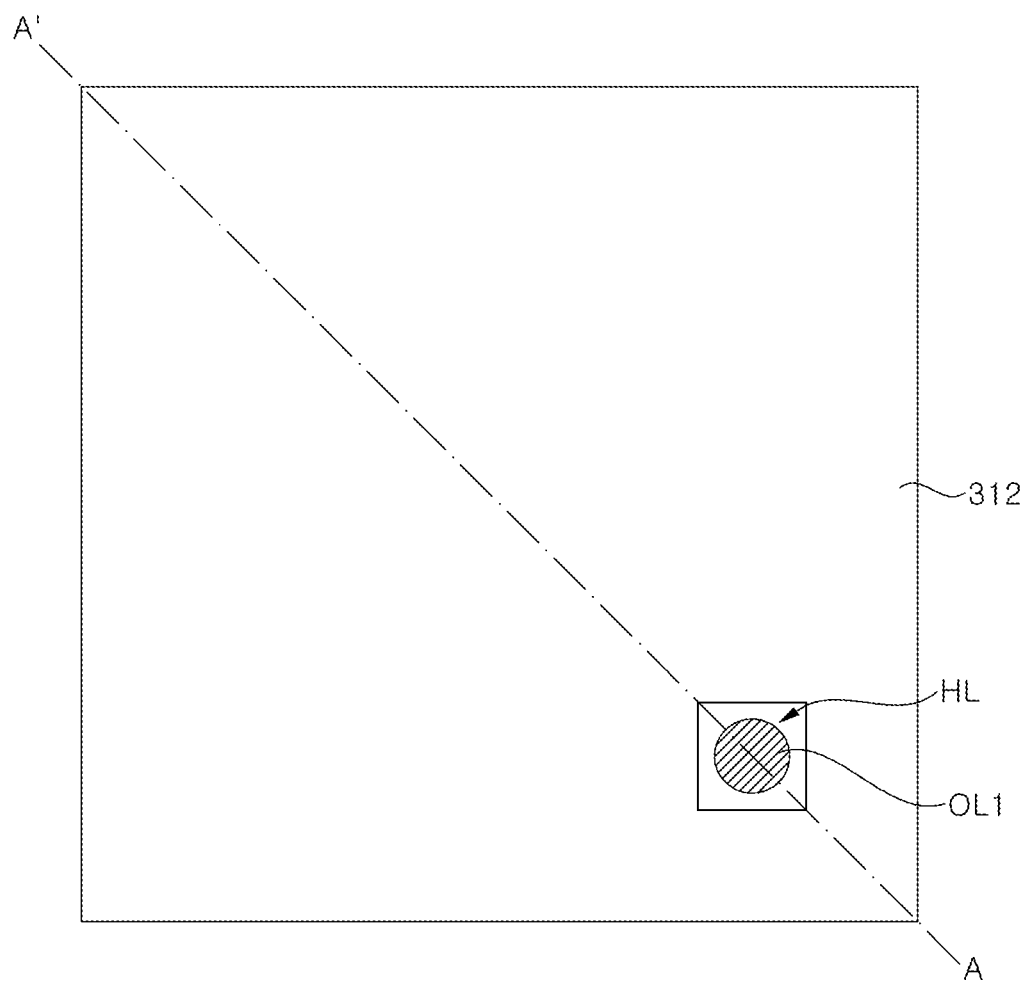
Figure 15B:
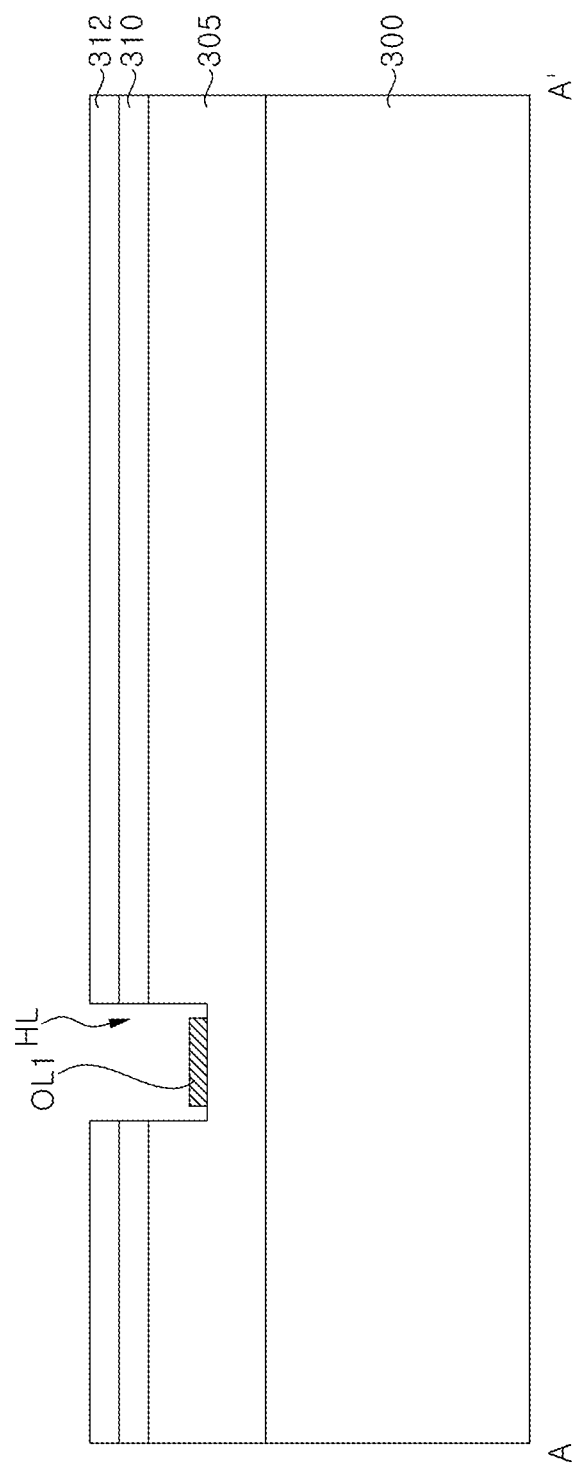

Referring to FIGS. 15A and 15B, a first ohmic pattern OL1 may be formed in the hole HL.

For example, a first ohmic layer may be conformally formed on the third p-type semiconductor layer 312, the third active layer 310, and the third n-type semiconductor layer 305, which are formed with the hole HL. For example, the first ohmic layer may include an Au/Be alloy. By etching the first ohmic layer, such that the first ohmic layer is brought into electrical contact with the third n-type semiconductor layer 305 in the hole HL, the first ohmic pattern OL1 may be formed. After forming the first ohmic pattern OL1, annealing of 400° C. or higher may be performed.

According to an exemplary embodiment, the first ohmic pattern OL1 may be formed to be separated from the third active layer 310 and the third p-type semiconductor layer 312, which form the inner sidewall of the hole HL.

Figure 16A:
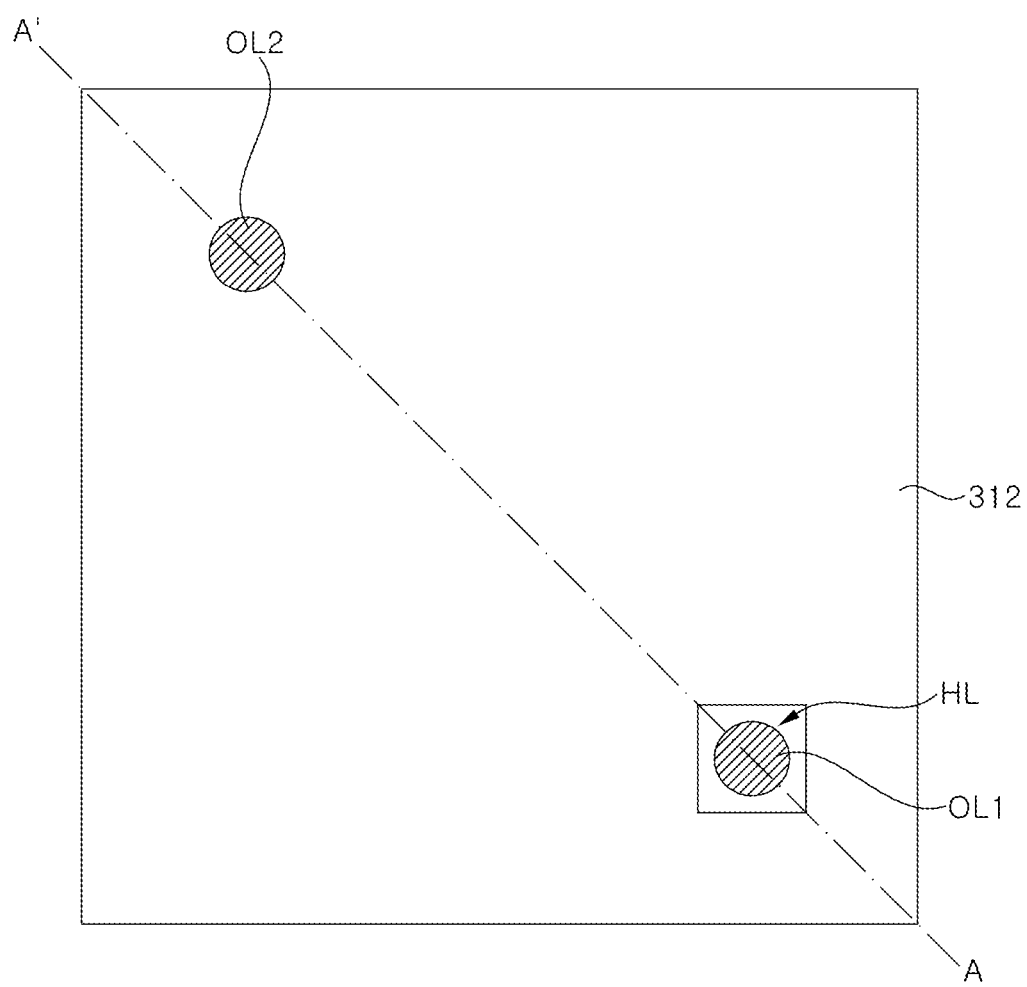
Figure 16B:
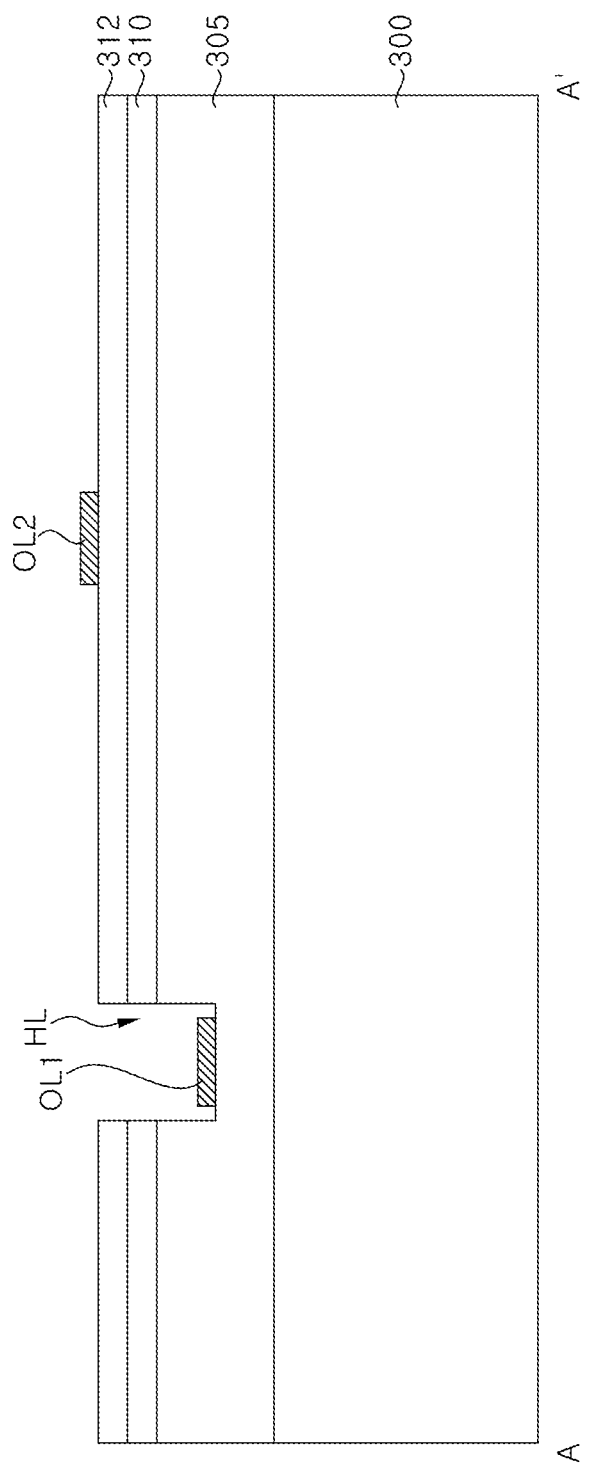

Referring to FIGS. 16A and 16B, a second ohmic pattern OL2 may be formed on the third p-type semiconductor layer 312.

For example, a second ohmic layer may be conformally formed on the third p-type semiconductor layer 312. For example, the second ohmic layer may include an Au/Ge alloy. By etching the second ohmic layer, the second ohmic pattern OL2 may be formed on the third p-type semiconductor layer 312. After forming the second ohmic pattern OL2, annealing of 400° C. or higher may be performed.

In this manner, a third light emitting part LE3 including the third n-type semiconductor layer 305, the third active layer 310, the third p-type semiconductor layer 312, the first ohmic pattern OL1, and the second ohmic pattern OL2 may be formed.

Figure 17A:
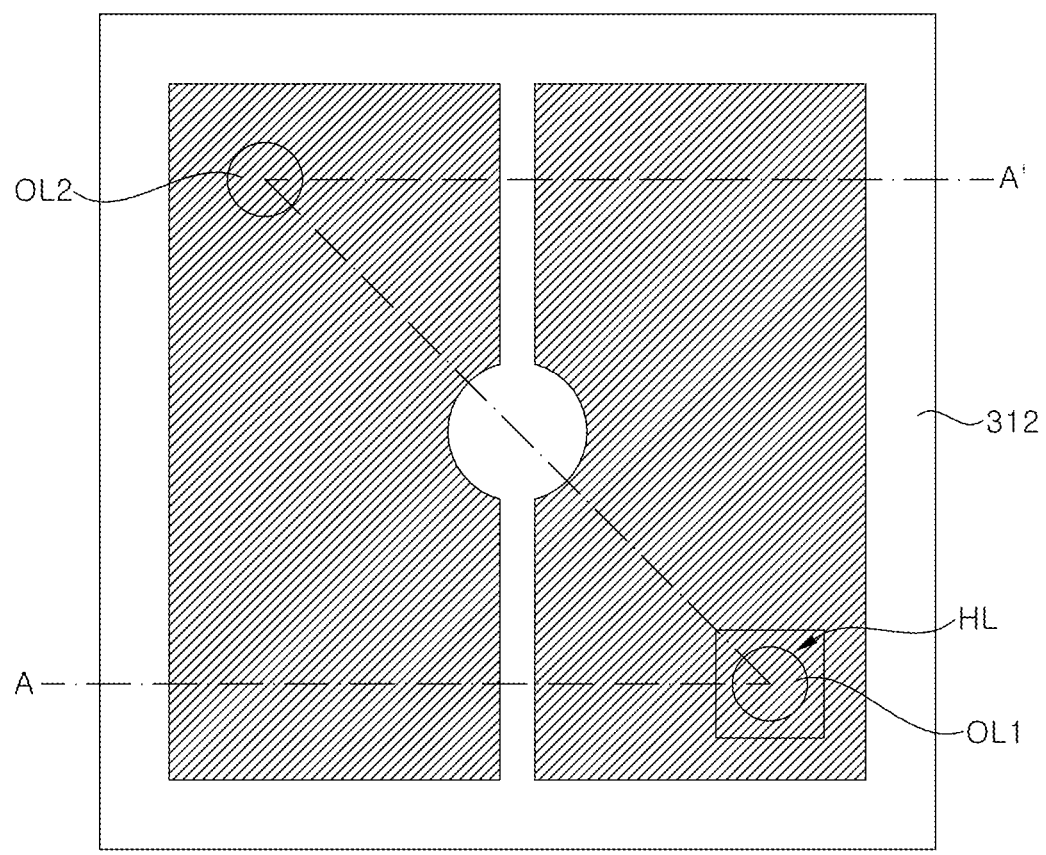
Figure 17B:
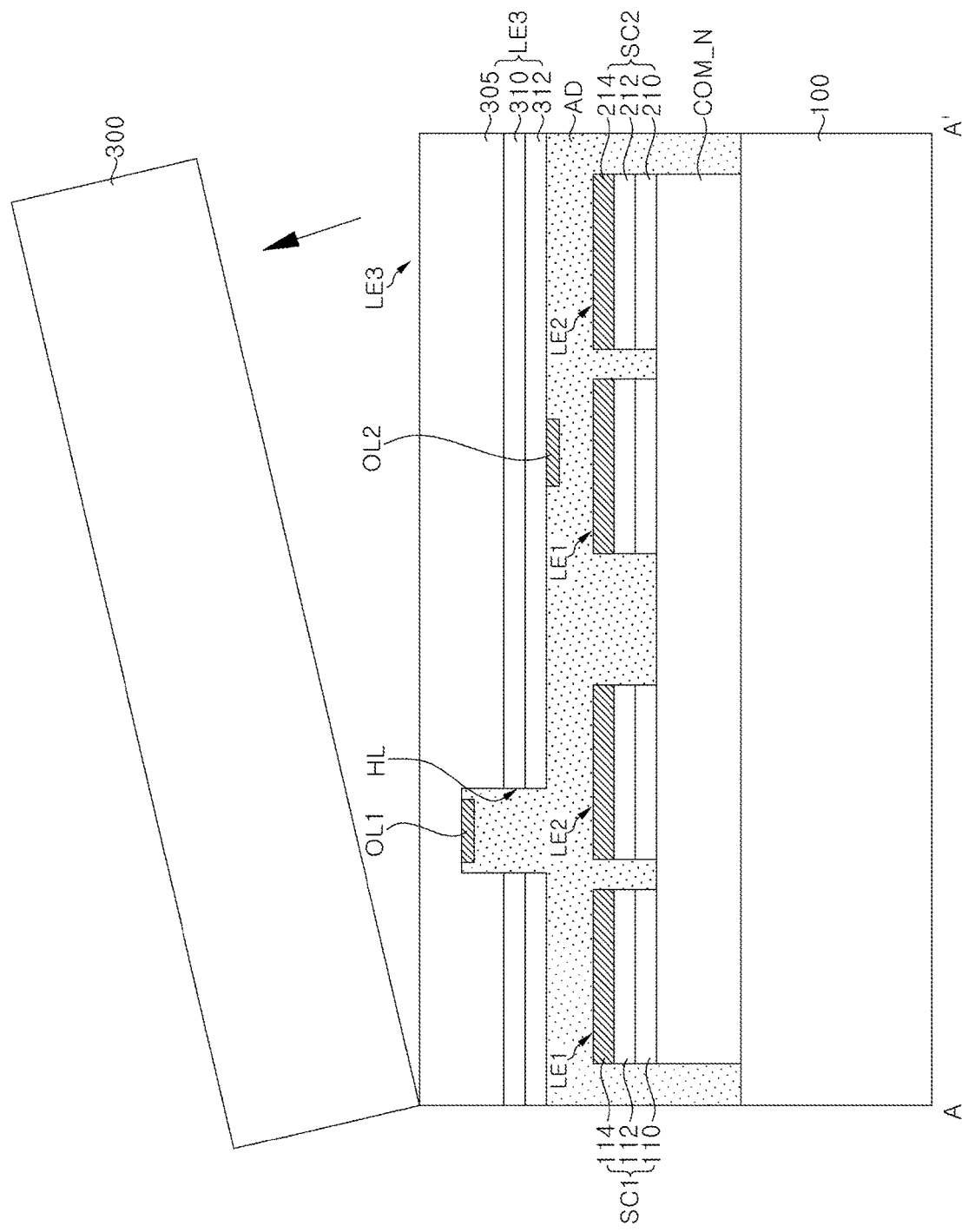

Referring to FIGS. 17A and 17B, by turning over the second substrate 300, the first ohmic pattern OL1 and the second ohmic pattern OL2 may be disposed to face the first transparent electrode layer 114 and the second transparent electrode layer 214 of the first substrate 100.

After applying an adhesion part AD on the first substrate 100 and placing the second substrate 300, by performing thermal treatment, the first light emitting part LE1 and the second light emitting part LE2 disposed on the first substrate 100 and the third light emitting part LE3 disposed on the second substrate 300 may be bonded with each other. The adhesion part AD may include a material, which is transparent and has a bonding property, such as SOG, BCB, HSQ, or an SU-8 photoresist.

Then, the second substrate 300 may be removed through a laser lift-off (LLO) process, or the like.

Figure 18A:
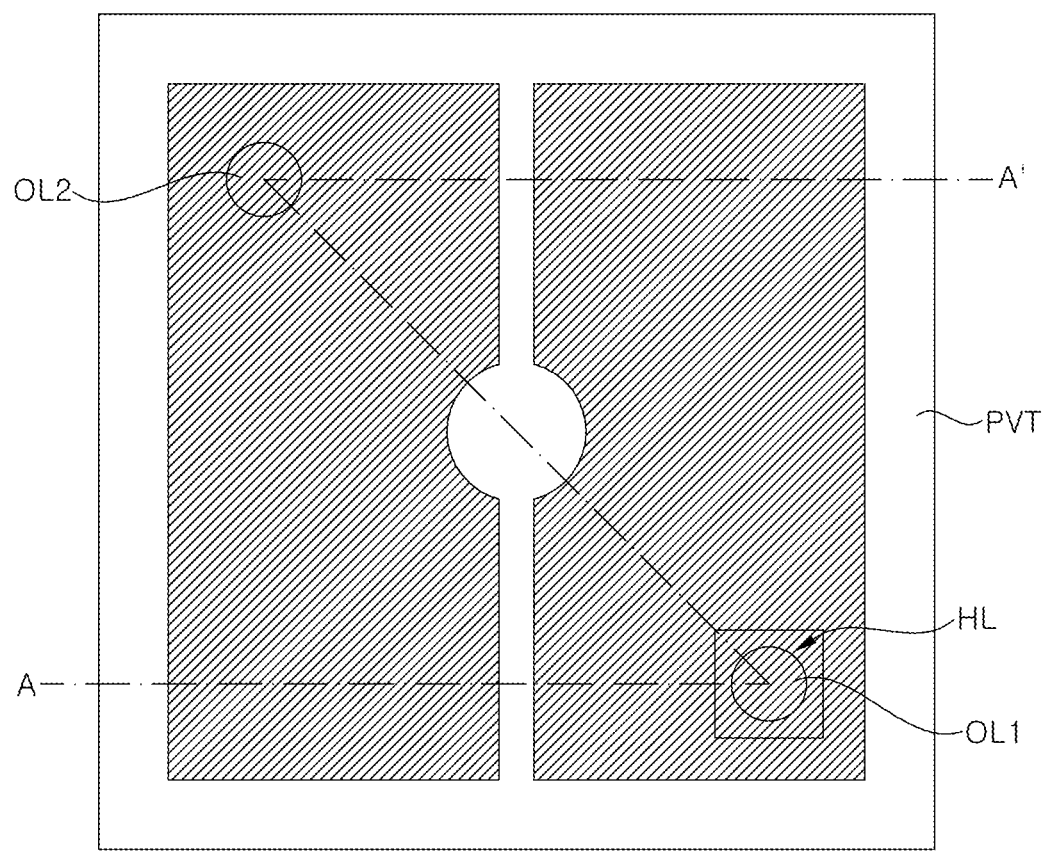
Figure 18B:
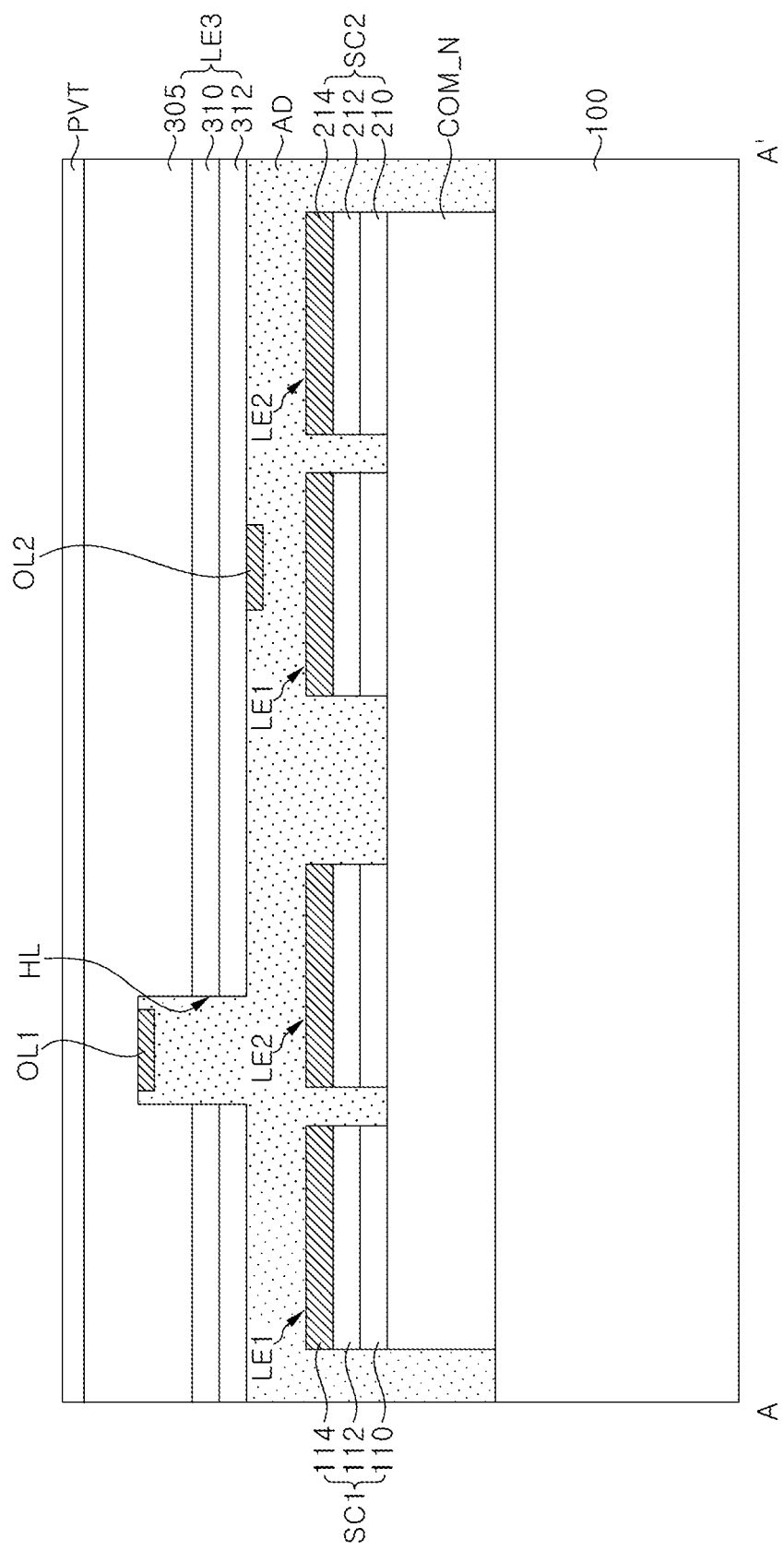

Referring to FIGS. 18A and 18B, a passivation layer PVT may be formed on the third n-type semiconductor layer 305. The passivation layer PVT may include an insulating material, such as SiOx or SiNx.

Figure 19A:
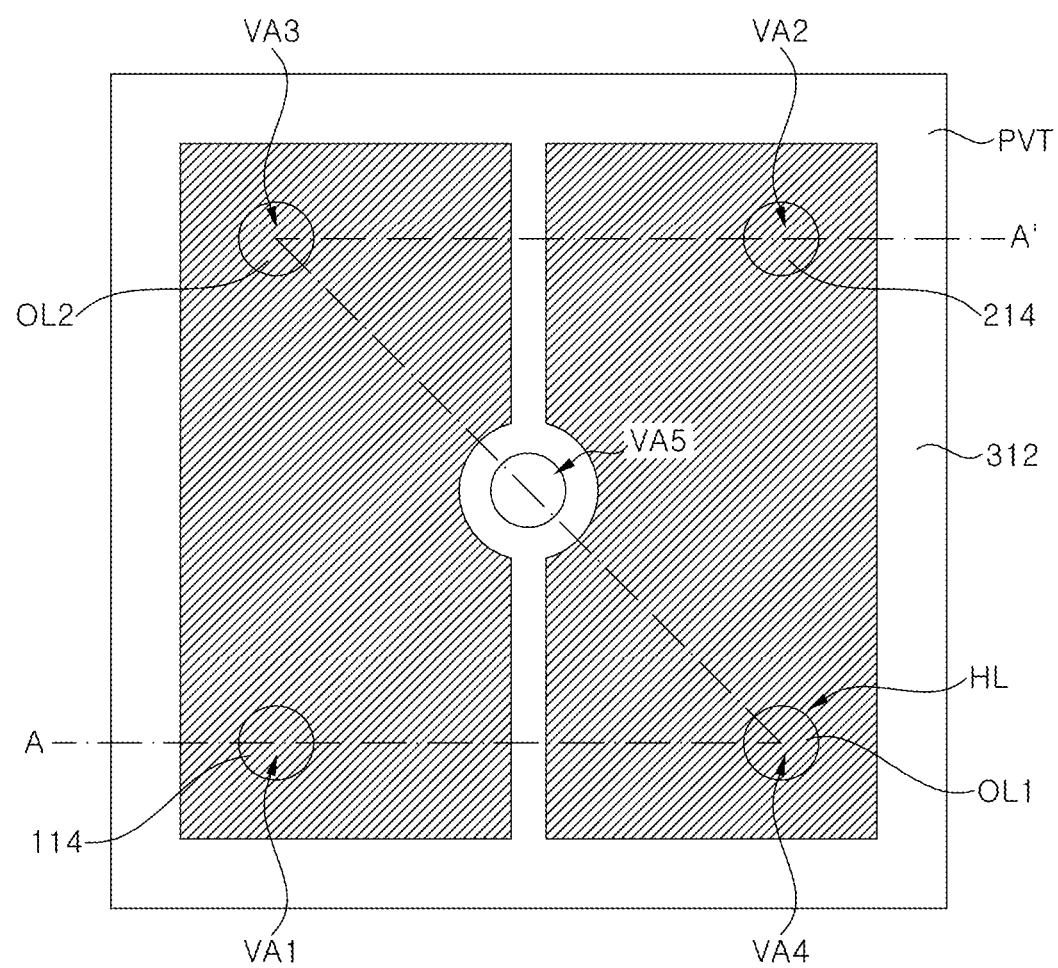
Figure 19B:
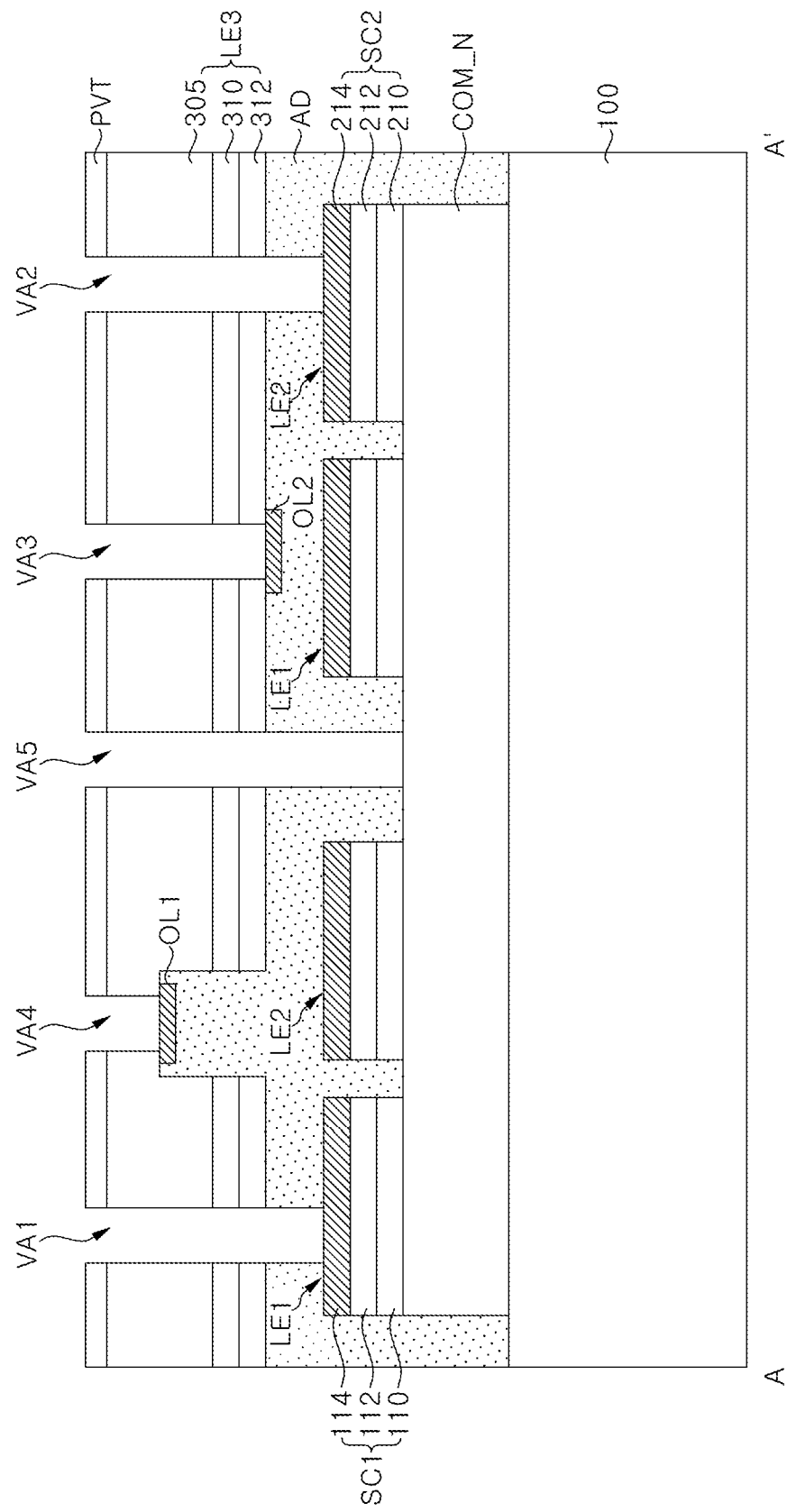

Referring to FIGS. 19A and 19B, after forming a fourth mask pattern on the passivation layer PVT, by using the fourth mask pattern as an etch mask, a first via hole VA1 exposing the first transparent electrode layer 114, a second via hole VA2 exposing the second transparent electrode layer 214, a third via hole VA3 exposing the second ohmic pattern OL2, a fourth via hole VA4 exposing the first ohmic pattern OL1, and a fifth via hole VA5 exposing the common n-type semiconductor layer COM_N may be formed.

For example, when the substrate 100 has substantially a quadrangular shape, the first via hole VA1, the second via hole VA2, the third via hole VA3, and the fourth via hole VA4 may be formed at the corners of the substrate 100, and the fifth via hole VA5 may be formed at the center of the substrate 100.

The fourth mask pattern MS4 may include a photoresist. After forming the first via hole VA1, the second via hole VA2, the third via hole VA3, the fourth via hole VA4, and the fifth via hole VA5, the fourth mask pattern may be removed.

Figure 20A:
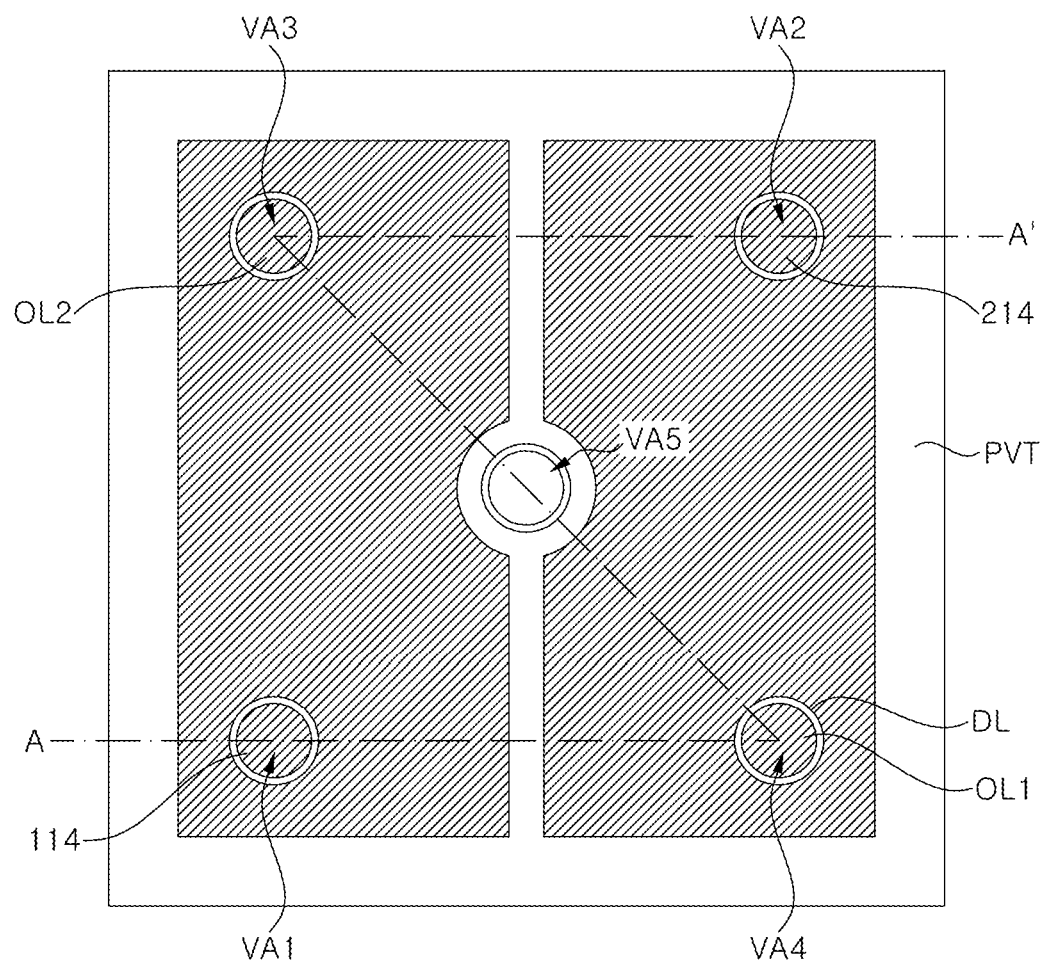
Figure 20B:
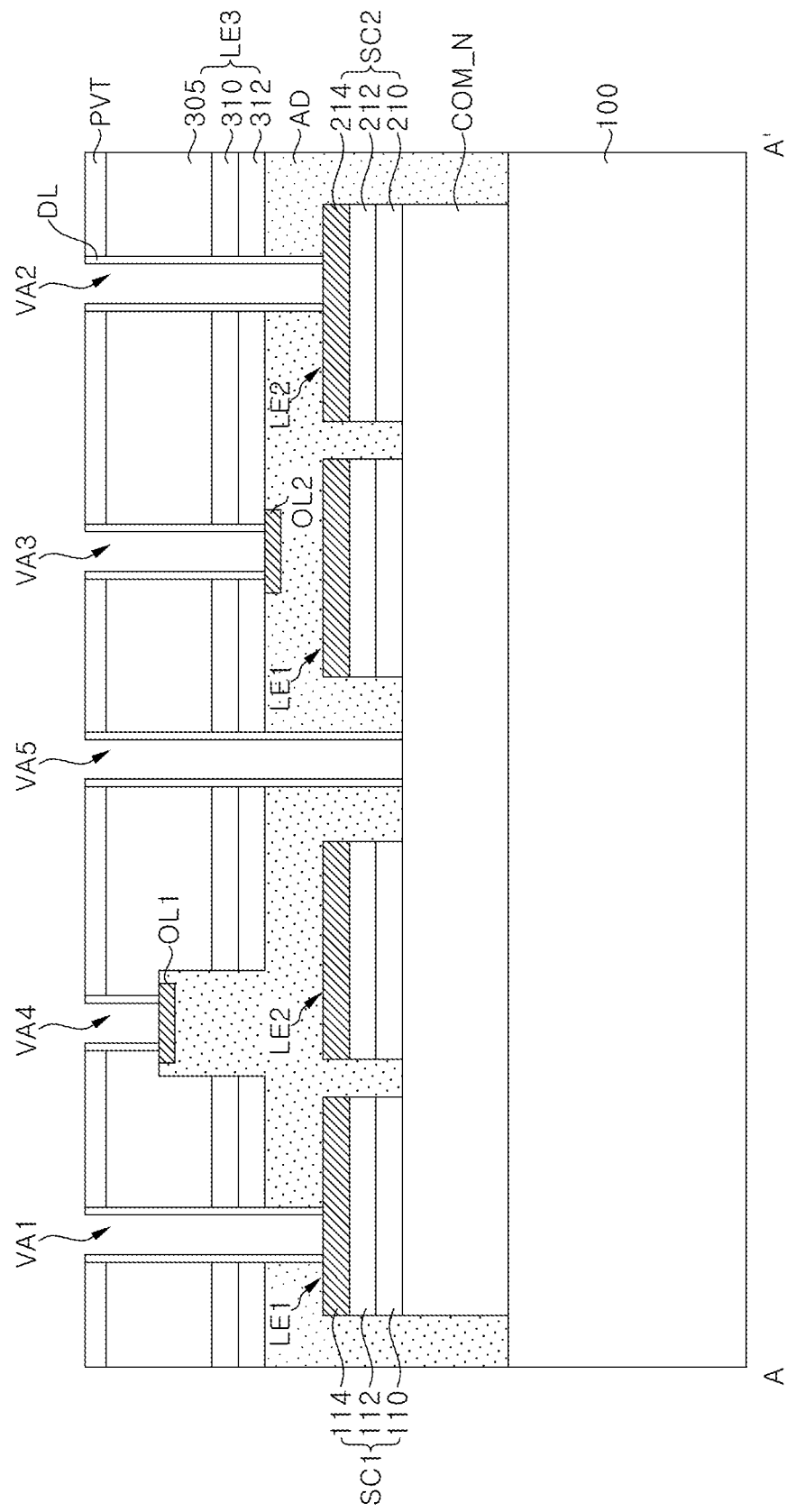

Referring to FIGS. 20A and 20B, a dielectric layer DL may be conformally formed on the first light emitting part LE1, the second light emitting part LE2, and the third light emitting part LE3, which are formed with the first via hole VA1, the second via hole VA2, the third via hole VA3, the fourth via hole VA4, and the fifth via hole VA5, by using an atomic layer deposition (ALD) process or a plasma enhanced CVD (PECVD) process. The dielectric layer DL may include a material, which has an etching selectivity for an etchant with respect to the passivation layer PVT. For example, when the passivation layer PVT includes SiOx, the dielectric layer DL may include at least one of SiNx, TiNx, TiOx, TaOx, ZrOx, and HfOx. Then, by anisotropically etching the dielectric layer DL without a mask, the dielectric layer DL formed on the passivation layer PVT and the bottoms of the first via hole VA1, the second via hole VA2, the third via hole VA3, the fourth via hole VA4, and the fifth via hole VA5 may be etched, and the dielectric layer DL may be retained on the inner sidewall of each of the first via hole VA1, the second via hole VA2, the third via hole VA3, the fourth via hole VA4, and the fifth via hole VA5.

Figure 21A:
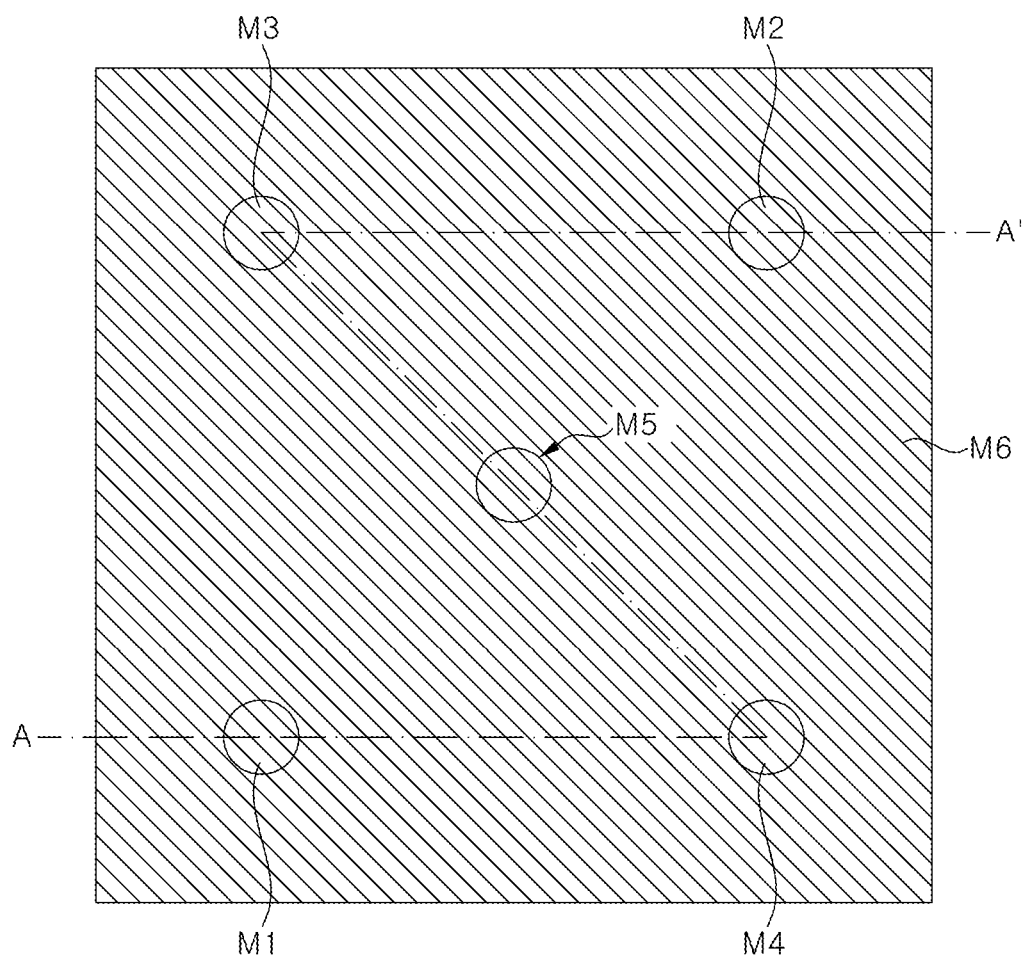
Figure 21B:
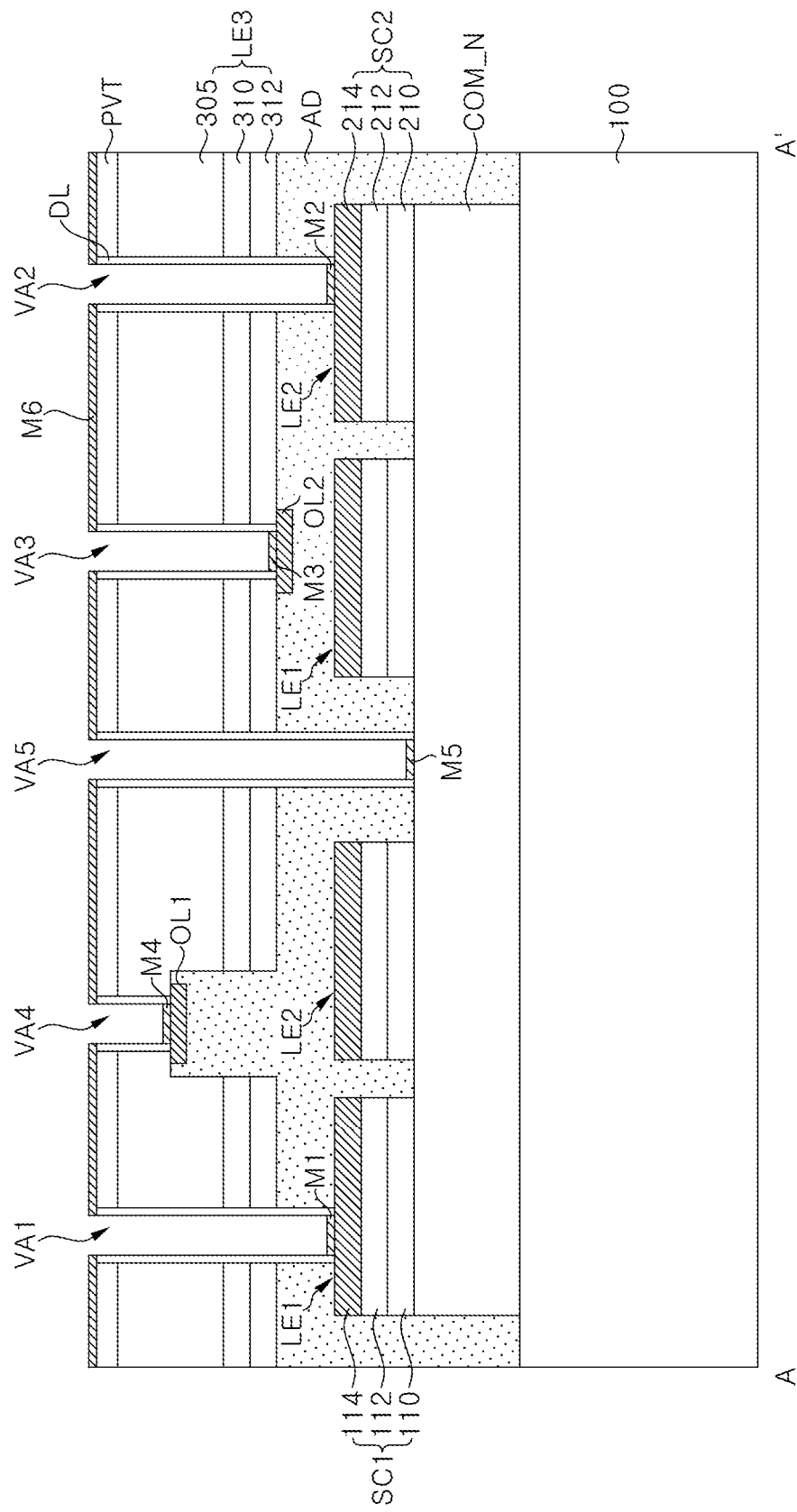

Referring to FIGS. 21A and 21B, metal patterns may be formed on the bottoms of the first via hole VA1, the second via hole VA2, the third via hole VA3, the fourth via hole VA4, and the fifth via hole VA5, which are formed with the dielectric layer DL, and on the passivation layer PVT, by using an anisotropic deposition process, such as a sputtering process. Each of the metal patterns may include a Cr/Al, Cr/Au, or Ti/Al alloy.

The metal patterns may include a first metal pattern M1 formed on the bottom of the first via hole VA1, a second metal pattern M2 formed on the bottom of the second via hole VA2, a third metal pattern M3 formed on the bottom of the third via hole VA3, a fourth metal pattern M4 formed on the bottom of the fourth via hole VA4, a fifth metal pattern M5 formed on the bottom of the fifth via hole VA5, and a sixth metal pattern M6 formed on the passivation layer PVT.

Figure 22A:
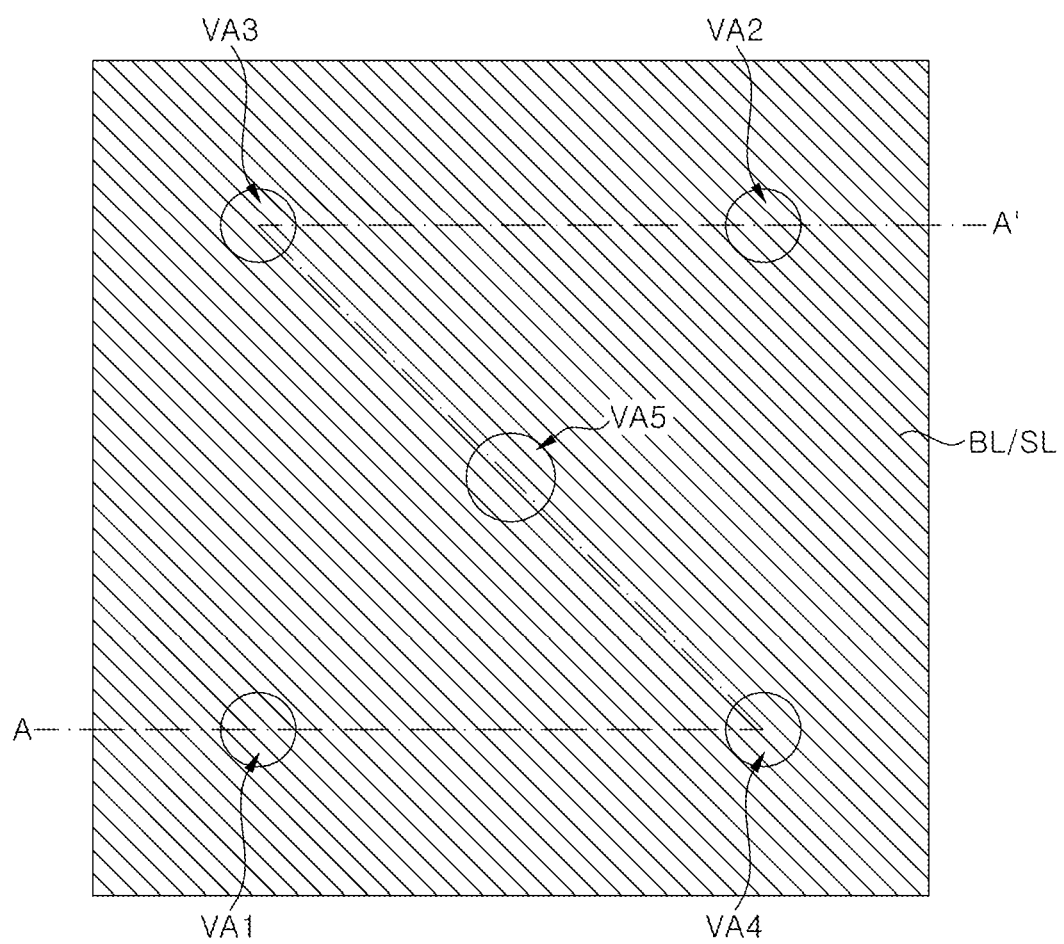
Figure 22B:
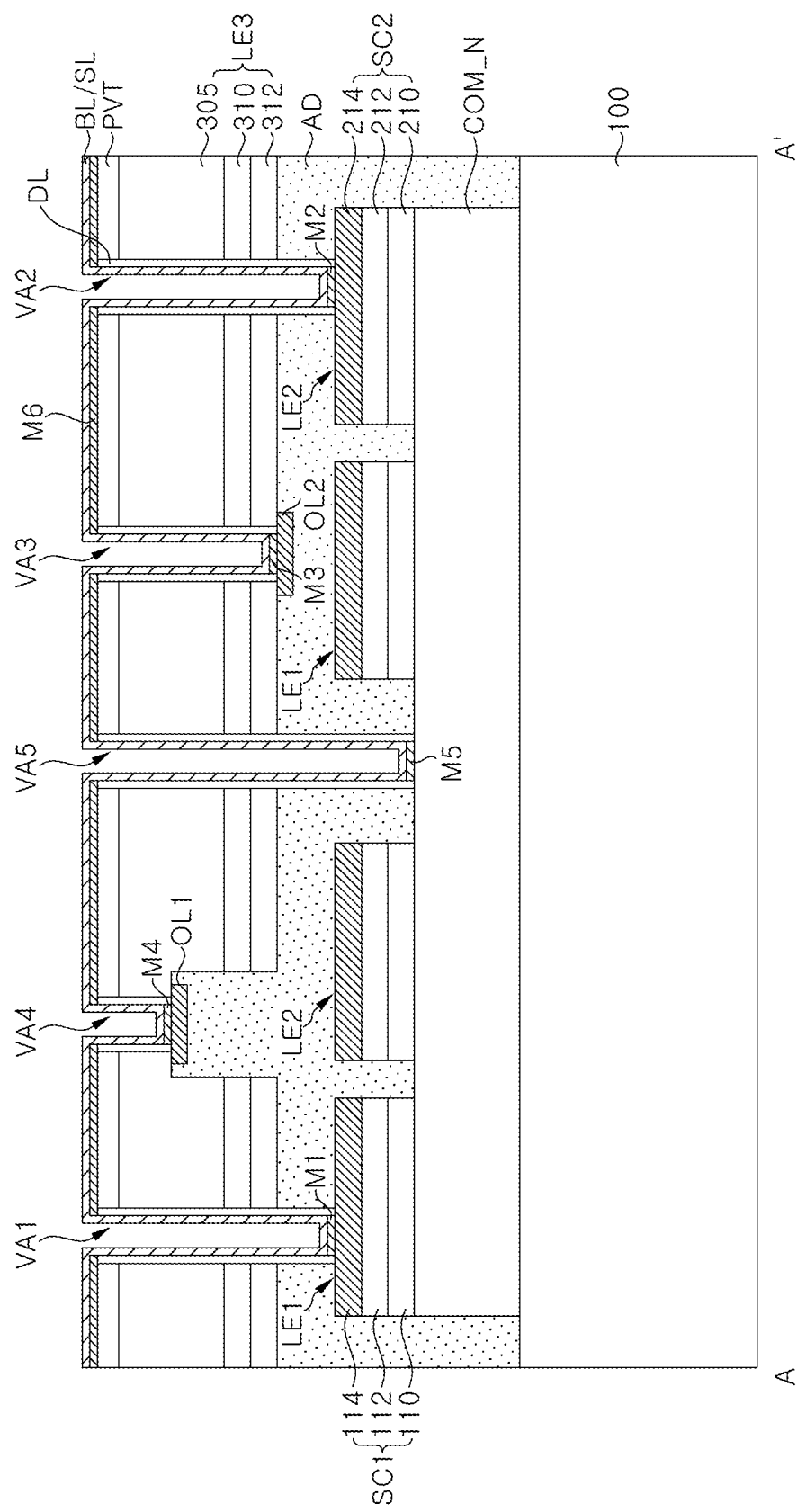

Referring to FIGS. 22A and 22B, a buffer layer BL and a seed layer SL may be sequentially and conformally formed on the first light emitting part LE1, the second light emitting part LE2, and the third light emitting part LE3, which are formed with the first metal pattern M1, the second metal pattern M2, the third metal pattern M3, the fourth metal pattern M4, the fifth metal pattern M5, and the sixth metal pattern M6. The buffer layer BL may include a Ta alloy, a TiW alloy or a TiNi alloy, for example. The seed layer SL may include Cu, for example. According to an exemplary embodiment, the buffer layer BL and the seed layer SL may be conformally formed while not filling (or burying) the first via hole VA1, the second via hole VA2, the third via hole VA3, the fourth via hole VA4, and the fifth via hole VA5, which are formed with the first metal pattern M1, the second metal pattern M2, the third metal pattern M3, the third metal pattern M3, the fourth metal pattern M4, and the fifth metal pattern M5, respectively.

Figure 23A:
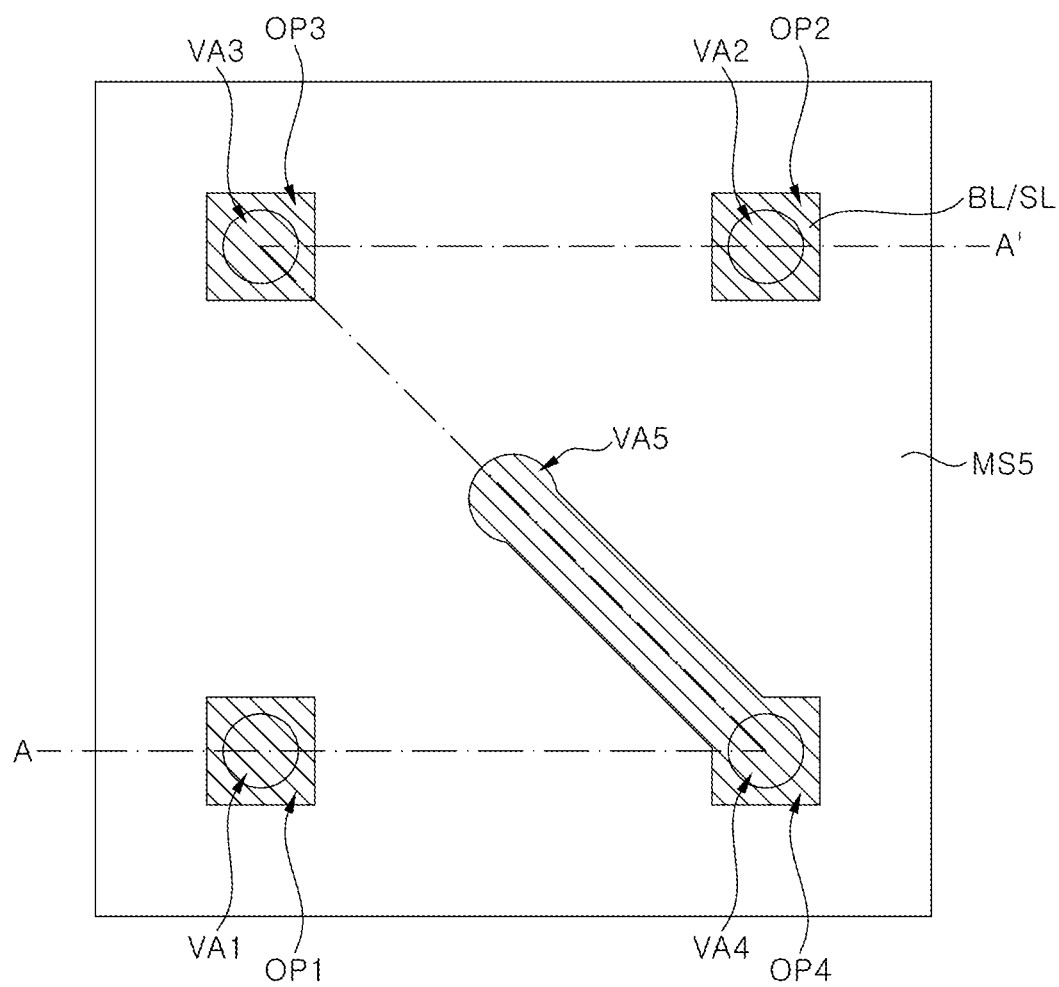
Figure 23B:
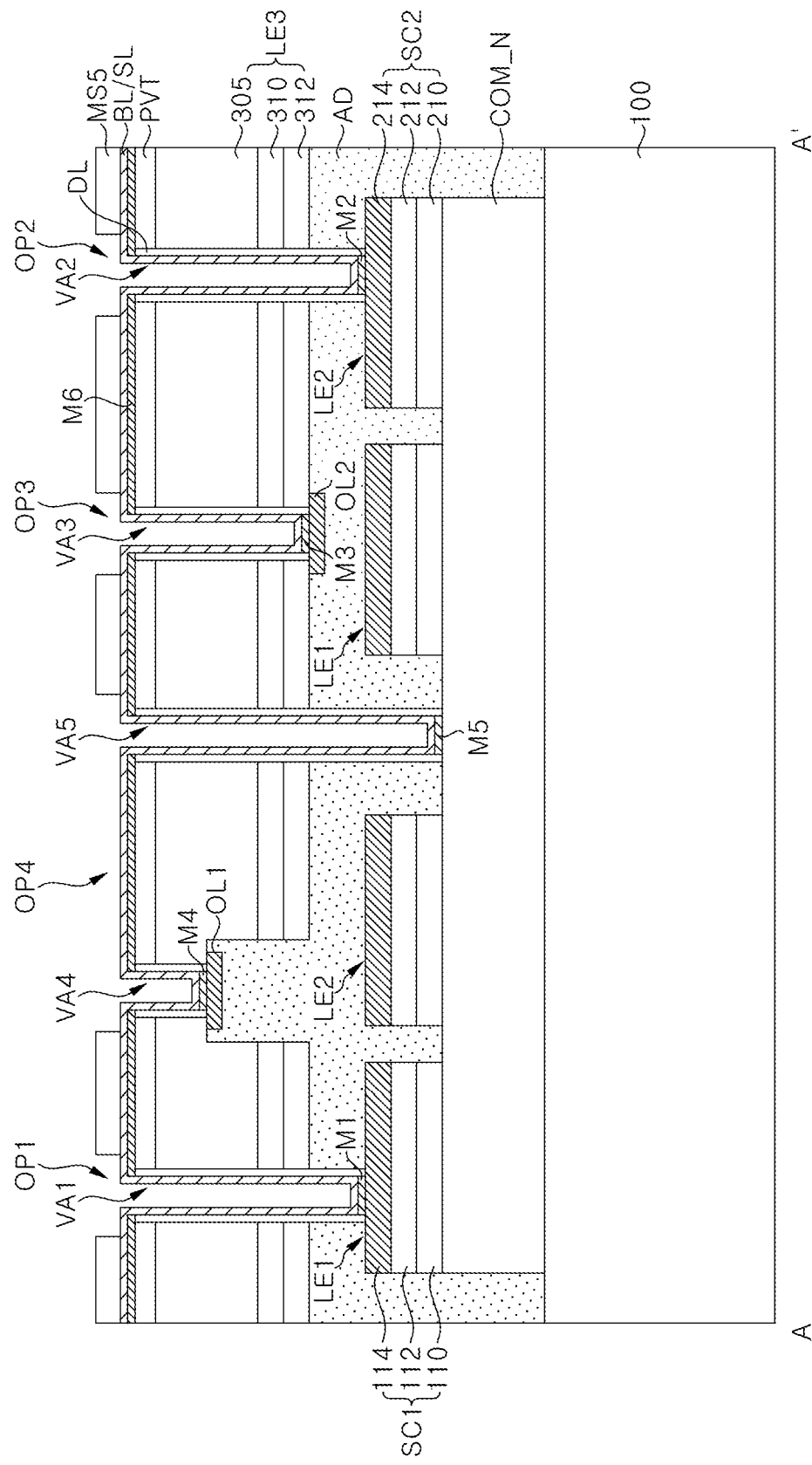

Referring to FIGS. 23A and 23B, a fifth mask pattern MS5 may be formed on the seed layer SL. The fifth mask pattern MS5 may include a photoresist. The fifth mask pattern MS5 may include openings, which expose the first via hole VA1, the second via hole VA2, the third via hole VA3, the fourth via hole VA4, and the fifth via hole VA5, which are formed with the seed layer SL.

The openings may include a first opening OP1 exposing the first via hole VA1, a second opening OP2 exposing the second via hole VA2, a third opening OP3 exposing the third via hole VA3, and a fourth opening OP4 exposing each of the fourth via hole VA4 and the fifth via hole VA5.

For example, when the first via hole VA1, the second via hole VA2, the third via hole VA3, and the fourth via hole VA4 are formed at the corners of the substrate 100, and the fifth via hole VA5 is formed at the center of the substrate 100, the first opening OP1, the second opening OP2, and the third opening OP3 may be respectively formed at the corners of the substrate 100, and the fourth opening OP4 may have a structure, which extends from one corner to the center of the substrate 100.

Figure 24A:
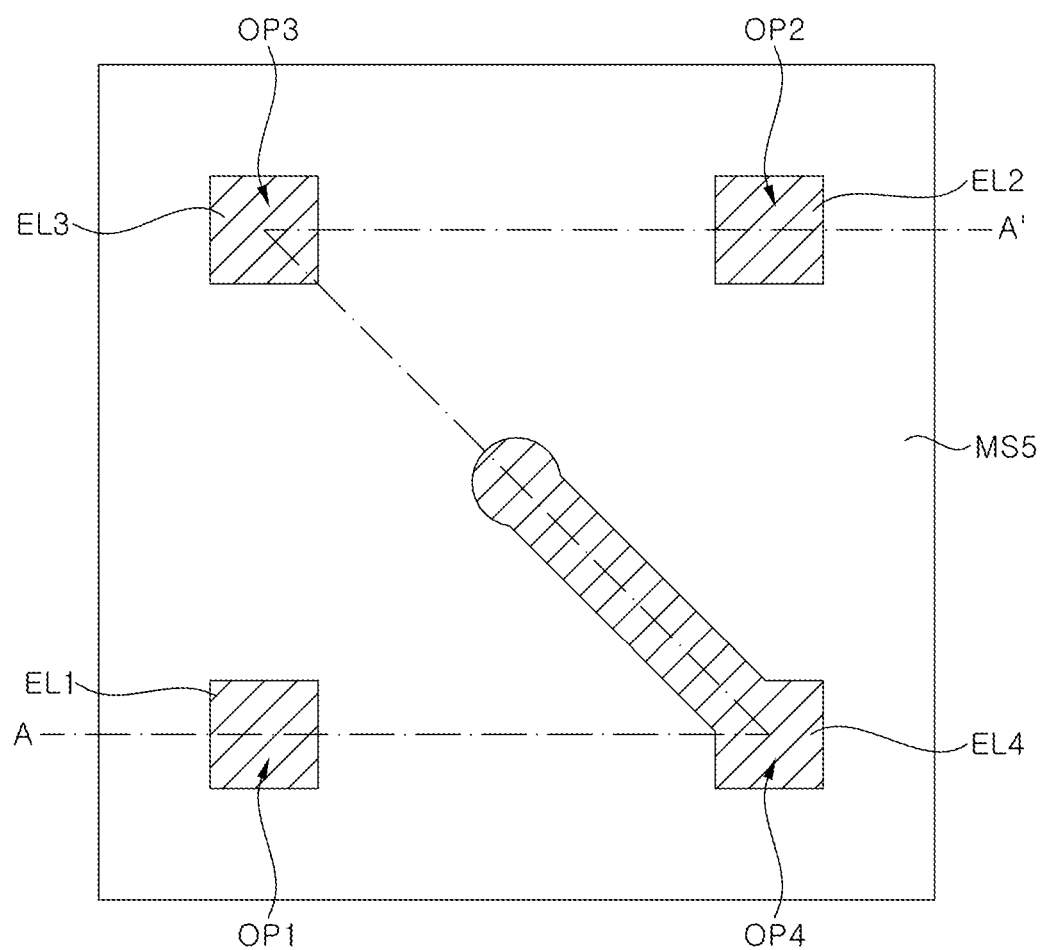
Figure 24B:
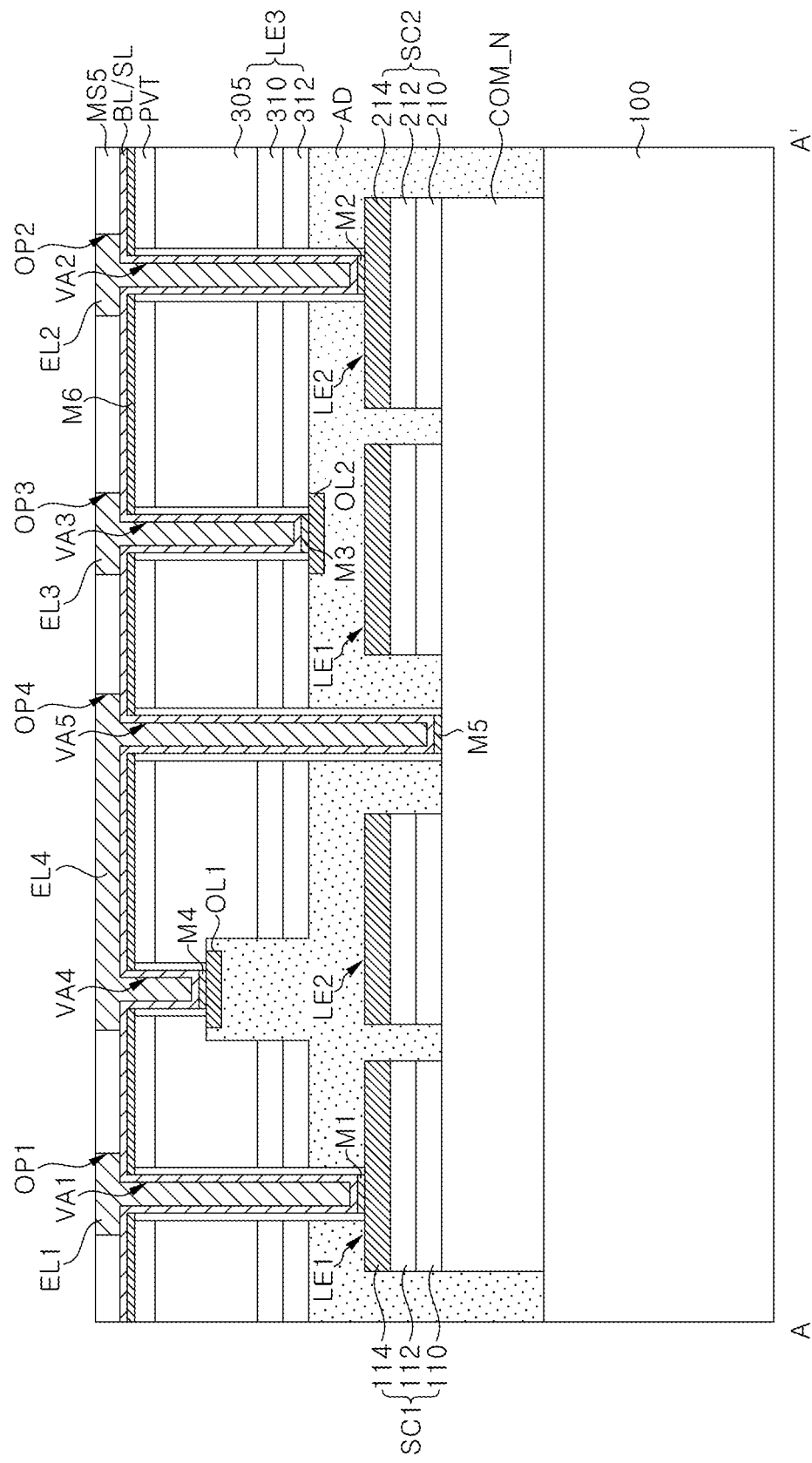

Referring to FIGS. 24A and 24B, through a plating process using the seed layer SL, electrode layers that substantially fill the first via hole VA1, the second via hole VA2, the third via hole VA3, the fourth via hole VA4, and the fifth via hole VA5, and substantially fill the first opening OP1, the second opening OP2, the third opening OP3, and the fourth opening OP4 may be respectively formed.

The electrode layers may include a first electrode layer EL1 filling the first via hole VA1 and the first opening OP1, a second electrode layer EL2 filling the second via hole VA2 and the second opening OP2, a third electrode layer EL3 filling the third via hole VA3 and the third opening OP3, and a fourth electrode layer EL4 filling the fourth via hole VA4, the fifth via hole VA5, and the fourth opening OP4.

Since the electrode layers EL1, EL2, EL3 and EL4 are formed through a plating process, top surfaces thereof may be formed to be higher than the fifth mask pattern MS5. As such, the top surfaces of the electrode layers EL1, EL2, EL3, and EL4 may be polished by using a chemical mechanical polishing (CMP) process, or the like. In this manner, each of the electrode layers EL1, EL2, EL3, and EL4 may have a top surface disposed at the same level as the surface of the fifth mask pattern MS5.

Figure 25A:
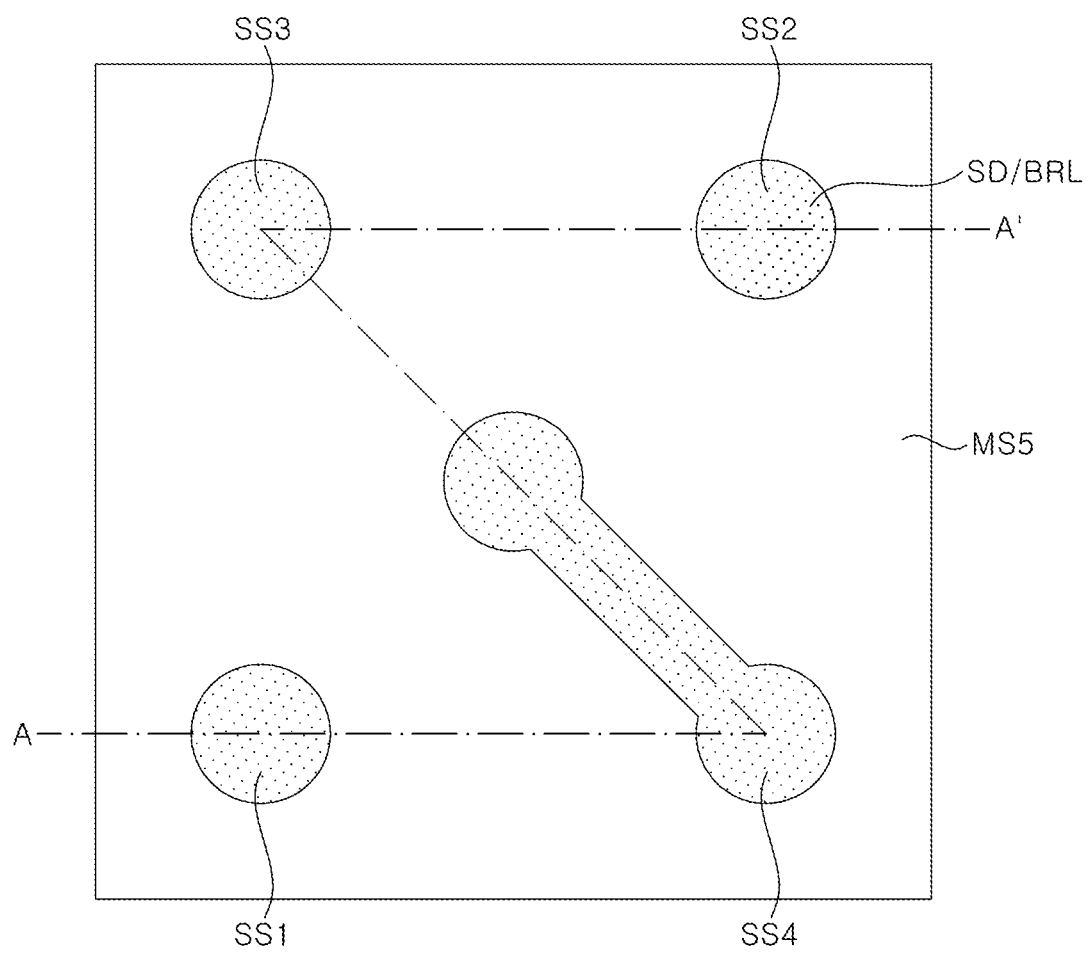
Figure 25B:
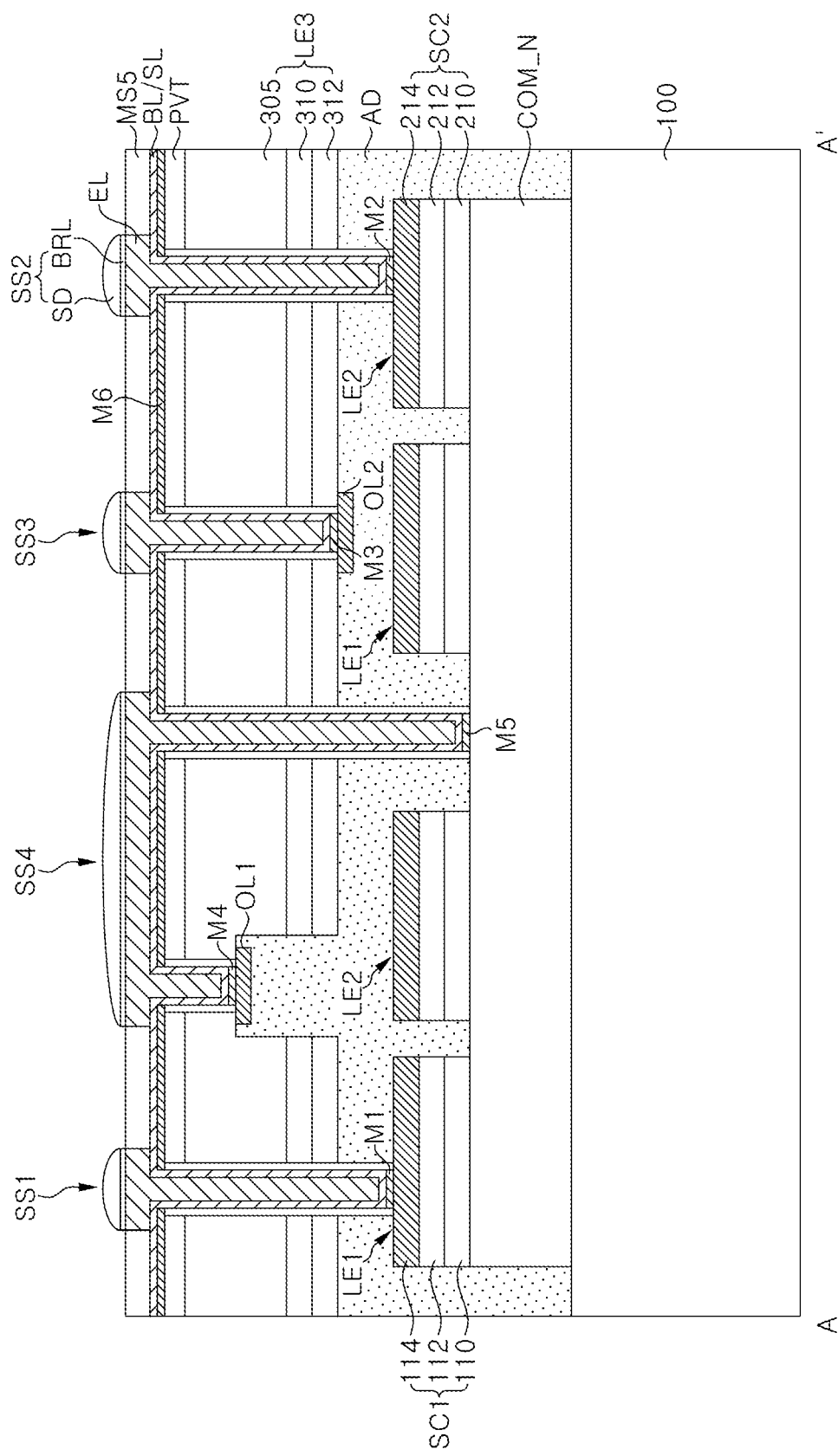

Referring to FIGS. 25A and 25B, solder structures may be formed on the electrode layers EL1, EL2, EL3, and EL4, respectively.

The solder structures may be respectively formed on areas, which are defined by the fifth mask pattern MS5, in particular, on the electrode layers EL1, EL2, EL3, and EL4. The solder structures may include a first solder structure SS1 formed on the first electrode layer EL1, a second solder structure SS2 formed on the second electrode layer EL2, a third solder structure SS3 formed on the third electrode layer EL3 and a fourth solder structure SS4 formed on the fourth electrode layer EL4.

According to an exemplary embodiment, in the solder structures SS1, SS2, SS3, and SS4, solder balls SD, which may include In, may be respectively formed through a plating process. A barrier layer BRL, which includes Ni, Ti, Cr, or others, may be formed before forming the solder balls SD.

In some exemplary embodiments, the process of forming the solder structures SS1, SS2, SS3 and SS4 may be omitted.

Figure 26A:
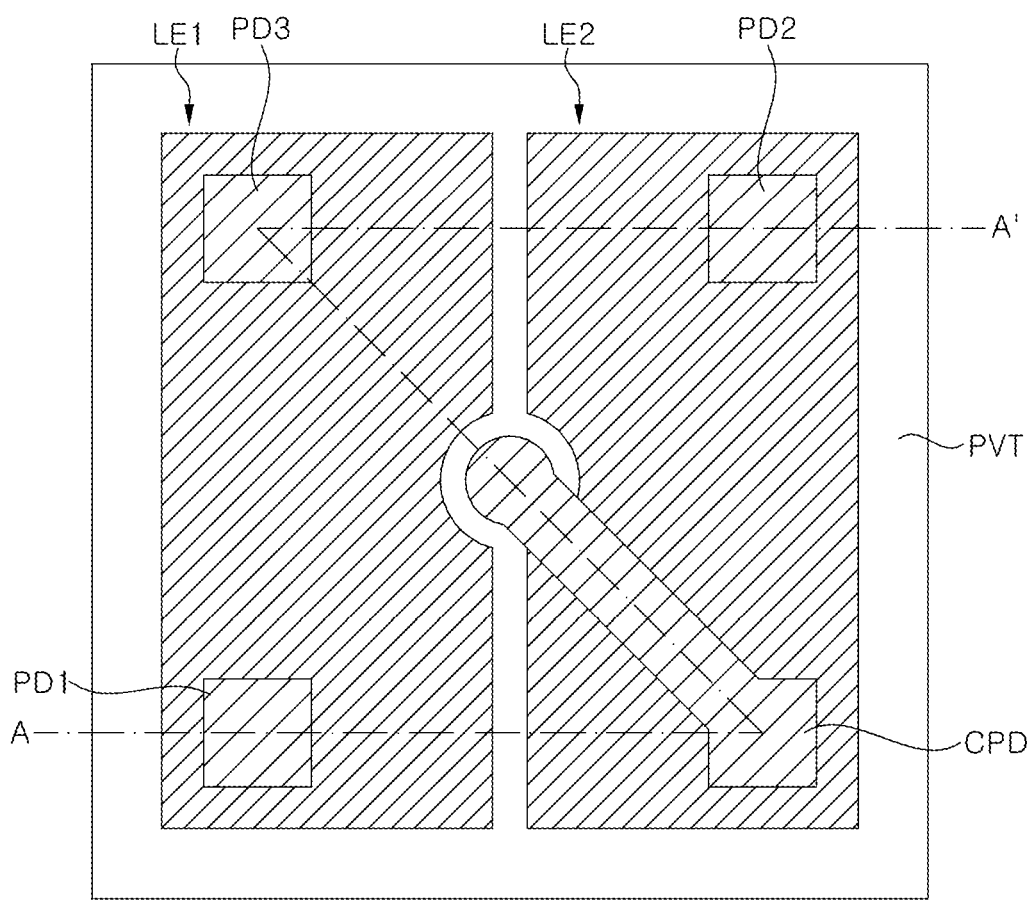
Figure 26B:
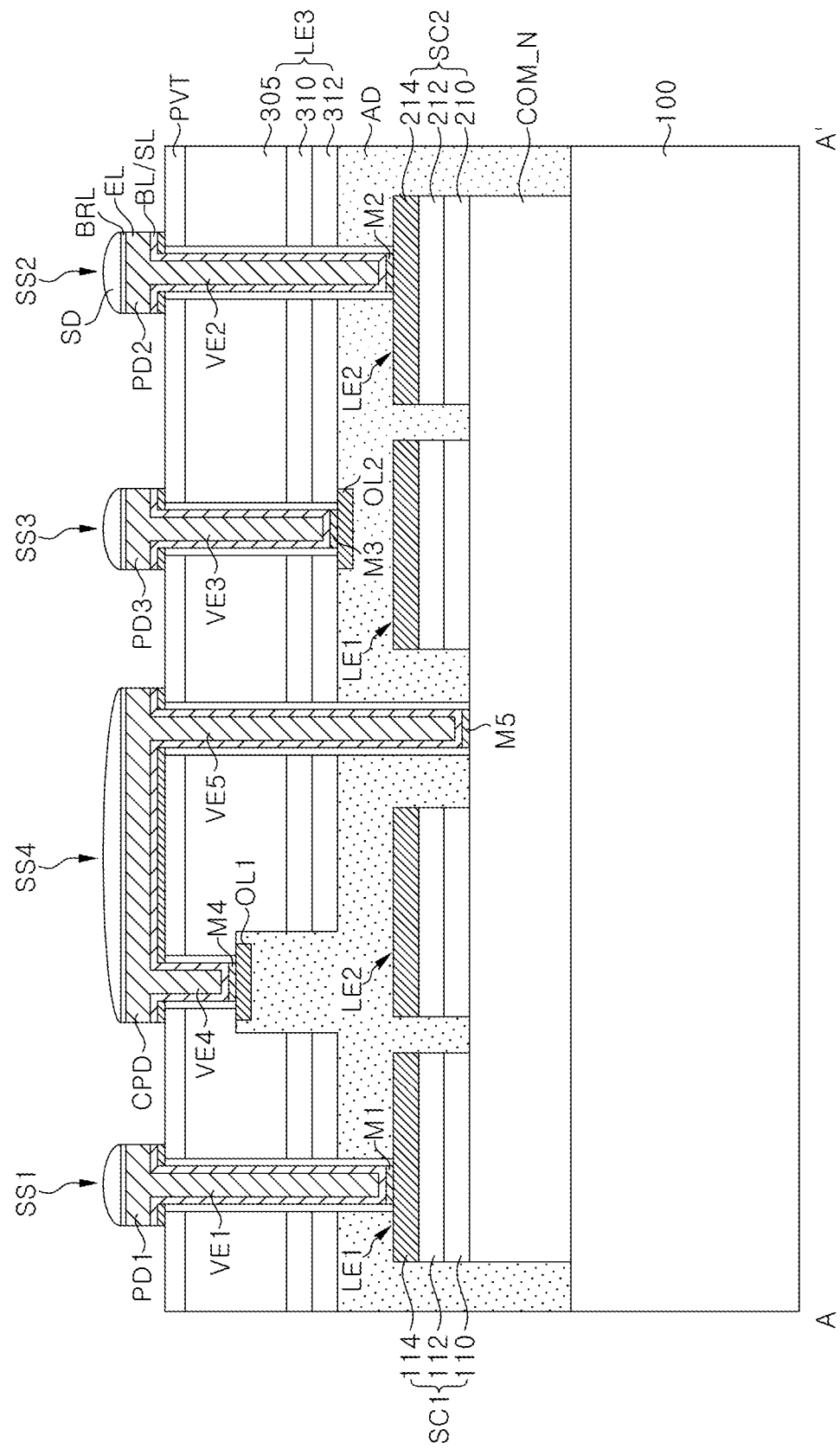

Referring to FIGS. 26A and 26B, after removing the fifth mask pattern MS5, by etching the seed layer SL and the sixth metal pattern M6, a first through electrode VE1, a first pad PD1, a second through electrode VE2, a second pad PD2, a third through electrode VE3, a third pad PD3, a fourth through electrode VE4, a fifth through electrode VE5, and a common pad CPD may be formed.

The first through electrode VE1 may fill the first via hole VA1 and include the barrier layer BL, the seed layer SL and the first electrode layer EL, and the first pad PD1 may extend from the first through electrode VE1, fill the first opening OP1, and include the barrier layer BL, the seed layer SL, and the first electrode layer EL. The second through electrode VE2 may fill the second via hole VA2 and include the barrier layer BL, the seed layer SL and the second electrode layer EL, and the second pad PD2 may extend from the second through electrode VE2, bury the second opening OP2, and include the barrier layer BL, the seed layer SL, and the second electrode layer EL. The third through electrode VE3 may fill the third via hole VA3 and include the barrier layer BL, the seed layer SL, and the third electrode layer EL, and the third pad PD3 may extend from the third through electrode VE3, fill the third opening OP3, and include the barrier layer BL, the seed layer SL and the third electrode layer EL. The fourth through electrode VE4 may fill the fourth via hole VA4 and include the barrier layer BL, the seed layer SL, and the fourth electrode layer EL. The fifth through electrode VE5 may fill the fifth via hole VA5 and include the barrier layer BL, the seed layer SL, and the fourth electrode layer EL. The common pad CPD may extend from the fourth through electrode VE4 and the fifth through electrode VE5, fill the fourth opening OP4, and include the barrier layer BL, the seed layer SL and the fourth electrode layer EL.

When the solder structures SS1, SS2, SS3, and SS4 are not formed in the processes described above with reference to FIGS. 9A to 26A and 9B to 26B, the light emitting device shown in FIG. 1B may be formed. When the solder structures SS1, SS2, SS3, and SS4 are formed in the processes described above with reference to FIGS. 9A to 26A and 9B to 26B, the light emitting device shown in FIG. 1D may be formed.

In some exemplary embodiments, the processes for forming the first through electrode VE1, the second through electrode VE2, the third through electrode VE3, the fourth through electrode VE4, the fifth through electrode VE5, the first pad PD1, the second pad PD2, the third pad PD3, and the common pad CPD may be performed as processes to be described below.

Figure 27:
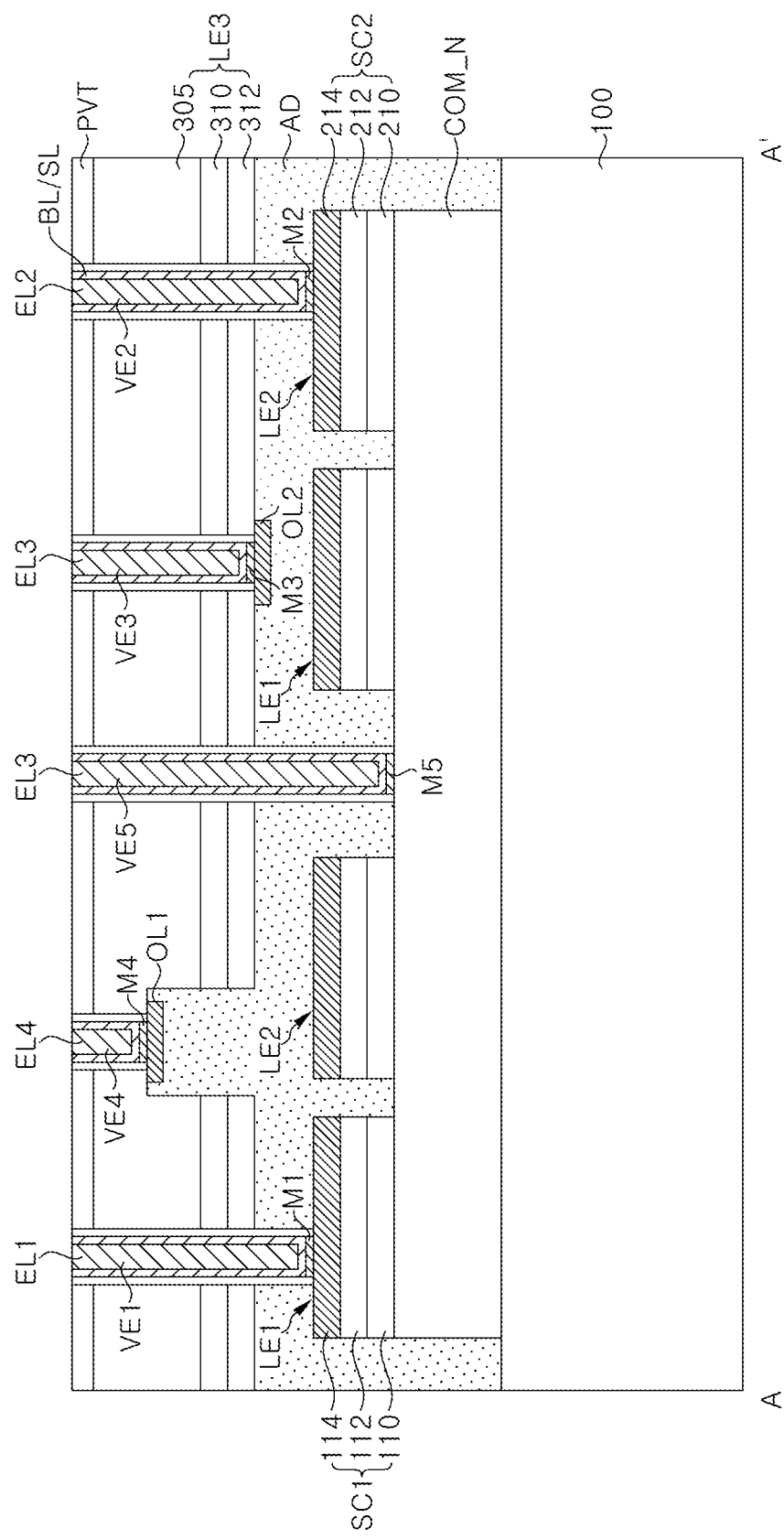
FIGS. 27 and 28 are cross-sectional views illustrating a method for manufacturing a light emitting device according to another exemplary embodiment.
Figure 28:
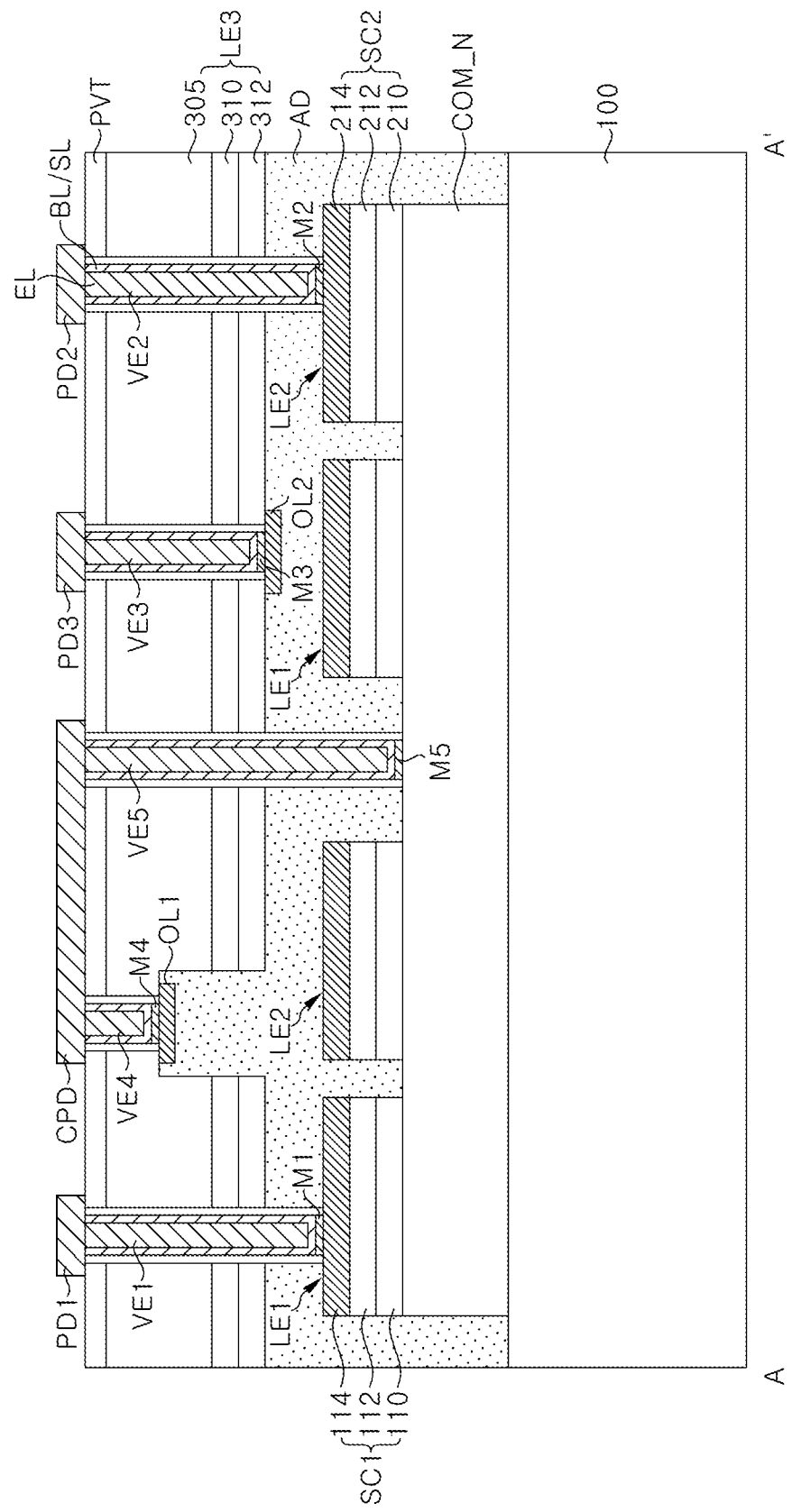

FIGS. 27 and 28 are cross-sectional views illustrating a method for manufacturing a light emitting device according to another exemplary embodiment.

As described above with reference to FIGS. 9A to 24A and 9B to 24B, the first light emitting part LE1, the second light emitting part LE2, the adhesion part AD, the third light emitting part LE3, the passivation layer PVT, the barrier layer BL, the seed layer SL, the first electrode layer EL1 filling the first via hole VA1, the second electrode layer EL2 filling the second via hole VA2, the third electrode layer EL3 filling the third via hole VA3, and the fourth electrode layer EL4 filling the fourth via hole VA4, and the fifth electrode layer EL5 filling the fifth via hole VA5 may be formed.

Referring to FIG. 27, by etching or polishing the first electrode layer EL1, the second electrode layer EL2, the third electrode layer EL3, the fourth electrode layer EL4, the fifth electrode layer EL5, the fifth mask pattern MS5, the seed layer SL, and the barrier layer BL, a first through electrode VE1, a second through electrode VE2, a third through electrode VE3, a fourth through electrode VE4, and a fifth electrode layer EL5 may be respectively formed.

In this case, the passivation layer PVT may serve as an etch (or polish) stopper in the process of etching or polishing the first electrode layer EL1, the second electrode layer EL2, the third electrode layer EL3, the fourth electrode layer EL4, the fifth mask pattern MS5, the seed layer SL, and the barrier layer BL.

Referring to FIG. 28, a first pad PD1 electrically coupled with the first through electrode VE1, a second pad PD2 electrically coupled with the second through electrode VE2, a third pad PD3 electrically coupled with the third through electrode VE3, and a common pad CPD electrically coupled with the fourth through electrode VE4 and the fifth through electrode VE5 may be respectively formed on the passivation layer PVT.

By the processes shown in FIGS. 27 and 28, the light emitting device shown in FIG. 1C may be formed.

Figure 29:
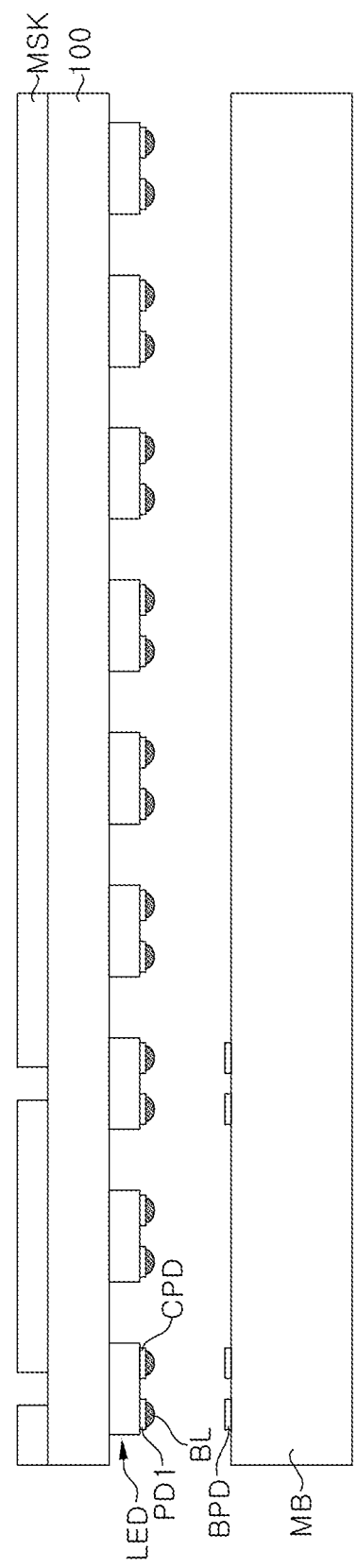
FIGS. 29 and 30 are cross-sectional views illustrating a method for mounting light emitting devices to a mounting board according to an exemplary embodiment.
Figure 30:
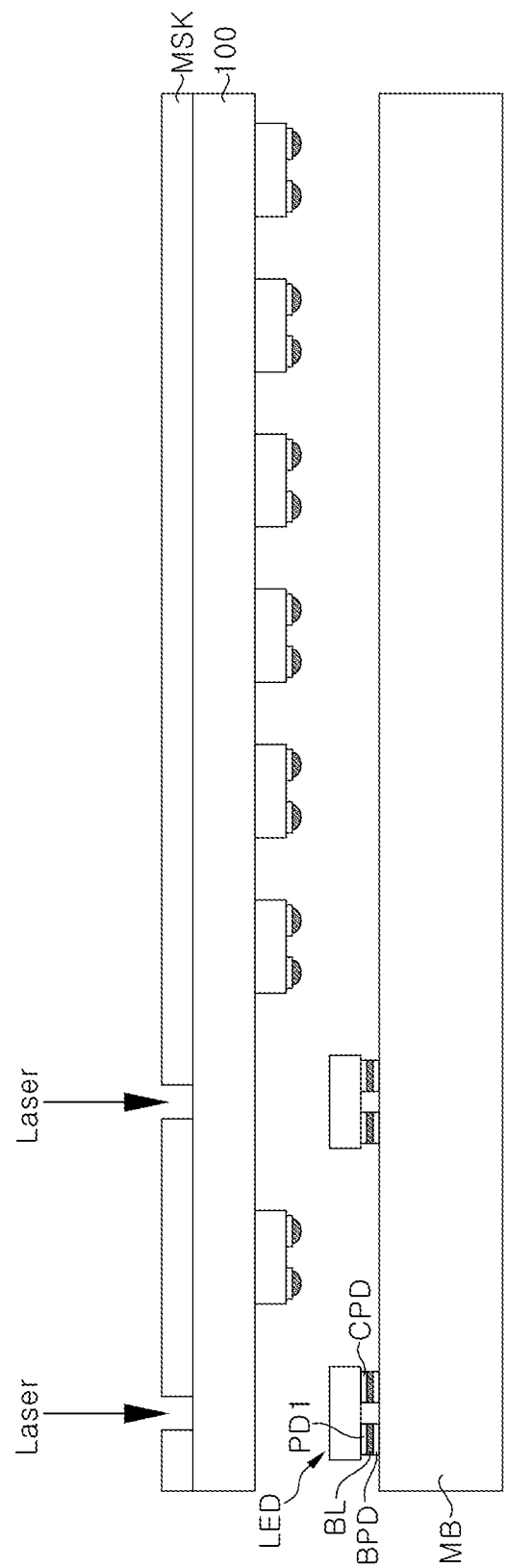

FIGS. 29 and 30 are cross-sectional views illustrating a method for mounting light emitting devices to a mounting board according to an exemplary embodiment.

Referring to FIG. 29, a plurality of light emitting devices LEDs, which may be formed through the process illustrated in FIGS. 9A to 26A, and 9B to 26B, may be mounted to a target mounting board MB.

Bonding pads BPD, which are to be electrically bonded with the first pad PD1, the second pad PD2, the third pad PD3, and the common pad CPD, respectively, may be formed on the mounting board MB. The bonding pads BPD may be formed to correspond to positions where the light emitting devices LEDs are to be mounted.

For example, the solder structures SS1, SS2, SS3, and SS4 may be formed on the first pad PD1, the second pad PD2, the third pad PD3, and the common pad CPD, respectively. As another example, solder structures may be respectively formed on the bonding pads BPD of the mounting board MB.

The first substrate 100 formed with the plurality of light emitting devices LED may be turned over, such that the light emitting devices LEDs may face the mounting board MB formed with the bonding pads BPD.

A mask pattern MSK, which exposes light emitting devices LEDs to be separated from the first substrate 100, may be formed on the turned-over first substrate 100.

Referring to FIG. 30, by performing a selective laser lift-off (LLO) process to the first substrate 100 through using the mask pattern MSK, the light emitting devices LEDs facing target mounting positions of the mounting board MB may be selectively separated from the first substrate 100. An interval between the separated light emitting devices LEDs may be changed depending on the mounting board MB. In order to prevent undesired light emitting devices LEDs from falling off from the first substrate 100, the selective LLO may be performed after the light emitting devices LEDs are bonded to the mounting board MB, whereby the light emitting devices LEDs can be more stably mounted at desired positions. In some exemplary embodiments, the mask pattern MSK defining laser incident positions may be omitted in the selective LLO process.

The first pad PD1, the second pad PD2, the third pad PD3, and the common pad CPD of each of the separated light emitting devices LEDs may be respectively bonded with the bonding pads BPD by the solder structures SS1, SS2, SS3, and SS4. In this manner, the light emitting devices LEDs may be mounted to the mounting board MB.

When each of the light emitting devices LEDs are mounted at the target positions, the first substrate 100 may be separated from the light emitting devices LEDs without separately performing a process for removing the first substrate 100.

In the light emitting device according to exemplary embodiments, since a light emitting part emitting red light is formed to have a greater size than a light emitting part emitting blue light or green light, the light emitting efficiency of the light emitting part emitting red light may be increased.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a first light emitting part having a first area, and comprising a first-conductivity type semiconductor layer and a first semiconductor structure including an active layer and a second-conductivity type semiconductor layer;
a second light emitting part having a second area, and comprising a second semiconductor structure spaced apart from the first semiconductor structure and including an active layer and a second-conductivity type semiconductor layer;
a third light emitting part spaced apart from the first and second light emitting parts and having a third area, the third light emitting part including a first-conductivity type semiconductor layer, an active layer, and a second-conductivity type semiconductor layer and being configured to emit light of a same color through an emitting surface thereof;
an adhesion part disposed between the first and second light emitting parts and the third light emitting part, between the first and second semiconductor structures, and bonding the first and second light emitting parts and the third light emitting part;
a first pad electrically coupled with the second-conductivity type semiconductor layer of the first light emitting part, a second pad electrically coupled with the second-conductivity type semiconductor layer of the second light emitting part, a third pad electrically coupled with the second-conductivity type semiconductor layer of the third light emitting part, and a common pad electrically coupled to the first-conductivity type semiconductor layers of the first and third light emitting parts; and
a first through-pattern electrically coupling the second-conductivity type semiconductor layer of the first light emitting part and the first pad, a second through-pattern electrically coupling the second-conductivity type semiconductor layer of the second light emitting part and the second pad, a third through-pattern electrically coupling the second-conductivity type semiconductor layer of the third light emitting part and the third pad, and a fourth through-pattern electrically coupling the first-conductivity type semiconductor layers of the first and third light emitting parts and the common pad,
wherein:
the first light emitting part is disposed on a same plane as the second light emitting part, such that the first area and the second area overlap the third area and the second area does not overlap the first area;
the first and second light emitting parts are configured to emit light having different peak wavelength from each other, and are disposed over the emitting surface of the third light emitting part;
the third area is larger than each of the first and second areas; and
the fourth through-pattern passes through the first-conductivity type semiconductor layer of the third light emitting part and is electrically connected to a portion of the first-conductivity type semiconductor layer of the first light emitting part exposed between the first and second semiconductor structures.

2. The light emitting device according to claim 1, further comprising:
a fifth through-pattern electrically coupling the first-conductivity type semiconductor layer of the third light emitting part and the common pad.

3. The light emitting device according to claim 1, further comprising a dielectric layer surrounding outer sidewalls of the first, second, third, and fourth through-patterns,
wherein:
the fourth through-pattern passes through the third light emitting part and the adhesion part, such that one surface of the fourth through-pattern contacts the portion the first-conductivity type semiconductor layer of the first light emitting part exposed between the first and second semiconductor structures, and the other surface of the fourth through-pattern contacts the common pad; and the common pad electrically contacts the first-conductivity type semiconductor layer of the third light emitting part.

4. The light emitting device according to claim 1, wherein:

the third light emitting part includes a hole exposing the first-conductivity type semiconductor layer of the third light emitting part; and the hole has a width less than a width of the first-conductivity type semiconductor layer of the first light emitting part exposed between the first and second semiconductor structures.

5. The light emitting device according to claim 4, wherein:

the hole filled with the adhesion part is disposed between the first-conductivity type semiconductor layers of the first and third light emitting parts; and the fourth through-pattern passes through the first-conductivity type semiconductor layer of the third light emitting part and the adhesion part, such that one surface of the fourth through-pattern contacts the common pad, the other surface of the fourth through-pattern opposing the one surface contacts the first-conductivity type semiconductor layer of the first light emitting part, and a sidewall of the fourth through-pattern contacts the first-conductivity type semiconductor layer of the third light emitting part.

6. The light emitting device according to claim 4, further comprising a dielectric layer filling the hole, wherein:

the hole is disposed between the common pad and the first-conductivity type semiconductor layer of the third light emitting part; and the fourth through-pattern passes through the dielectric layer and the first-conductivity type semiconductor layer of the third light emitting part, the fourth through-pattern including an upper sidewall contacting the dielectric layer, a middle sidewall contacting the first-conductivity type semiconductor layer of the third light emitting part, and a lower sidewall contacting the adhesion part, such that one surface of the fourth through-pattern contacts the common pad, and the other surface of the fourth through-pattern opposing the one surface contacts the portion of the first-conductivity type semiconductor layer of the first light emitting part exposed between the first and second semiconductor structures.

7. The light emitting device according to claim 1, wherein:

the third light emitting part includes a hole exposing the first-conductivity type semiconductor layer of the third light emitting part; and the hole has a width less than a width of the first-conductivity type semiconductor layer of the first light emitting part exposed between the first and second semiconductor structures.

8. The light emitting device according to claim 7, wherein:

the hole faces the first-conductivity type semiconductor layer of the first light emitting part exposed between the first and second semiconductor structures; and the adhesion part extends into the hole and contacts the first-conductivity type semiconductor layer of the third light emitting part, extends between the first and second semiconductor structures, and contacts the first-conductivity type semiconductor layer of the first light emitting part.

9. The light emitting device according to claim 8, wherein the fourth through-pattern contacts at least portions of the first-conductivity type semiconductor layer of the third light emitting part and the adhesion part.

10. The light emitting device according to claim 9, wherein the fourth through-pattern passes through the first-conductivity type semiconductor layer of the third light emitting part, and a sidewall of the fourth through pattern contacts the first-conductivity type semiconductor layer of the third light emitting part.

11. The light emitting device according to claim 7, further comprising a dielectric layer filling the hole, wherein:

the hole is disposed between the common pad and the first-conductivity type semiconductor layer of the third light emitting part; and the fourth through-pattern passes through the dielectric layer and at least portions of the first-conductivity type semiconductor layer of the third light emitting part and the adhesion part, and a portion of the fourth through-pattern contacts the first-conductivity type semiconductor layer of the third light emitting part.

12. The light emitting device according to claim 1, further comprising a substrate, on which the first and second light emitting parts spaced apart from each other are disposed, wherein the adhesion part includes a bonding layer bonding the substrate and the first and second light emitting parts, and including a conductive material.

13. The light emitting device according to claim 12, wherein the bonding layer electrically couples the first-conductivity type semiconductor layers of the first and second light emitting parts.

14. The light emitting device according to claim 12, wherein the bonding layer comprises:

a first bonding layer disposed between the first-conductivity type semiconductor layer of the first light emitting part and the substrate; and a second bonding layer disposed between the first-conductivity type semiconductor layer of the second light emitting part and the substrate, wherein each of the first and second bonding layers is electrically coupled with the substrate.

* * * * *